United States Patent [19]

Nathan et al.

[11] Patent Number: 5,537,108

[45] Date of Patent: Jul. 16, 1996

[54] METHOD AND STRUCTURE FOR PROGRAMMING FUSES

[75] Inventors: Richard J. Nathan, Morgan Hill; James J. D. Lan, Fremont; Steve S. Chiang, Saratoga; Paul Y. F. Wu, San Jose, all of Calif.

[73] Assignee: Prolinx Labs Corporation, San Jose, Calif.

[21] Appl. No.: 319,851

[22] Filed: Oct. 7, 1994

Related U.S. Application Data

[63] Continuation-in-part of Ser. No. 194,110, Feb. 8, 1994.

[51] Int. Cl.$^6$ ........................................ H04Q 1/18
[52] U.S. Cl. ........................................... 340/825.84
[58] Field of Search ......................... 340/825.79, 825.8, 340/825.83, 825.84

[56] References Cited

U.S. PATENT DOCUMENTS

| | | | |
|---|---|---|---|
| 3,335,327 | 8/1967 | Damon et al. | 317/101 |
| 3,808,576 | 4/1974 | Castonguay et al. | 338/309 |
| 3,857,683 | 12/1974 | Castonguay | 29/195 |

(List continued on next page.)

OTHER PUBLICATIONS

Joshua Silver, "High–Performance Scalable Switch Design," ASIC & EDA, Jun. 1994, pp. 38–48.

Kathryn E. Gordon and Richard J. Wong, "Conducting Filament of the Programmed Metal Electrode Amorphous Silicon Antifuse," IEEE, 1993, pp. 27–30.

Paul C. Yu, Steven J. Decker, Hae–Seung Lee, Charles G. Sodini and John L. Wyatt, "CMOS Resistive Fuses for Image Smoothing and Segmentation," 1992 IEEE, IEEE Journal of Solid–State Circuits, vol. 27, No. 4, Apr. 1992, pp. 545–553.

Chenming Hu, "Interconnect Devices for Field Programmable Gate Array," IEEE, 1992, pp. 591–594.

Steve Chiang, Rahim Forouhi, Wenn Chen, Frank Hawley, John McCollum, Esmat Hamdy and Chenming Hu, "Antifuse Structure Comparison For Field Programmable Gate Arrays," IEEE, 1992, pp. 611–614.

Bernie DiMarco and Steve Hansen, "Interplay of Energies In Circuit Breaker And Fuse Combinations," 1991 IEEE, pp. 1765–1769.

Fred Ki, Raj Bachireddy, Darryl Jeong, Steve Cheng and Thu Nguyen, "An Ultra High Speed ECL Programmable Logic Device," IEEE 1990 Bipolar Circuits and Technology Meeting 3.1.

Ali Iranmanesh, Steve Jurichich, Vida Ilderem, Rick Jerome, SP Joshi, Madan Biswal, Bami Bastani, "Advanced Single Poly BiCMOS Technology For High Performance Programmable TTL/ECL Applications," IEEE, 1990.

Ron Iscoff, "Characterizing Quickturn ASICS: It's Done With Mirrors," Semiconductor International, Aug. 1990.

(List continued on next page.)

*Primary Examiner*—Brian Zimmerman
*Assistant Examiner*—Edwin C. Holloway, III
*Attorney, Agent, or Firm*—Skjerven, Morrill, MacPherson, Franklin & Friel; Alan H. MacPhearson; Omkar K. Suryadevara

[57] ABSTRACT

A programming method in accordance with this invention partitions traces of a fuse matrix into groups wherein each group contains traces connected to fuses that are to remain intact. All of the traces in a group are connected to a first voltage so that the fuses between traces in the group are subjected to minimal currents. In one embodiment, all of the traces that are not in the group connected to the first voltage are connected to a second voltage such that a programming current passes through fuses to be programmed. In an alternative embodiment, traces in a second group are connected to the second voltage and all of the remaining traces are shorted to each other.

24 Claims, 64 Drawing Sheets

Microfiche Appendix Included
(14 Microfiche, 184 Pages)

U.S. PATENT DOCUMENTS

| Number | Date | Name | Class |
|---|---|---|---|
| 3,923,359 | 12/1975 | Newsam | 339/17 |
| 4,090,667 | 5/1978 | Crimmins | 339/19 |
| 4,238,839 | 12/1980 | Redfern et al. | 365/96 |
| 4,245,273 | 1/1981 | Feinberg et al. | 361/382 |
| 4,399,372 | 8/1983 | Tanimoto et al. | 307/279 |
| 4,420,820 | 12/1983 | Preedy | 365/105 |
| 4,433,331 | 2/1984 | Kollaritsch | 340/825.83 |
| 4,455,495 | 6/1984 | Masuhara et al. | 307/44 |
| 4,458,297 | 7/1984 | Stopper et al. | 361/403 |
| 4,507,756 | 3/1985 | McElroy | 365/104 |
| 4,507,757 | 3/1985 | McElroy | 365/104 |
| 4,562,639 | 1/1986 | McElroy | 29/584 |
| 4,565,712 | 1/1986 | Noguchi et al. | 427/53.1 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,609,241 | 3/1987 | Peterson | 339/17 |
| 4,651,409 | 3/1987 | Ellsworth et al. | 29/576 |
| 4,652,974 | 3/1987 | Ryan | 361/395 |
| 4,678,889 | 7/1987 | Yamanaka | 219/121 |
| 4,689,441 | 8/1987 | Dick et al. | 174/68.5 |
| 4,700,116 | 10/1987 | Inoue et al. | 318/254 |
| 4,710,592 | 12/1987 | Kimbara | 174/68.5 |
| 4,721,868 | 1/1988 | Cornell et al. | 307/465 |
| 4,726,991 | 2/1988 | Hyatt et al. | 428/329 |
| 4,731,704 | 3/1988 | Lochner | 361/4005 |
| 4,748,490 | 3/1988 | Hollingsworth | 357/51 |
| 4,757,359 | 7/1988 | Chiao et al. | 357/23.5 |
| 4,786,904 | 11/1988 | Graham, III et al. | 340/825 |
| 4,791,075 | 12/1988 | Lin | 437/209 |
| 4,792,835 | 12/1988 | Sacarisen et al. | 357/23.6 |
| 4,796,074 | 1/1989 | Roesner | 357/51 |
| 4,796,075 | 1/1989 | Whitten | 357/51 |
| 4,799,128 | 1/1989 | Chen | 361/414 |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. | 357/51 |
| 4,829,404 | 5/1989 | Jensen | 361/398 |
| 4,839,864 | 6/1989 | Fujishima | 365/200 |
| 4,840,924 | 6/1989 | Kinbara | 437/1895 |
| 4,845,315 | 7/1989 | Stopper | 361/428 |
| 4,847,732 | 7/1989 | Stopper et al. | 361/395 |
| 4,864,165 | 9/1989 | Hoberman et al. | 340/825.84 X |
| 4,874,711 | 10/1989 | Hughes et al. | 437/8 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,937,475 | 6/1990 | Rhodes et al. | 307/465 |
| 4,943,538 | 7/1990 | Mohsen et al. | 437/52 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,120,679 | 6/1992 | Boardman et al. | 437/195 |
| 5,142,263 | 8/1992 | Childers et al. | 338/21 |
| 5,144,567 | 9/1992 | Oelsch et al. | 364/708 |
| 5,148,265 | 9/1992 | Khandros et al. | 357/80 |
| 5,155,577 | 10/1992 | Chance et al. | 357/71 |
| 5,166,556 | 11/1992 | Hsu et al. | 307/465 |
| 5,189,387 | 2/1993 | Childers et al. | 338/20 |
| 5,196,724 | 3/1993 | Gordon et al. | 257/530 |
| 5,200,652 | 4/1993 | Lee | 307/465 |
| 5,218,679 | 6/1993 | Hasegawa et al. | 395/275 |
| 5,220,490 | 6/1993 | Weigler et al. | 361/409 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,258,643 | 11/1993 | Cohen | 257/530 |
| 5,260,848 | 11/1993 | Childers | 361/127 |
| 5,262,754 | 11/1993 | Collins | 338/21 |
| 5,282,271 | 1/1994 | Hsieh et al. | 395/275 |
| 5,282,312 | 2/1994 | DiStefano et al. | 29/830 |
| 5,300,208 | 4/1994 | Angelopoulos et al. | 205/50 |
| 5,311,053 | 5/1994 | Law et al. | 257/259 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,347,258 | 9/1994 | Howard et al. | 338/333 |
| 5,349,248 | 9/1994 | Parlour et al. | 340/825.84 X |
| 5,377,124 | 12/1994 | Mohsen | 340/825.83 X |

OTHER PUBLICATIONS

Esmat Hamdy, John McCollum, Shih–ou Chen, Steve Chiang, Shafy Eltoukhy, Jim Chang, Ted Speers, and Amr Mohsen, "Dielectric Based Antifuse For Logic And Memory ICs," IEDM, 1988, pp. 786–789.

James B. Gullette and Douglas M. Green, "Laser Personalization of NMOS Digital Topologies," Texas A&M university, 1993 IEEE, International Syposium on Circuits and Systems, pp. 1249–1252.

Masafumi Tanimoto, Junichi Murota, Yasuo Ohmori, and Nobuaki Ieda, "A Novel MOS Prom Using A Highly Resistive Poly–Si Resistor," 1980 IEEE, pp. 517–520.

R. Ranjan, G. Frind, C. E. Peterson and J. J. Carroll, "An Advancement In The Design And Application of Current–Limiting Fuses," pp. 36–40.

Hae–Seung Lee and Paul Yu, "CMOS Resistive Fuse Circuits," pp. 109–110.

T. Lipski, "Distribution Fuses of Nearest Future," pp. 41–45.

ASM Handbook, vol. 3, Alloy Phase Diagrams.

PCB/PWB/MCM/IC package process flow for forming fuse structures

| Steps : | Process Description |
|---|---|
| a. | (1) Deposit a conductive electrode layer on PCB core<br>(2) Apply a mask |
| b. | Etch and strip the mask to form the electrode traces |
| c. | Prepare electrode surface by optionally depositing an interfacial conductive layer |
| d. | (1) Apply mask dry film and open pads, traces, and fuse locations<br>(2) Deposit fuse layer (solder, or Ni, or Ni/Sn)<br>(3) Strip mask dry film of step d(1)<br>(4) Use fuse layer of step d(2) as a mask to etch interfacial layer formed in step c |
| e. | Repeat any of steps a-d as necessary, to generate multiple fuses and/or electrode traces in a multilayered structure |
| f. | Laminate multilayered structure together with other circuit board layers |
| g. | Generate external pattern and vias, plate via holes and make connections |

FIG. 3

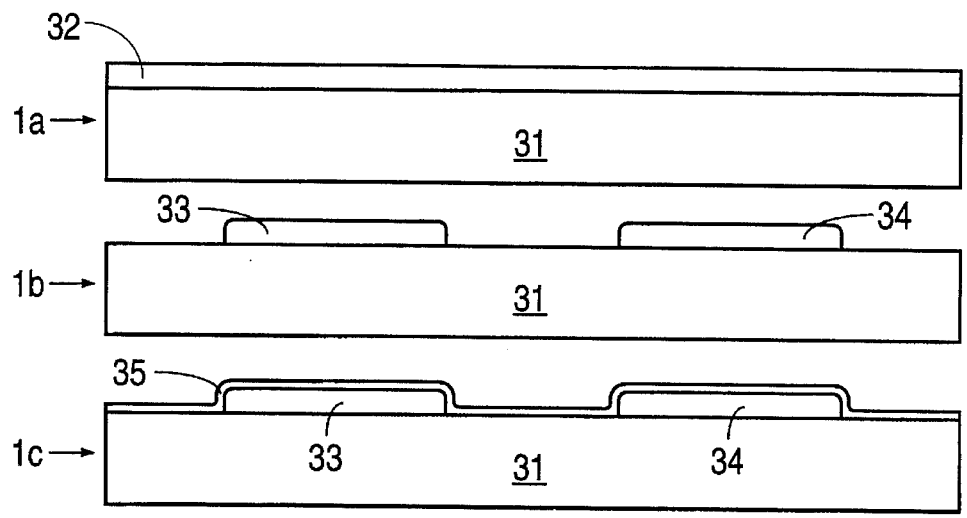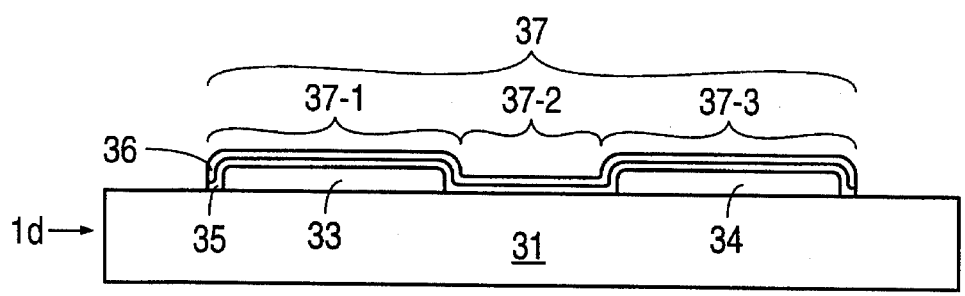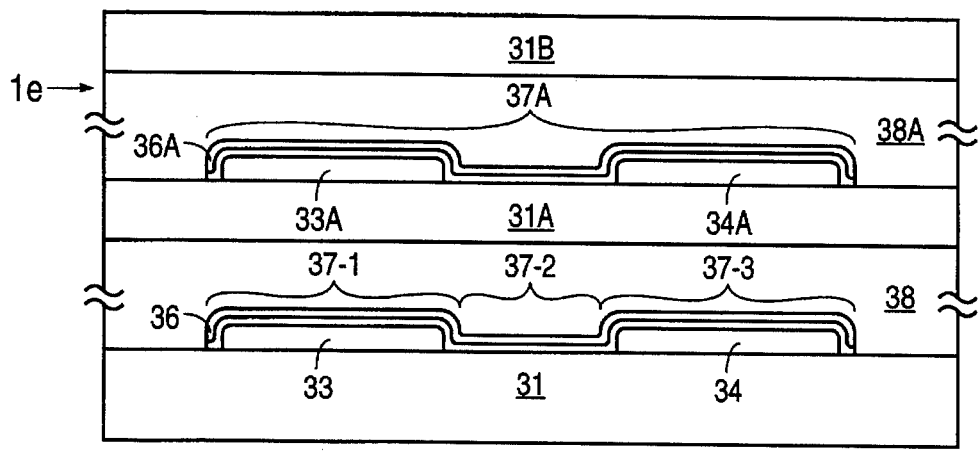
FIG. 4A

PCB/PWB/MCM/IC package process flow for forming antifuse structures

| Steps : | Process Description |
|---|---|
| a. | (1) Deposit a conductive electrode layer on PCB core<br>(2) Apply a mask |
| b. | Etch and strip the mask to form lower electrode traces |
| c. | Prepare electrode surface by optionally depositing an interfacial conductive layer |
| d. | Deposit antifuse dielectric layer |
| e. | Optionally deposit an interfacial conductive layer |
| f. | (1) Deposit a top electrode layer<br>(2) Apply a mask<br>(3) Etch and strip mask to form upper electrode traces |
| 9. | Repeat any of steps a-f as necessary to form a multilayered structure |
| h. | Laminate multilayered structure together with other circuit board layers |
| i. | Generate external pattern and vias, plate via holes and make connections |

FIG. 6

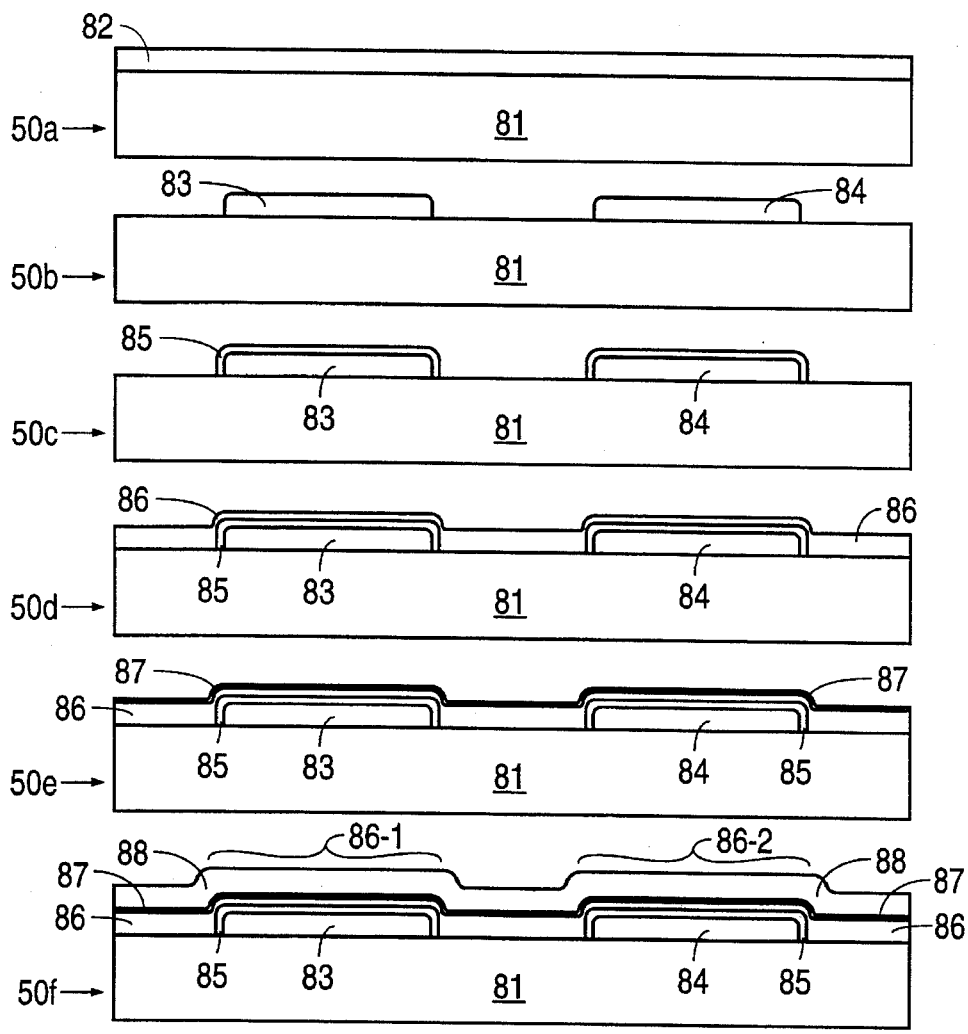
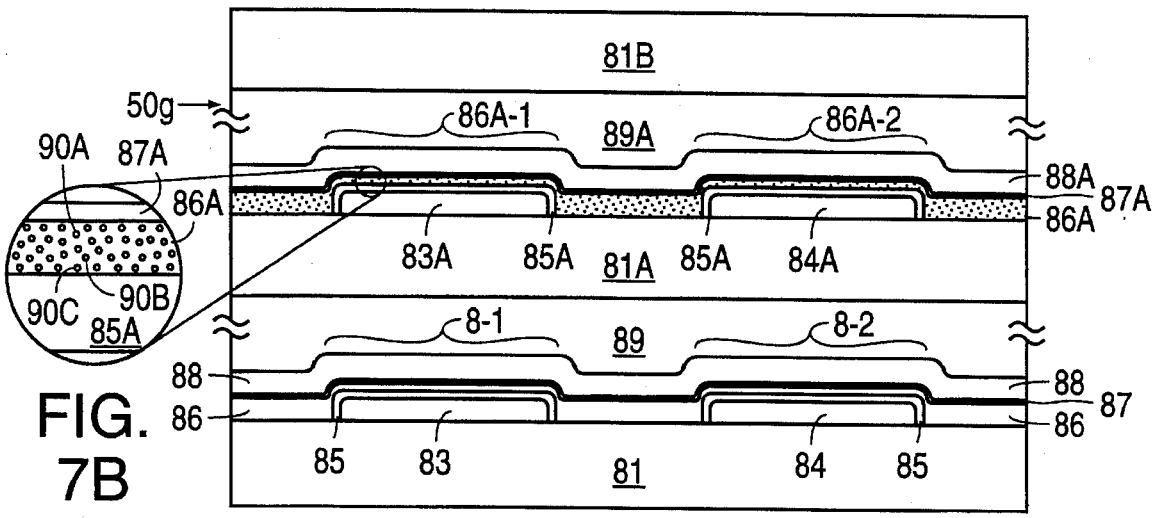
FIG. 7B
FIG. 7A

METHOD AND STRUCTURE FOR PROGRAMMING FUSES

CROSS-REFERENCE TO RELATED APPLICATION

This is a continuation-in-part of U.S. patent application Ser. No. 08/194,110, titled "Programmable/Reprogrammable Printed Circuit Board Using Fuse And/Or Antifuse As Interconnect Structures" by Richard J. Nathan, James J. D. Lan and Steve S. Chiang, filed Feb. 8, 1994, that is incorporated herein in its entirety.

CROSS-REFERENCE TO MICROFICHE APPENDIX

Microfiche Appendix A (12 sheets with 159 frames) is an illustrative computer program and related data for use with one embodiment of the present invention. Microfiche Appendix B (1 sheet with 17 frames) contains illustrative hardware circuit diagrams for use with one embodiment of the present invention. Microfiche Appendix C (1 sheet with 8 frames) is a table of ratings and part numbers for components in Appendix B.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to the field programmable interconnect structures. More specifically, this invention relates to the use of fuses and/or antifuses in a structure such as a printed circuit board, a printed wiring board, a multichip module and a package for an integrated circuit, and to methods and apparatus for making and using such a structure.

BACKGROUND OF THE INVENTION

Programmable logic on integrated circuits was introduced and popularized during the 1970's. Programmable array logic (PAL) and programmable logic devices (PLD) utilized advanced semiconductor processing technology, and enabled customers to purchase standard off-the shelf circuits that were essentially blank, and customize the circuits at the customer location. Unfortunately, the small density of these circuits limited the size and complexity of the designs.

Programmable elements, such as fuses, are well known for use in semiconductor devices, such as PLDs. See, for example, "Advanced Single Poly BiCMOS Technology for High Performance Programmable TTL/ECL Applications" by Iranmanesh, et al. IEEE 1990 Bipolar Circuits and Technology Meeting. Semiconductor fuse materials include polysilicon, Ti/W and Pt/Si (see U.S. Pat. No. 4,796,075).

In addition to PALs, PLDs and fuses, Application Specific Integrated Circuits (ASICs) can be used to implement custom logic. The ASICs market exploded during the 1980's with the popularization of the masked gate array. A masked gate array employs a standard base array which is stored in inventory and metallized in accordance with the needs of a particular customer, to form a desired logic circuit. However, a masked gate array does not give system designers the flexibility and time-to-market advantage of the PLDs and PALs which are field programmable.

This limitation of ASICs fostered the birth of Field Programmable Gate Arrays (FPGAs) in the early to mid 1980's. Integrated circuit (IC) programmable logic is built using programmable elements such as, for example, SRAMs (static random access memory), EPROMs (electrically programmable read only memory), fuses and antifuses. Antifuse materials typically used in the semiconductor field include silicon oxide/silicon nitride composites (see, for example, U.S. Pat. Nos. 4,823,181, 4,876,220 and 5,258,643), and amorphous silicon (see, for example, U.S. Pat. Nos. 4,914,055 and 5,196,724). Properties and structures of such antifuse materials are described in the prior art (see, for example, "Dielectric Based Antifuse for Logic and Memory ICs" by Hamdy, et. al., 1988 International Electronic Devices Meeting (IEDM); "Antifuse Structure Comparison for Field Programmable Gate Arrays" by Chiang, et. al. 1992 IEDM; "Interconnect Devices for Field Programmable Gate Array" by Hu, 1992 IEDM; "Conducting Filament of the Programmed Metal Electrode Amorphous Silicon Antifuse" by Gordon, et. al. 1993 IEDM).

Several attempts have also been made to build programmable printed circuit boards (PCBs) and multichip modules (MCMs) as described in, for example, U.S. Pat. Nos. 5,321,322, 5,311,053, 5,055,973, 5,077,451, 4,458,297 and 4,847,792. Programmable printed circuit boards can be built utilizing programmable ICs (silicon chips made using semiconductor technology) mounted on top of a PCB at key locations throughout the PCB as described in U.S. Pat. Nos. 5,055,973, 5,077,451 and Aptix Data Book (Feb. 1993). The Aptix Data Book is available from Aptix Corporation, 225 Charcot Avenue, San Jose, Calif. 95131. However, switches inside a programmable IC are highly resistive in comparison to switches directly on a substrate.

In U.S. Pat. Nos. 4,458,297 and 4,847,792, a silicon circuit board (SCB), that includes programmable switches made of amorphous silicon material, has silicon devices mounted on the top. However, the amorphous silicon switches in the silicon circuit board are fabricated by semiconductor technology.

U.S. Pat. No. 4,652,974 to Ryan describes a method and structure for effecting engineering changes in a multiple device module package. However, Ryan's deletable connection 36 is part of a device 14 that has a "tailorable metallurgy system" (column 4, line 67), is "joined to the substrate using solder joining techniques to join the respective solder pads" (column 5, lines 7–9), and is an integrated circuit device (col. 6, line 22) mounted on top of a substrate that "is typically a multilayer ceramic substrate" (col. 3, lines 59–60). Therefore, Ryan's "deletable connection 36" is also fabricated by semiconductor technology. Although Ryan describes other deletable links, such as deletable line portion 17, Ryan suggests that such links are "severed with a laser beam" (column 4, line 51).

For ceramic packages, methods of making engineering change contact pads on a top surface have been described in, for example, U.S. Pat. No. 4,840,924 to Kinbara. Such engineering change contact pads are cut by mechanical or laser cutting and have connection conductor portions for manually connecting a wire to make a wiring change.

Passive programmable elements and architecture are disclosed in U.S. Pat. Nos. 5,321,322 and 5,311,053. However, both patents address a specific architecture with a fuse and an antifuse connected in series to form one element. (U.S. Pat. No. 5,321,322, col. 3, lines 65–67, and col. 4, lines 47–48 and U.S. Pat. No. 5,311,053, col. 3, lines 39–42).

The above approaches for programmable PCBs, SCBs and MCMs have several drawbacks. For example, using ICs (silicon chips) in the above products results in a high cost. Additionally, the speed of such products is degraded as routing of signals in and out of a silicon chip is not the most efficient way of making connections. Also if the programmable elements are fuses that have to be severed by laser or mechanical cutting, the programmable elements must be on the top surface of a PCB or MCM. Such top surface mounting takes up precious outer layer board space that could be used to add additional electronic components and/or circuit traces.

Programmable elements described above can be used in a socket for connecting an integrated circuit to a printed circuit board. For example, U.S. Pat. No. 4,609,241 to Peterson discloses a "programmable programmed" socket that includes a programmable device, such as an EPROM made of semiconductor technology. Therefore, such sockets are more expensive than and larger than a conventional socket by the cost and size of Peterson's "solid state electronic programmable device" (column 2, lines 63–64).

Programmable elements can also be used in a cable. U.S. Pat. No. 5,144,567 to Oelsch et al. discloses "a programmable plug and cable for computer keyboards" (title). The keyboard plug has encoder electronics that "comprise as the programmable IC a microcomputer 10 with integrated EPROM" (column 3, lines 42–46), which also increases the cost and size of the cable.

Programmable elements can also be used in a shorting plug. For example, U.S. Pat. No. 4,090,667 to Crimmins discloses a shorting plug with a number of electrically conductive bridges that electrically short terminal pins and that include a removable "removal portion". The removal portion is removed by a simple hand tool (col. 4, line 36) or by punches programmed to remove several removal portions in a single action (column 4, lines 60–61). However, Crimmins removal portions are removed mechanically, which is slow, cumbersome and tedious. Also a mechanical switch is usually large in size, compared to an electrically programmable switch. Finally, mechanical switches must be mounted on a top surface of a PCB and so take up precious board space, as noted above.

Semiconductor fuses can be electrically programmed, for example, by a method of U.S. Patent in which "column 180-1 is selected by drivers 130-1 through 130-N" (col. 2, lines 41–42) and "programming current is passed through the selected fuse device connected between column 180-1 and the selected row, thus opening that fuse device" (col. 2, lines 49–50). However, such a method requires "fusing driver array 105" that "includes a set of fusing drivers associated with each column" (col. 2, line 16–18) and so results in programming time of quadratic complexity, depending on the number of fuses to be programmed.

Therefore a new approach is necessary to provide low cost and fast time-to-market products that can be electrically programmed.

SUMMARY OF THE INVENTION

In accordance with the present invention, two types of programmable elements, a fuse and an antifuse, are fabricated in a matrix as part of regular PCB, PWB, MCM, or IC package (such as pin grid array (PGA)) process flows. Such fabrication eliminates the use of silicon programmable chips or silicon programmable substrates made using semiconductor technologies. Cost is thus reduced substantially. In addition, fabrication compatibility with the PCB, PWB, MCM or IC package process flow enables faster time-to-market and better placement and routing architecture for the programmable PCB, PWB, MCM, or IC package.

One type of programmable element, a fuse, can include a layer of conductive material that disintegrates or separates (e.g. melt or vaporize) on programming; that is, on the application of electrical energy (voltage/current), heat energy (such as soldering iron), light energy (such as a laser beam or infrared beam) or mechanical energy (such as cutting). A fuse can include a metal trace of a desired thickness and geometry to minimize the real estate and maximize programming efficiency. Programming efficiency is improved by reducing the programming time and/or programming current.

In PCB, PWB, MCM, or IC package environment, fuse materials include, but are not limited to, materials used widely in the PCB, PWB, MCM or IC package environment such as, for example, copper, solder (Sn-Pb), nickel and gold. In addition, metals and alloys with low melting point are also good fuse materials. For example, tin and tin alloys, lead and lead alloys, nickel and nickel alloys, thallium, zinc, antimony, magnesium, aluminum, or combinations of the above can be used to form programmable fuses in accordance with this invention.

Fuses according to this invention can be fabricated using regular PCB, PWB, MCM or IC plastic package processes. Such fuses can be fabricated from, for example, nickel phosphorus alloy (Ni/P). Moreover, fuses for IC ceramic packages can be fabricated at higher processing temperatures compared to the temperatures used in PCB, PWB, MCM or IC plastic package processes. Therefore, materials used to form fuses in semiconductor integrated circuits, such as Ti/W or Pt/Si alloy can be used to fabricate fuses for IC ceramic packages, in addition to the materials described above for PCB, PWB, MCM or IC plastic packages.

Another type of programmable element, an antifuse, can include a layer of non-conductive dielectric material sandwiched between two electrodes so that a conductive path is formed on programming (using electrical energy, light energy, heat energy or mechanical energy).

Antifuse materials in the PCB, PWB, MCM, or IC package environment include metal oxides, in which the oxide layer is created either by chemical reaction of, or physical deposition on top of, metal traces on the board, MCM, IC package substrate or on polymers. Materials that satisfy the antifuse requirements include polymers (such as, for example, epoxy resin, polyimide, parylene), polymer composites (such as, for example, polymer body embedded with conductive particles) and metal oxides (such as, for example, aluminum oxide, magnesium oxide, or zirconium oxide).

Both types of programmable elements can be used to inter-connect electronic components and chips mounted on a structure, such as, for example, a printed circuit board (PCB), a printed wiring board (PWB), a multi-chip module (MCM) or an integrated circuit (IC) package.

Use of fuses and/or antifuses as described above has several advantages. One advantage is that a very dense matrix of fuses and/or antifuses can be provided, so that by selectively blowing a fuse/antifuse, the matrix can be customized to achieve any desired circuit. Another advantage is that because the fuses and/or antifuses can be built into inner layers of a multi-layered structure, the upper-most surface is available for mounting electronic components and related custom traces. Another advantage is that to make any of the connections it is not necessary to manually connect any wires. Yet another advantage is that because an electrical programmer (based on voltage/current pulse) can be used to program the fuses/antifuses, the programming task is simplified.

In accordance with this invention, fuses and/or antifuses can be used to form a programmable burn-in board. The antifuse and/or fuse materials for a burn-in board are chosen to survive a more severe temperature environment than the temperature associated with the operating conditions of a typical printed circuit board. The use of fuses and/or antifuses embedded in a programmable burn-in board provides considerable flexibility in applying various tests designed to burn-in an electronic component.

A multi-layered structure containing a matrix of fuses and/or antifuses in an IC package or as part of a PCB, PWB or MCM can also be used in a reconfiguration device to couple a number of electrical contacts in a first configuration to a number of electrical contacts in a second configuration. The cost and size of such a reconfiguration device is considerably reduced by elimination of the use of a programmable substrate made using semiconductor technology. A customer can electrically program the fuses and/or antifuses of the reconfiguration device to couple any electrical contact in the first configuration to any electrical contact in the second configuration, at the customer location. Thus the time-to market for a re-configuration device is considerably improved.

One embodiment of a reconfiguration device in accordance with this invention includes a component socket that couples an electrical device, such as an integrated circuit having a specific pin-out configuration to another electrical device, such as electronic circuitry on a printed circuit board originally designed for use with an integrated circuit having a different pin-out configuration.

Another embodiment of a reconfiguration device comprises a socket adapter that couples an electrical device, such as an integrated circuit having a specific pin-out configuration to a component socket originally designed for use with an integrated circuit having a different pin-out configuration.

Yet another embodiment of a reconfiguration device comprises a programmable cable that couples an electrical device, such as a keyboard to another electrical device, such as a motherboard of a personal computer.

Still another embodiment of a reconfiguration device comprises a cable adapter that couples an electrical device, such as a cable connector of a cable to another electrical device, such as a cable connector of a keyboard.

In accordance with this invention, fuses and/or antifuses can be used in matrices to form programmable multi-layered structures. When both types of programmable elements are used together in a single structure, more efficient placement and routing architectures can take advantage of the characteristics of each type of programmable element. Furthermore, use of both fuses and antifuses together allows the architecture to be reprogrammable under some circumstances.

BRIEF DESCRIPTION OF THE DRAWINGS

FIGS. 2I, 2J, 2K and 2L illustrate the traces and via holes of a multi-layered structure in a chip-on board printed circuit board in accordance with one embodiment of this invention.

FIG. 3 illustrates a process flow for forming fuses in a printed circuit board in accordance with one embodiment of this invention.

FIGS. 4A and 4B illustrate various cross-sections of a fuse structure formed in accordance with the process of FIG. 3.

FIG. 6 illustrates a process flow for forming antifuses in a printed circuit board in accordance with one embodiment of this invention.

FIG. 7A illustrates various cross-sections of an antifuse structure formed in accordance with the process of FIG. 6.

FIG. 7B is an enlarged view of a portion of FIG. 7A illustrating the use of a composite in an antifuse dielectric.

DETAILED DESCRIPTION

The success of the field programmable logic (memory) technologies for semiconductor devices has demonstrated that time-to-market with today's greatly reduced product life cycle has altered the planning strategy of today's technical companies. In accordance with this invention, we have recognized that it is advantageous to extend such a time-to-market concept from integrated circuits to printed circuit boards (PCBs), printed wiring boards (PWBs), multichip modules (MCMs) and IC package substrates for use in products such as sockets, socket adapters, cables, cable adapters, burn-in boards and burn-in adapter cards.

Although PCBs, PWBs, MCMs and IC packages are referenced in the following description, any structure for interconnection of one or more terminals of one or more electronic components can be built in accordance with this invention. Furthermore, any applications that require programmable substrates other than semiconductor substrates can be built in accordance with this invention.

Field programmable fuses and antifuses as described below are not known to have been attempted as part of PCBs. Also, fuses and antifuses as described below are not known to have been attempted as part of an inner-layer of PCBs, PWBs, MCMs or the packages for ICs (hereinafter "IC packages"). Finally, electrically programmable fuses and/or antifuses as described below are not known to have been attempted as part of PCBs, PWBs, MCMs or IC packages.

The PCB, PWB, MCM and IC plastic package environments limit manufacturing temperature to between 150° C. to 300° C. (except for IC ceramic packages). None of the semiconductor fuse materials or ceramic fuse materials can be deposited within these temperatures because processing temperatures for such materials are well in excess of 350° C. or 400° C. Therefore if fuse or antifuse materials are to be deposited onto a PCB, PWB, MCM or IC package substrate directly, a new class of fuse materials is required. Moreover, greater efficiency and better time-to-market are achieved if the fuse materials for PCBs, PWBs, MCMs and IC packages are compatible with the PCB, PWB, MCM or IC package processing. One embodiment of a method for forming a fuse allows high temperature fuse material to be integrated into low temperature PCB processes as described below.

Figure 1:
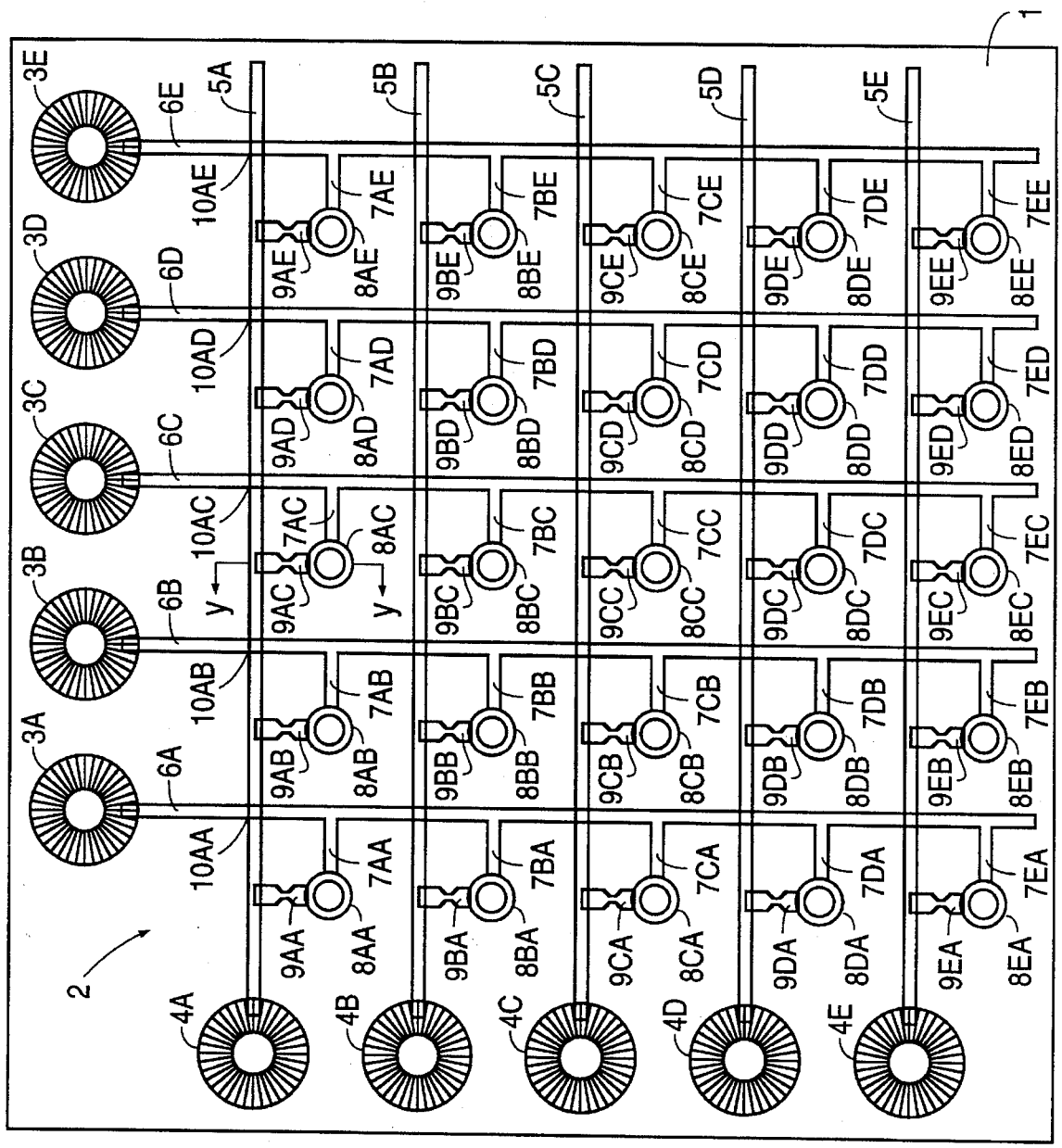
FIG. 1 illustrates a matrix of fuses manufactured on a printed circuit board in accordance with one embodiment of this invention.

FIG. 1 illustrates a composite view (hereinafter "composite") of all layers included in one embodiment of a printed circuit board 1 as if the insulation material was transparent. Printed circuit board 1 includes a matrix 2 of fuses for interconnecting electronic components such as, for example, one or more integrated circuits, resistors, transistors and capacitors to form a desired electronic circuit. Matrix 2 includes fuses 9AA to 9EE and conductive traces 5A to 5E and 6A to 6E, together with via holes 3A–3E and 4A–4E designed to receive the terminals of an electronic component.

A fuse, such as fuse 9AA shown in FIG. 1, is a normally closed (i.e., conductive) switch element. To open (i.e., make nonconductive) the switch element electrical energy, heat energy or light energy (such as a laser beam or infrared beam) is applied to the switch element to disintegrate the electrically conductive member. In the embodiment shown in FIG. 1, each of fuses 9AA–9EE is an electric fuse that includes a central narrower separable portion that disintegrates on passage of a current of a selected magnitude for a selected duration. In accordance with this invention, a fuse can be formed of a variety of geometric shapes and from a variety of materials as discussed below, for example, in reference to FIGS. 2A, 2B, 3, 4A, 4B and Table 1.

Via holes 3A–3E of matrix 2 are accessible from the upper-most exposed surface of printed circuit board (hereinafter PCB) 1 and are connected to a set of parallel metal traces 6A–6E formed as part of an inner insulating layer of PCB 1. Via holes 4A–4E are also accessible from the upper-most exposed surface of PCB 1 and are connected to another set of parallel metal traces 5A–5E formed as part of an inner insulating layer of PCB 1 different from the inner insulating layer containing traces 6A–6E. Metal traces 5A–5E are insulated from metal traces 6A–6E at cross-over points, such as for example, 10AA–10AE (not all cross-over points are labeled in FIG. 1 for clarity).

PCB 1 also includes conductive connectors 7AA–7EE that are formed as part of the same PCB inner layer as metal traces 6A–6E and that connect metal traces 6A–6E to linking via holes 8AA–8EE. In the embodiment of FIG. 1, linking via holes 8AA–8EE are smaller than via holes 3A–3E and 4A–4E and are inaccessible from the upper-most surface of PCB 1. Linking via holes 8AA–8EE are plated and are designed to connect conductive connectors 7AA–7EE to fuses 9AA–9EE. Fuses 9AA–9EE are formed in the same inner layer as, and are connected to, metal traces 5A–5E.

Although in the embodiment shown in FIG. 1, linking via holes 8AA–8EE are inaccessible from the upper-most surface of PCB 1, in another embodiment of this invention the linking via holes are accessible from the upper-most surface of the PCB. Also, in another embodiment of this invention, the linking via holes are designed to receive the terminals of an electronic component.

In the embodiment shown in FIG. 1, metal traces 5A–5E and 6A–6E are patterned in two sets of transverse parallel lines to form part of matrix 2. Therefore an electronic component's terminal in any via hole 3A–3E or 4A–4E is initially connected to terminals in every via hole 3A–3E and 4A–4E through one of fuses 9AA–9EE. For example, one path between via hole 4C and via hole 3E includes a fuse 9CE.

To program matrix 2 (FIG. 1), selected fuses are opened (blown or programmed) by using electrical energy (voltage/current). For example, fuse 9BD can be opened by application of a programming current source between via holes 4B and 3D, as described below in reference to the simple targeting method.

There are multiple paths from via hole 4B to via hole 3D through one or more fuses. For example, a direct path from via hole 4B to via hole 3D is through fuse 9BD, while an indirect path is through fuses 9BC, 9CC and 9CD. When a programming current is applied to fuse 9BD, other fuses, such as fuses 9BC, 9CC and 9CD experience a sneak path current that is a fraction of the programming current, such as a ⅓ fraction. Programming time for which the programming current is applied is chosen to ensure that a direct path fuse such as fuse 9BD is blown while sneak path fuses such as fuses 9BC, 9CC and 9CD remain intact at the end of the programming time. Methods for grouping traces to reduce or avoid sneak path currents are described below.

In one embodiment, metal traces 5A to 5E and fuses, such as fuses 9AA to 9AE are formed on an uppermost surface of PCB 1, while other metal traces, such as metal traces 6A to 6E and conductive connectors 7AA to 7EE are formed on an inner layer of PCB 1.

A fuse matrix including fuses present on the upper-most surface of a PCB, PWB, MCM or IC package can be programmed by heat energy or light energy. So, if fuse 9BD is formed on the uppermost surface of the PCB, then such a fuse 9BD can be opened by direct application of a laser beam, infrared beam or mechanical cutting.

In addition, a fuse on an upper-most surface can be opened by electrical energy (for example by a programming current) as described herein for fuses on an inner layer.

On selectively opening fuses 9AA to 9EE, selected initial connections between via holes 3A to 3E and 4A to 4E are opened. Therefore any terminal of an electronic component in via holes 3A to 3E can be left connected to any other terminal or terminals in via holes 4A to 4E to achieve any desired interconnection pattern.

In one embodiment a fuse for a PCB is 3 mils long, 3 mils wide, 300 microinches thick and formed of solder with an optional thin copper layer between the solder and the substrate serving as an interfacial layer. The optional interfacial layer provides adhesion between the solder and the PCB substrate and is an integral part of the fuse. A PCB fuse formed of solder has a resistance in the range of 1 to 1000 milli-ohm and is programmed by applying a current of 1 to 2 amperes for 10 to 1000 microseconds. To ensure an open circuit, a pre-heating current can be applied as described below depending on the fuse characteristics.

The geometry (shape and size) of a fuse can be designed to ensure that the fuse functions effectively as a conductor if the fuse is not blown and the fuse functions as a completely open circuit if the fuse is blown. To blow a fuse, relatively high programming current levels, such as 0.6–3 amperes are used as compared to current levels, such as 0.01–0.1 ampere used in normal operation of a predetermined circuit. Such normal operation currents are sufficiently small to avoid inadvertently blowing a fuse during normal operation of an intact fuse as part of the predetermined circuit.

A fuse must be designed with an appropriate programming current. If a fuse breaks down at a current below the "programming" current, an unintended open circuit can result, thereby disturbing normal operation of the existing circuit of which the fuse is a part. On the other hand if a fuse is over-resistant to the "programming" current, either an open circuit is not formed when desired during programming or greater current must be applied to "blow" the fuse, with attendant heat damage to other nearby structures of the PCB.

Moreover, during the programming of a fuse, a large gap must be blown to prevent a fuse from later becoming closed due to accumulation of conducting material near the blown gap, which material could result in intermittent transmission of leakage current through the otherwise blown fuse. The various stages of a fuse during programming are described below in reference to FIGS. 15G, 15H, 15I and 15J.

Various fuse geometries can be used to achieve a fuse with a desired programming time and current. Fuse geometry to achieve this goal is discussed below in reference to FIGS. 2A and 2B.

A fuse in accordance with this invention differs from a resistor buried inside an inner layer of a PCB, PWB, MCM and IC package. A buried resistor that is part of a custom circuit is conventionally designed to be operated as an intact resistor. Buried resistors can be formed as described in, for example, U.S. Pat. Nos. 4,888,574, 4,892,776, 4,808,967, 3,857,683 and 3,808,576. Buried resistors are not subjected to a programming current, with the exception of a malfunctioning customized circuit. In contrast, a fuse in accordance with this invention is designed to be blown or left intact and blown fuses as well as intact fuses form a normal part of a predetermined circuit.

A predetermined circuit, formed by a user by programming a fuse matrix, can perform any predetermined function that is desired by a user. Therefore, when a fuse matrix is programmed and used in a predetermined circuit, the programmed fuse matrix contains at least one blown fuse. When a fuse is blown (for example, due to the disintegration of the central narrower separable portion), the two connection portions of the blown fuse are physically separated from each other by an insulator, such as a dielectric, for example a polymer or a PCB core, or an air gap.

Figure 16A:
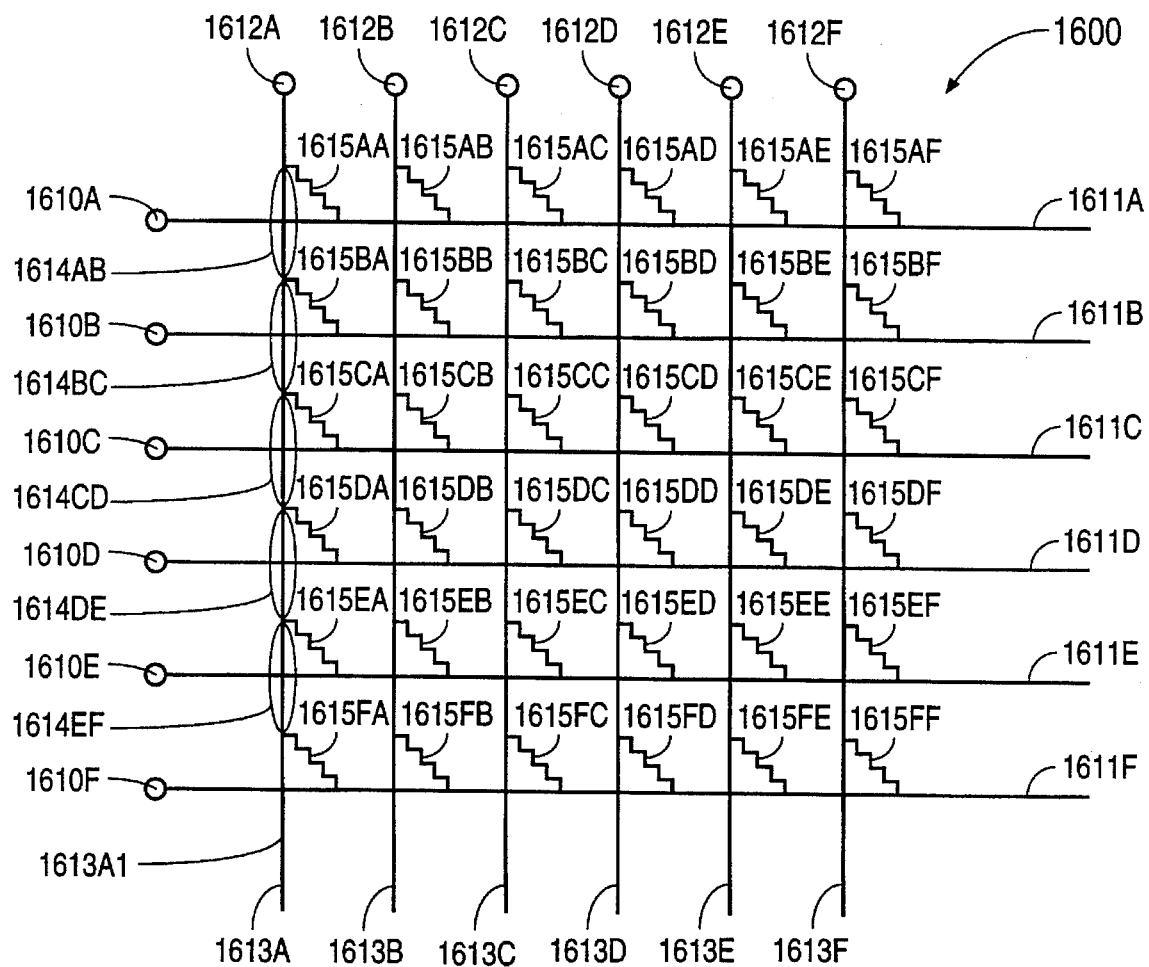
FIGS. 16A to 16F illustrate a matrix of fuses in various stages of programming in alternative embodiments of this invention.
Figure 16B:
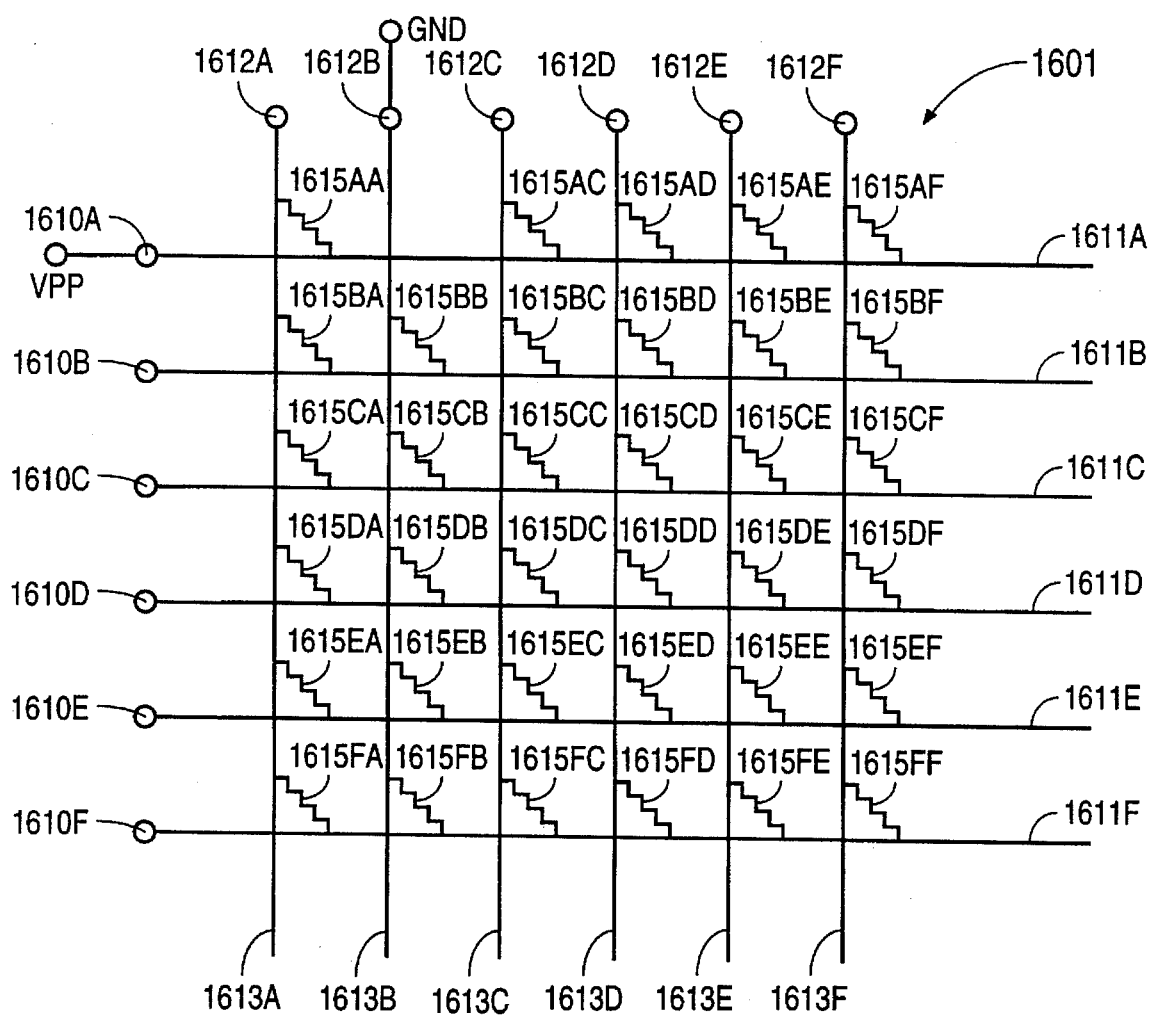
Figure 16C:
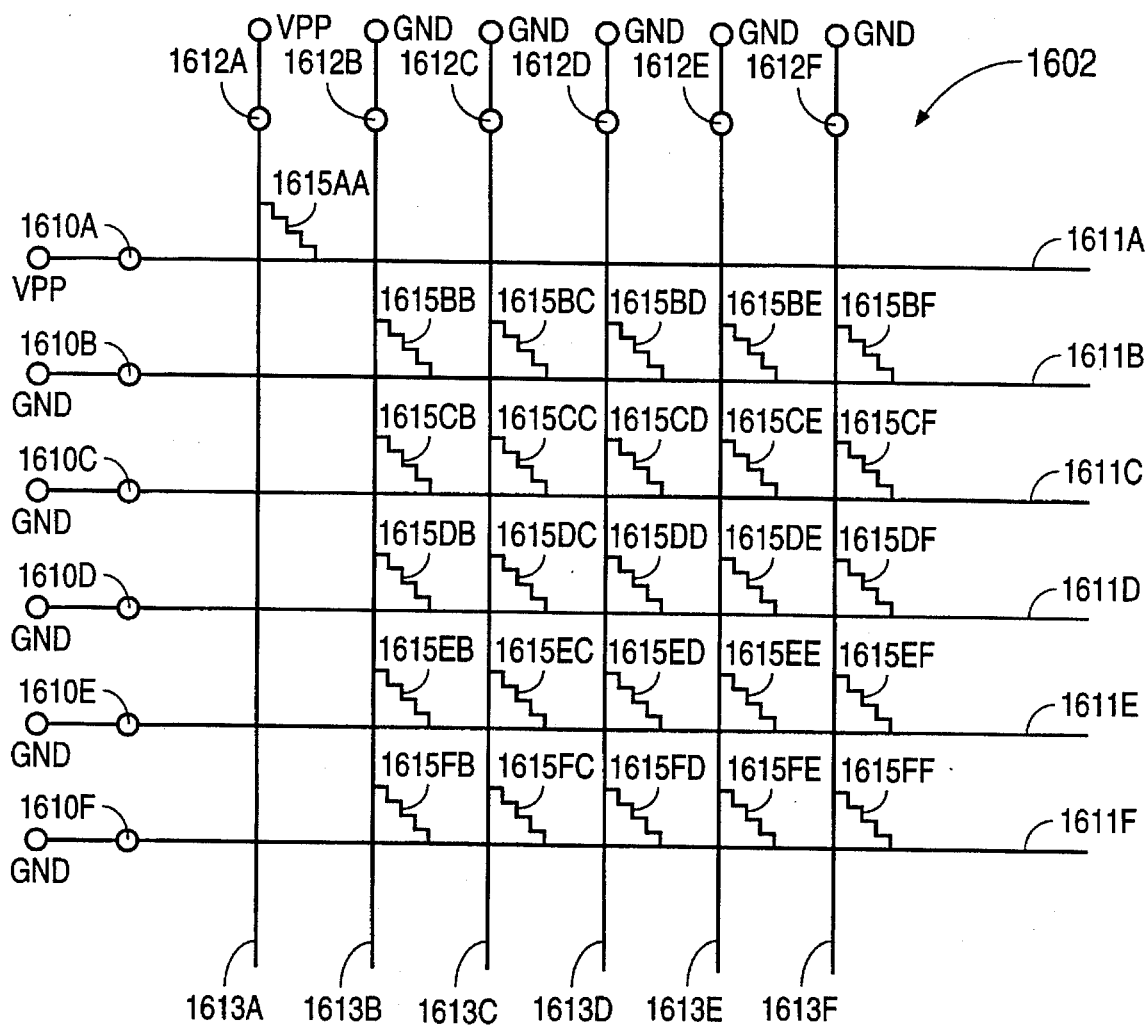
Figure 16D:
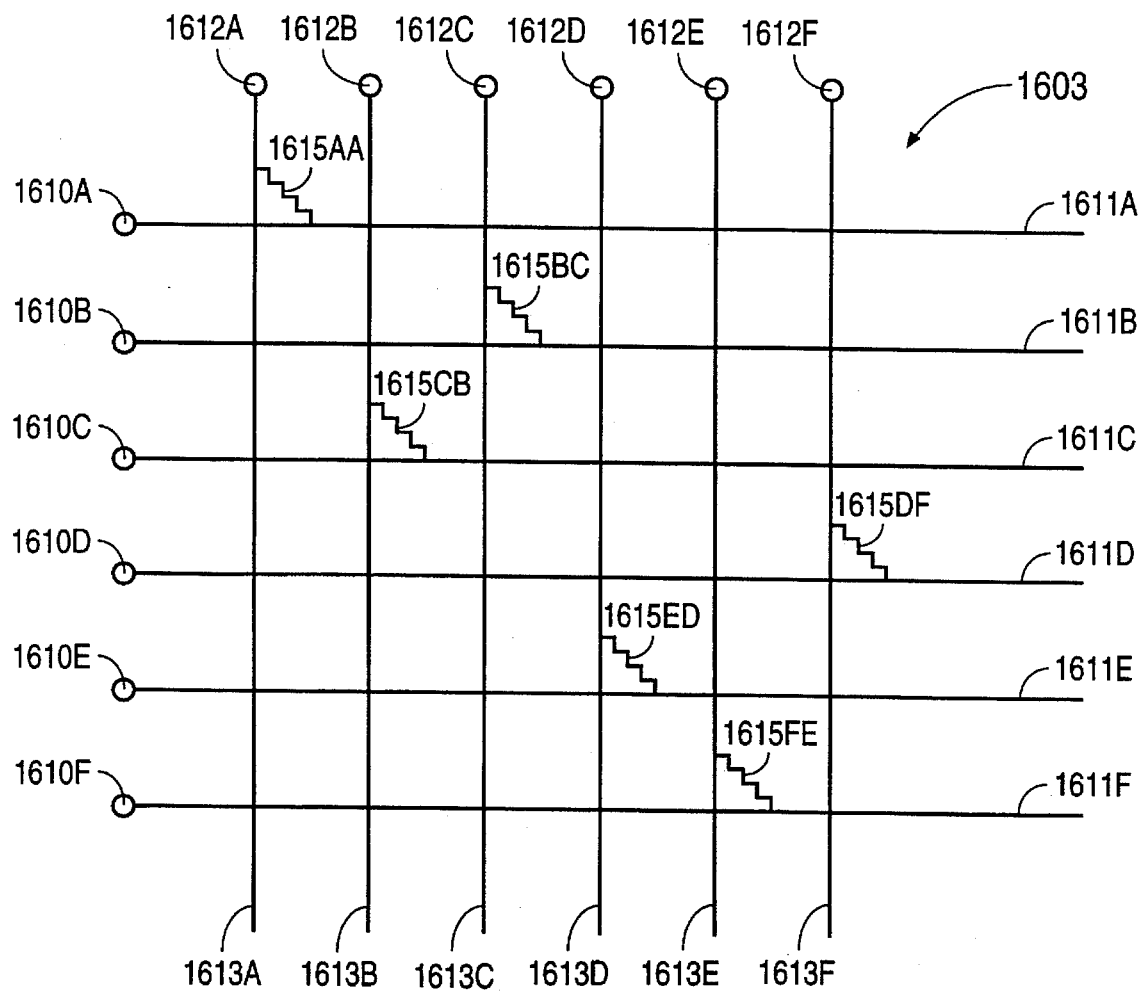

When a fuse matrix is programmed for use in a predetermined circuit, a majority (greater than 50%) of fuses of the fuse matrix can be blown fuses, for example as illustrated in FIG. 16D (depicted by no connection between a crossover of a vertical column trace and a horizontal row trace). When an N×N fuse matrix is programmed to form a one-to-one mapping between N traces (in rows) and N traces (in columns), as illustrated in FIG. 16D, all $N^2-N$ fuses in the programmed fuse matrix are blown fuses and only certain user selected N fuses that interconnect N row traces to N column traces are intact fuses, with N=6 in this embodiment.

Sheet resistance of a conventionally buried resistor is an essential part of a customized circuit and can be in the range of 10 ohm per square to 1 megaohm per square (U.S. Pat. No. 4,892,776). In contrast, an intact fuse in one embodiment of this invention has low resistance during normal operation of a predetermined circuit and acts essentially as a conductor. Sheet resistance of a fuse can be, for example, in the range of 0.1 to 10 ohms per square.

Although FIG. 1 shows metal traces 5A to 5E as horizontal lines and metal traces 6A to 6E as vertical lines to form part of a matrix 2, any other architectural arrangement can be used in accordance with this invention. For example, circular and radial/diagonal metal traces can also be used in addition to, or as alternatives to horizontal and vertical lines in accordance with this invention. Furthermore, although only two sets of parallel metal traces are shown in FIG. 1, any number of sets of metal traces in any orientation and any architecture can be used in accordance with this invention.

To program a fuse in a large matrix by the simple targeting method, a larger current needs to be applied than is necessary to blow a single fuse because all the unprogrammed fuses conduct current. Therefore the line widths of the conducting traces have to be larger for a large matrix than for a small matrix. In order to have smaller line widths, a large matrix can be segmented into a number of smaller matrices or arrays to accommodate limits imposed by fuse characteristics on the current carrying capacity. Such smaller matrices or arrays can be implemented on various layers of a multi-layered structure. Moreover, various place and route algorithms well known in the art can be used with any architecture to build an optimum routing network to minimize delay and improve routing efficiency.

Although metal traces are described above, such as, for example, in reference to FIG. 1, any electrically conductive trace can be used. Also, although FIG. 1 shows via holes such as, for example via holes 3A–3E and 4A–4E, any type of component contacts (such as conductive pads or solder bumps) can be used for receipt of the terminals of an electronic component. Although linking via holes (such as, for example, via holes 8AA to 8EE in FIG. 1, 25A1 to 25A20, 25B1 to 25B20 and 25C1 to 25C20 in FIG. 2D, via holes 70 in FIGS. 5C to 5D, and via holes 110, 120, 122, 130 and 132 in FIG. 8) are shown connecting various features of different layers, any conductive element can be used to connect these features.

Although only two layers of patterned metal traces 5A to 5E and 6A to 6E are shown in FIG. 1, any number of layers can be used. Additional layers of metal traces and fuses can provide additional connections and allow increased complexity in routing and circuitry. Moreover, additional layers of metal traces permit use of reduced real estate, especially if the line width of the traces poses a constraint. Also, transverse metal traces 5A–5E and 6A–6E can cross each other at cross-over points such as, for example, 10AA–10AD, so as to form an upper electrode layer and a lower electrode layer of an antifuse (as described below in reference to FIGS. 5A–5D, 6 and 7). Also all metal traces and fuses can be formed in a single layer such that any two transverse traces avoid contact with each other at cross-over points by detouring to a lower or upper layer. Traces can detour to a lower or upper layer by using linking via holes.

Moreover, although the fuses of FIG. 1 are shown as having identical dimensions, fuses of different dimensions can be built on the same layer depending on the architectural requirement. For example, metal traces forming an array of power buses for power distribution can be connected to fuses of larger dimensions designed for larger current carrying capacity than fuses connected to signal lines. Furthermore, although a printed circuit board is shown in the appended figures, such as, for example, FIG. 1, multichip modules (MCMs) and IC packages can also be built and used.

Many advantages flow from the above described fuse matrix in a PCB, PWB, MCM or IC package. One advantage is that a customer can electrically program a fuse matrix to achieve any desired interconnect structure in a PCB, PWB, MCM or IC package. Therefore, the same generalized fuse matrix can be used by different customers without need for fabrication of customized traces. Such a matrix of fuses built in a PCB, PWB, MCM or IC package eliminates the need for a programmable interconnect chip or silicon programmable substrate made using semiconductor technologies and therefore the cost is reduced substantially. The fuse matrix also reduces time-to-market of products, such as cable adapters by allowing a PCB, PWB, MCM or IC package with a standard configuration to be quickly and easily programmed into a desired circuit configuration.

Among the advantages of the arrangement of metal traces 5A to 5E and 6A to 6E, conductive connectors 7AA to 7EE, linking via holes 8AA to 8EE and fuses 9AA to 9EE illustrated in FIG. 1 are low interconnect complexity, and low real estate as compared to other arrangements because each fuse is located immediately adjacent to a linking via hole that connects to metal traces in another layer.

Figure 2C:
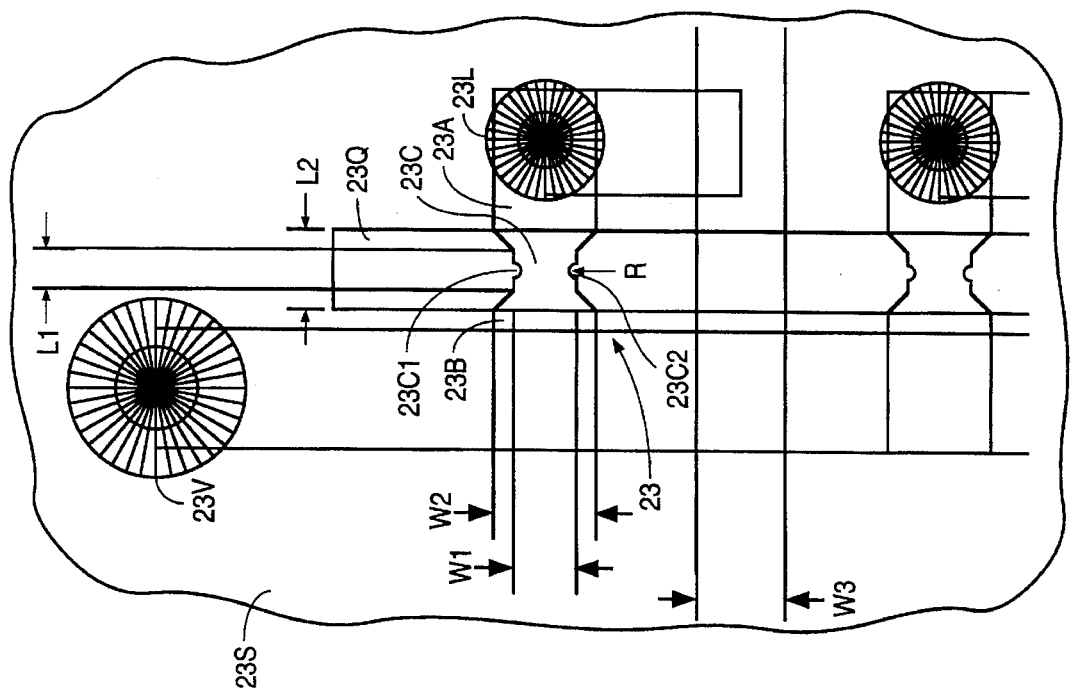
FIGS. 2A, 2B and 2C illustrate various fuse geometries in accordance with other embodiments of this invention.
Figure 2A:
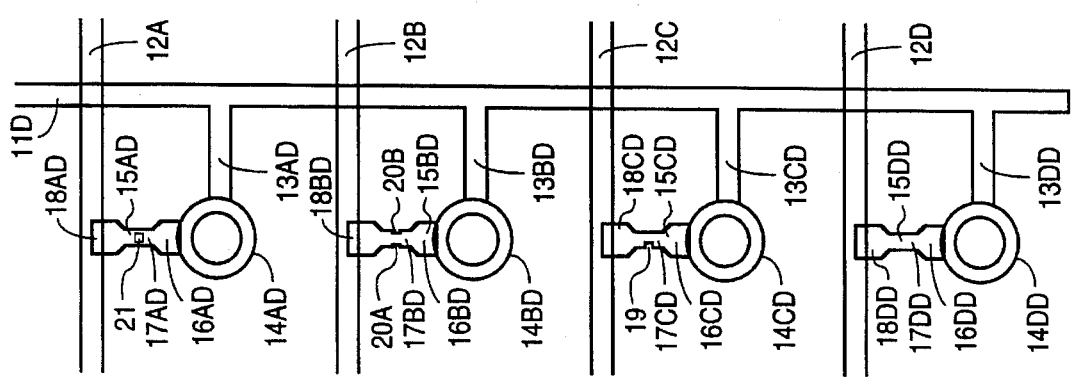
Figure 2B:
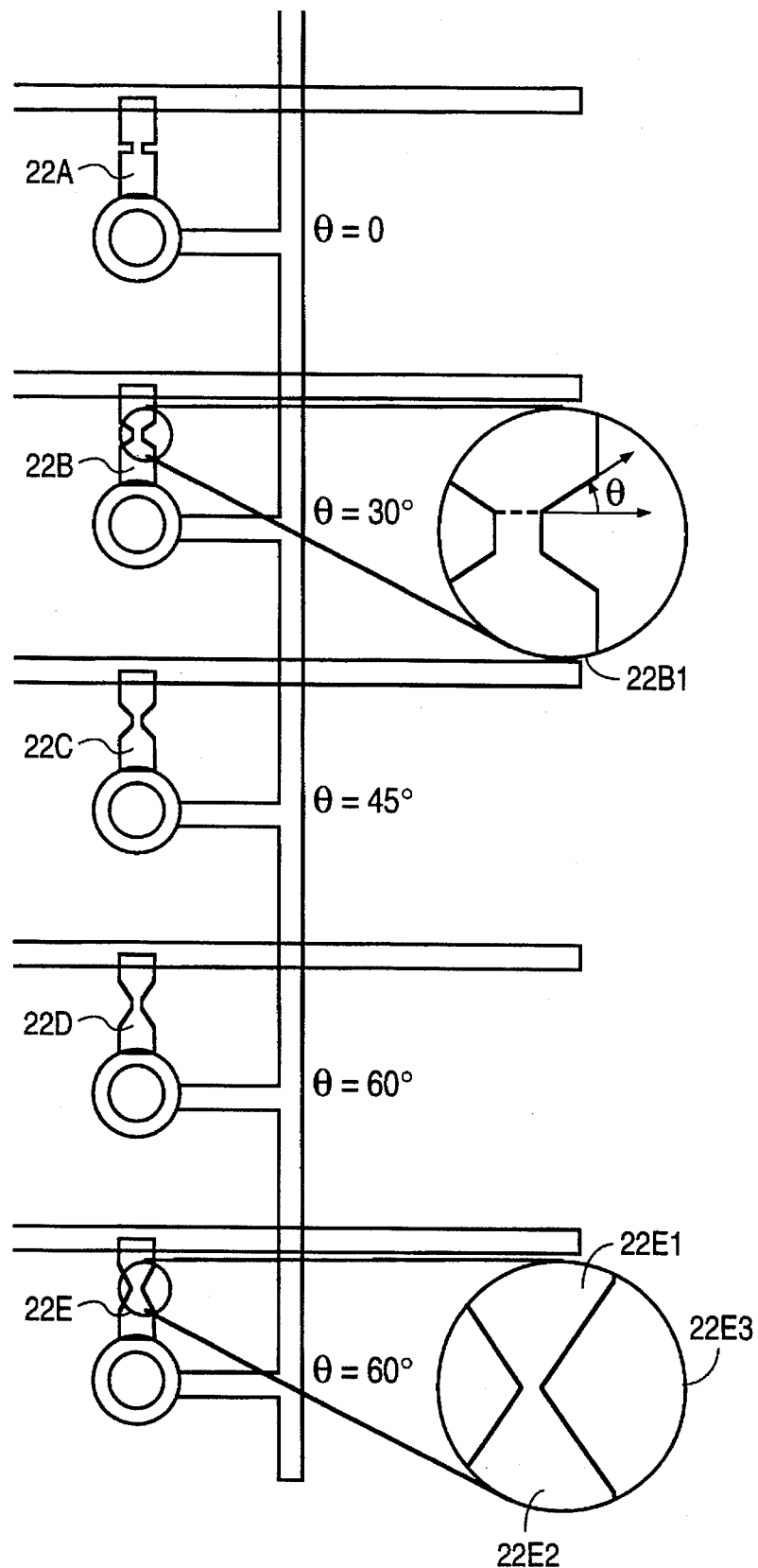

FIGS. 2A, 2B and 2C illustrate various fuse geometries. As shown in FIG. 2A, fuse 15DD has a narrow central separable portion 17DD and two broader connection portions 16DD and 18DD. A separable portion of a fuse, such as for example, portion 17DD, is an electrical connection capable of being opened by programming employing voltage/current, heat, light source, or laser, such that the two connection portions of the fuse such as, for example, portions 16DD and 18DD are no longer connected to each other.

In one embodiment the separable portion of a fuse is formed integral with the fuse's connection portions. In another embodiment the separable portion is in electrical contact with the connection portions, although the separable portion is formed separate and distinct from the connection portions.

A separable portion of a fuse can be designed to provide selected fuse blowing characteristics. For example, the time required to blow a fuse is dependent on the amount of local heat generated due to current flowing through the fuse as well as the distribution of the electric field intensity in the fuse.

A separable portion of a fuse can have a geometry to increase the intensity of the electric field therein and to create high stress concentration areas therein which create higher local heat and thus reduce programming time. For example, to reduce the programming time, fuse 15CD (FIG. 2A) is provided with a single sided notch 19 in central separable portion 17CD. A fuse can have a notch of any shape such as, for example, a rectangle, a circular arc or a triangle.

Furthermore, multiple notches such as notches 20A and 20B (FIG. 2A) can be provided in a separable portion 17BD of a fuse 15BD to increase the concentration of electric field in a fuse and the current flowing through a cross-section of the fuse. If the two notches in a fuse are sufficiently close to each other, electric fields at the two notches interact due to adjacent boundary conditions and such interaction can further reduce the fuse programming time.

Furthermore a hole 21 can be provided in the center of a separable portion 17AD as shown for fuse 15AD in FIG. 2A. Holes in a fuse provide better control over fuse blowing characteristics by allowing a more uniform temperature distribution because the region of highest temperature in a fuse is removed by removal of fuse material otherwise located in a hole. Holes in a fuse also provide better reliability during normal operation of an intact fuse as a part of a circuit because the electric field in an intact fuse with a hole is not as concentrated as compared to the electric field in a fuse with a notch at the edge. For a given application, a hole size can be selected considering various parameters, such as the current carrying capacity, selected fuse blowing characteristics, process variations during fuse manufacture and misalignment tolerance between a hole edge and a fuse edge.

In one embodiment of this invention, the hole diameter is 1 micrometer for a separable portion 6 micrometers wide. In another embodiment of this invention, the hole diameter is 3 mils for a separable portion 6 mils wide. If a fuse hole diameter is significantly larger than 50% of the width of the separable portion, then line width control of the separable portion can become a problem. For example, if due to misalignment a hole edge touches a fuse edge, a notch is formed instead of a hole. Furthermore, if a hole diameter is too large, the fuse has increased resistivity which reduces the current carrying capacity of the fuse.

Moreover, a separable portion can be joined to the connection portions of a fuse at various taper angles θ (see inset 22B1 of FIG. 2B) such as for example 0°, 30°, 45° or 60° as shown for fuses 22A to 22D. Taper angle θ can be optimized to obtain reduced fuse blowing time or fuse blowing current for a given application. In general, fuse blowing time reduces as taper angle θ is reduced because the concentration of electric field in a fuse position having a sharper corner raises the temperature of the portion as compared to a fuse portion having a smoother corner.

A fuse 22E (FIG. 2B) is similar to fuse 22D except that fuse 22E does not have a separable portion. Instead, a first connection portion 22E1 is directly and integrally connected to a second connection portion 22E2, as shown in inset 22E3. Therefore the periphery of fuse 22E has a single angular notch on each side of fuse 22E, so that connection portions 22E1 and 22E2 directly contact each other.

In order for a fuse to properly disintegrate (i.e. "blow") on application of a programming current, in one embodiment of this invention, the fuse includes a conductive trace of thickness in the range of 0.1 micrometer to 0.1 millimeter, width in the range of 10 micrometer to 1 millimeter and length in the range of 10 micrometer to 10 millimeter. Furthermore, in one embodiment the diameter of linking via holes (such as via holes 14AD to 14DD (FIG. 2A)) is 8 mils and the distance between two adjacent parallel metal traces is 20 mils. In another embodiment the diameter of a linking via hole is 1 micrometer and the distance between two adjacent parallel traces is 2 micrometers.

FIG. 2C illustrates a portion of a multi-layered structure 23S that comprises one embodiment of a fuse 23. Fuse 23 has a narrow central separable portion 23C and two broader connection portions 23A and 23B. Separable portion 23C is joined to connection portions 23B and 23A at the taper angle θ of 37.5°. Moreover, fuse 23 has two notches on the two sides of separable portion 23C that define semicircular peripheries 23C1 and 23C2 of separable portion 23C. Semicircular peripheries 23C1 and 23C2 have a radius of curvature R of 0.02 inch.

In the embodiment of FIG. 2C, separable portion 23C has a width W1=0.012 inch and a length L1=0.01 inch. Connection portions 23B and 23A have a width W2 of 0.025 inch. A resist opening 23Q of width L2=0.02 inch is opened in multi-layered structure 23S to form fuse 23. In this embodiment, fuse 23 is formed of a nickel phosphorus alloy denoted Ni/P, has a thickness of 0.3 to 3 micrometer and a resistance in the range of 0.1 to 10 ohms.

In this embodiment (FIG. 2C) a trace has a width W3=0.023±0.001 inch linking via holes, such as linking via hole 23L, have a diameter of 0.05 inch, and other via holes, such as via hole 23V, have a diameter of 10 mil. This embodiment of multi-layered structure 23.5 has a length of 3.75 inch, a width of 2.58 inch, a thickness of 0.062 inch and contains twenty row traces and twenty column traces (only some traces are shown in FIG. 2C). The row traces of multi-layered structure 23S and column traces are connected to each other by four hundred fuses. Multi-layered structure 23S can be used in either a socket adapter or a cable adapter as described below.

In addition to choosing the appropriate fuse geometry and thickness, it is necessary to choose the appropriate fuse material. A fuse (such as, for example one of fuses 9AA–9EE (FIG. 1), 15AD–15DD (FIG. 2A) and 22A–22D (FIG. 2B)) can be formed of any electrically conducting material. Forming fuses from materials widely used in the PCB environment, such as, for example, copper, solder (Sn-Pb) and nickel, or Ni/P alloys has the important advantage of fuse manufacture being compatible with standard PCB processing.

A fuse can be formed using common PCB, PWB, MCM or IC package processes such as for example, electrolytic plating, electroless plating, physical or chemical vapor deposition and sputtering depending on the constraints and needs of a particular application. For example, electrolytic plating results in better quality of fuse material but results in loss of control on layer thickness and uniformity in geometry. On the other hand, although electroless plating provides better control on layer thickness, adhesion of the fuse layers and inferior quality of fuse materials are problems. Finally, physical or chemical vapor deposition provide better control of both thickness and geometry but has the drawback of being too expensive.

Fuse blowing characteristics can be optimized without increasing fuse resistance (1 to 1000 milliohm) by using fuse materials different from PCB, PWB, MCM or IC package materials. Fuse materials with melting points lower than 1000° C. include, for example, tin, lead, thallium, zinc, antimony, magnesium and aluminum (see Table 1). Furthermore, alloys or combinations of such low melting point materials can also be used as fuse materials. For example Ni/P (20% P by atomic percentage) has an eutectic point of 870° C. Both Ni/P and Ni/Sn can be used as fuse materials.

The ratio of fuse resistance to the resistance of a trace unit length (i.e. between adjacent fuses) should be large, so that during programming the voltage drop across the fuse is larger than the voltage drop across the trace unit length. For a large fuse matrix, total trace lengths are much larger than total trace lengths of a small fuse matrix. Therefore, for a large matrix, the resistance of trace unit length should be minimized, rather than increasing the fuse resistance for a given ratio of fuse resistance to trace unit length resistance. In one embodiment, the ratio of fuse resistance to the trace unit length resistance is 1000. In one embodiment, a Ni/P fuse has a resistance in the range of 0.1 ohms to 10 ohms and is used in a fuse matrix, such as a 100×100 matrix.

In forming a fuse, optionally an interfacial layer can be used to improve adhesion of the fuse material to the PCB, PWB, MCM or IC package materials. For example, copper and/or nickel can be used to improve adhesion of solder or a low melting point fuse material to PCB, such substrate, such as epoxy resin.

Furthermore, in addition to the fuse materials described above for PCB, PWB, MCM or IC packaging, fuse materials used in the semiconductor field such as for example, Ti/W or Pt/Si can be used for ceramic packages because ceramic layers can withstand high processing temperatures (over 800° C.) that are commonly required for these materials.

Figure 2D:
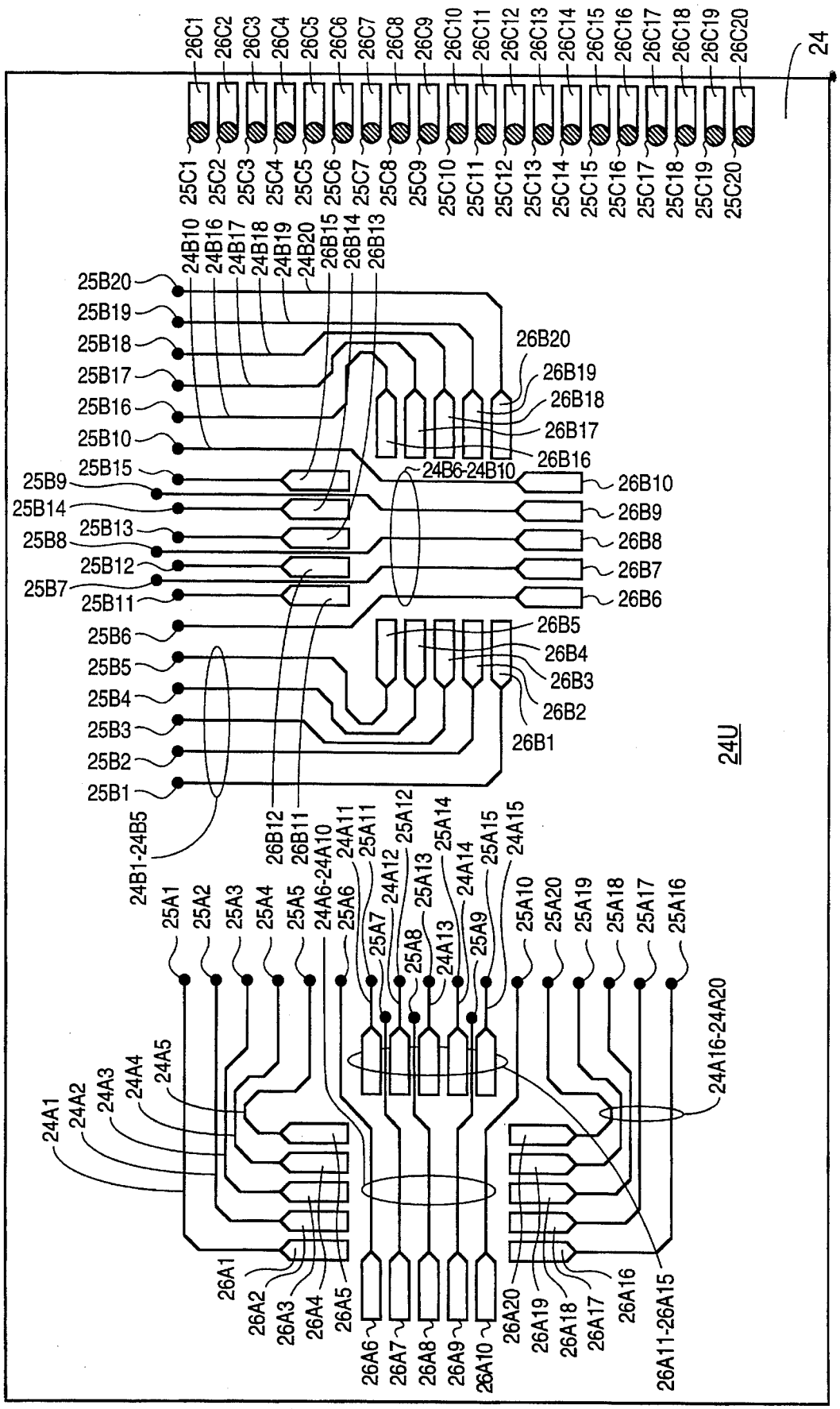
FIGS. 2D, 2E, 2F and 2G illustrate the traces and via holes of a multi-layered structure in a printed circuit board in accordance with one embodiment of this invention.

A matrix of fuses can be used in a printed circuit board to interconnect two electronic components as illustrated in FIGS. 2D, 2E, 2F, 2G and 2H. FIG. 2D shows the upper-most surface layer 24U of a PCB 24 via holes 25A1 to 25A20, connected by traces 24A1 to 24A20 respectively to mounting pads 26A1 to 26A20. Also shown in FIG. 2D are via holes 25B1 to 25B20, connected by metal traces 24B1 to 24B20 respectively to mounting pads 26B1 to 26B20. Mounting pads 26A1 to 26A20 and 26B1 to 26B20 are used for surface mounting of IC packages. Also shown in FIG. 2D are connector pads 26C1 to 26C20 (used for applying the programming current to the fuse matrix as described below) which are in electrical contact with conducting via holes 25C1 to 25C20.

Figure 2E:
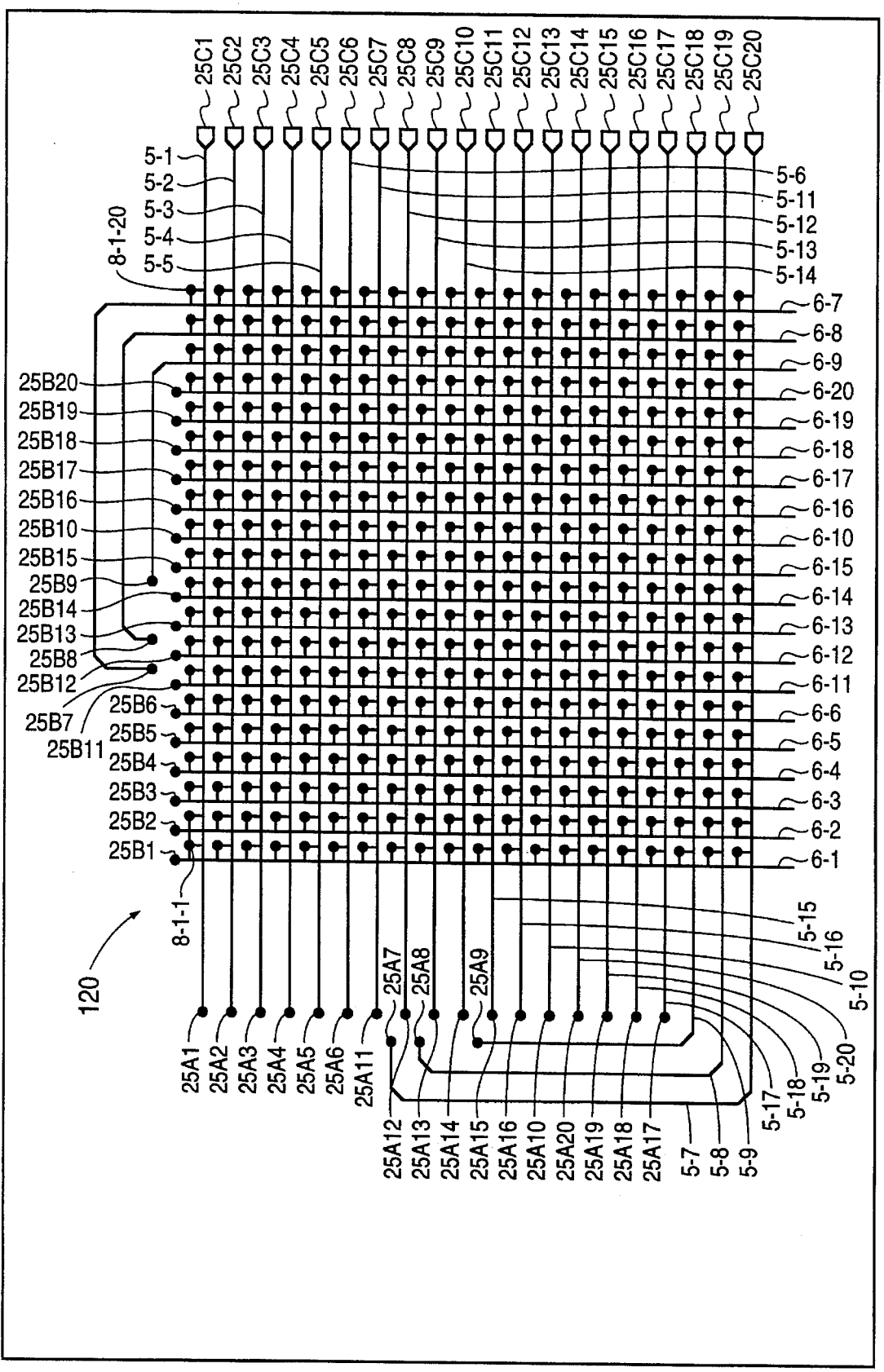
Figure 2F:
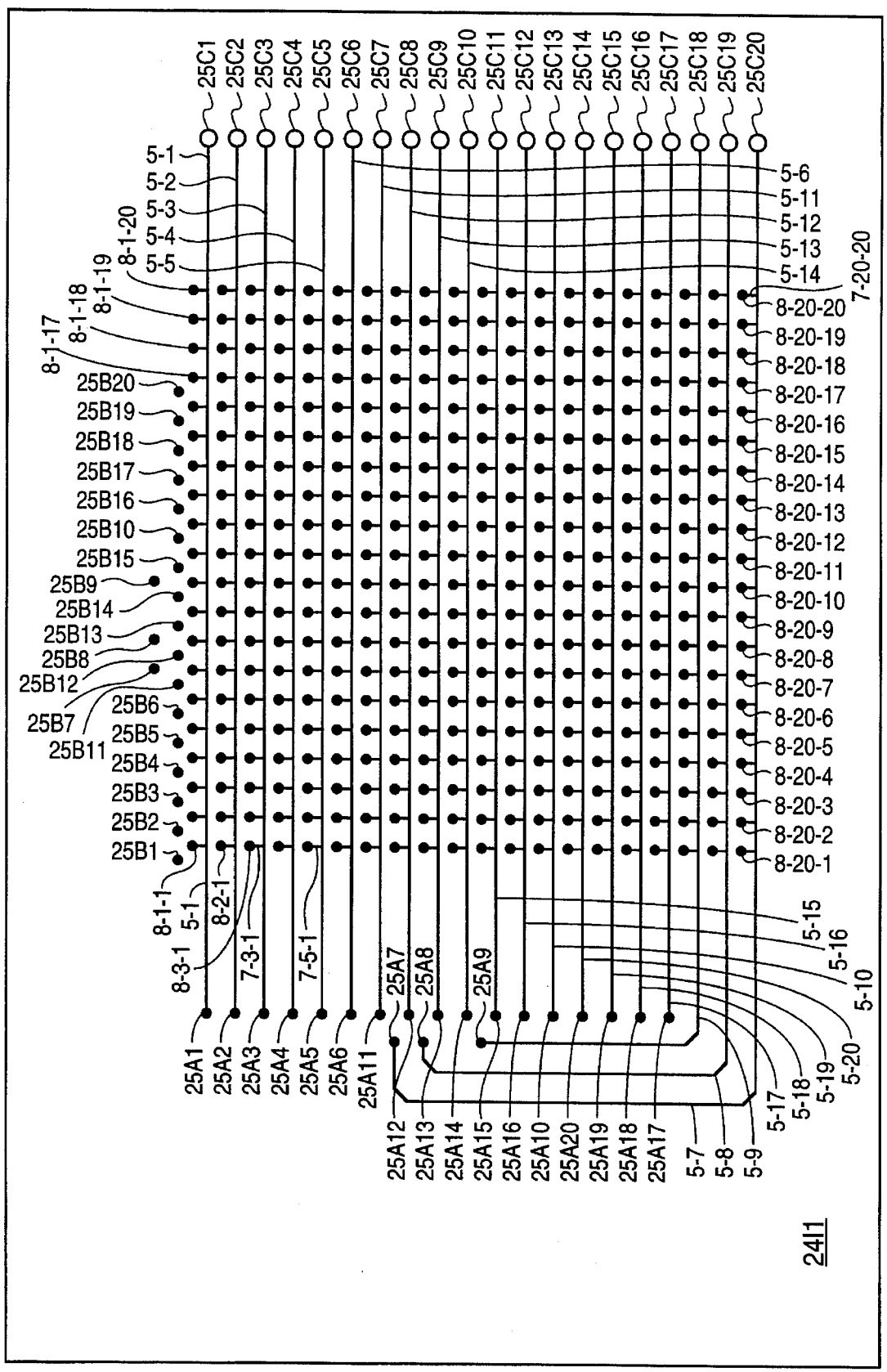
Figure 2G:
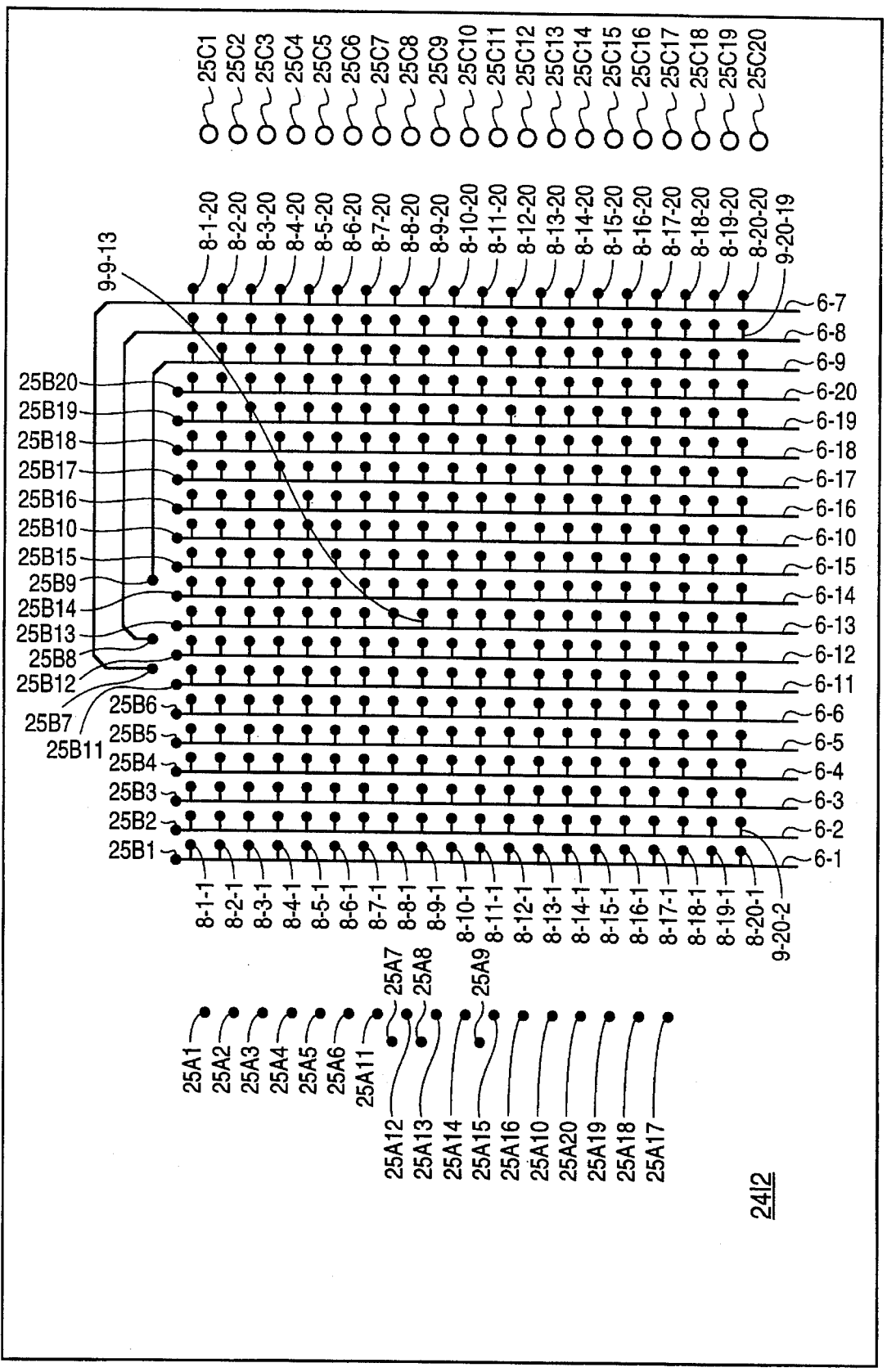

FIG. 2E illustrates a composite of two inner layers showing fuse matrix 120 including metal traces 5-1 to 5-20, metal traces 6-1 to 6-20, fuses (not labeled for clarity) and conducting connectors (also not labeled) that are used to interconnect via holes 25A1 to 25A20 and via holes 25B1 to 25B20. As shown in FIG. 2E programming via holes 25C1 to 25C20 are connected to metal traces 5-1 to 5-20 respectively. Matrix 120 of FIG. 2E is formed of two layers 24I1 and 24I2 shown in FIGS. 2F and 2G.

Location of a programmable element on an inner layer of a structure is illustrated in FIGS. 2D, 2E, 2F and 2G by fuse 9-9-13 that connects via holes 25B13 and 25A13. Fuse 9-9-13 is located in an area of inner layer 24I2 that is covered by an electronic component when the electronic component is mounted on mounting pads 26B1-26B20, as shown in FIG. 2H.

Figure 2H:
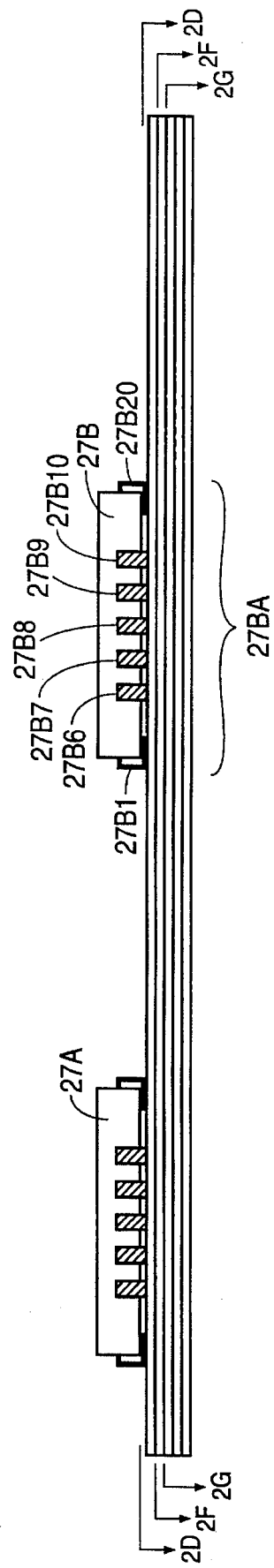
FIG. 2H illustrates two electronic components mounted on the printed circuit board of FIGS. 2D, 2E, 2F and 2G.
Figure 21:
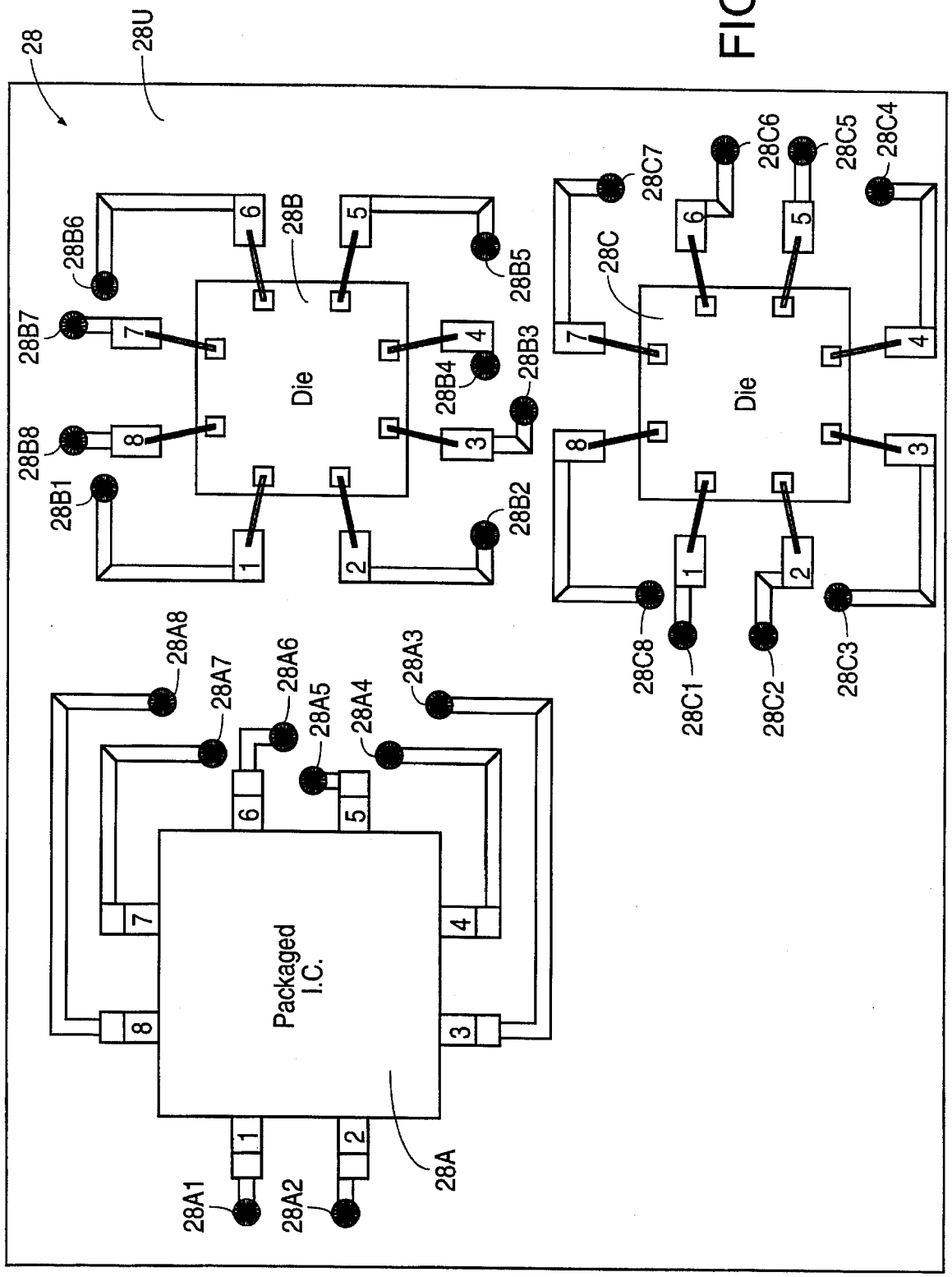

FIG. 2H illustrates electronic components 27A and 27B mounted on printed circuit 24 and the location of fuses in an area 27BA covered by an electronic component 27B. Electronic component 27B has a number of surface mount terminals, such as terminals 27B1 and 27B20, that are received by mounting pads of printed circuit board 24, such as mounting pads 26B1 and 26B20 (FIG. 2D). Fuse 9-9-13 (FIG. 2G) that connects via holes 25B13 and 25A13, and all fuses adjacent to fuse 9-9-13 are located in area 27BA (FIG. 2H). Area 27BA is the area covered by electronic component 27B when electronic component 27B is mounted on mounting pads 26B1–26B20.

Placement of a fuse on an inner layer of a PCB, PWB, MCM or IC package allows the uppermost surface of the PCB, PWB, MCM or IC package to be available for mounting electronic components or for forming custom traces. Therefore electrical devices of smaller size and lower cost can be fabricated, than possible with fuses on the uppermost surface.

FIG. 2I illustrates a chip on-board PCB 28 in accordance with this invention. The component contacts of chip on-board PCB 28 are coupled to each other by two matrices of fuses formed in the inner layers of chip on-board PCB 28, which inner layers are located between upper-most surface 28U and a lower-most surface (not shown) of chip on-board PCB 28. Chip on-board PCB 28 also includes a packaged integrated circuit 28A, die 28B and die 28C mounted in component contacts, such as via holes 28A1 to 28A8, 28B1, 28B8 and 28C1 to 28C8 on an upper-most surface 28U of chip on-board PCB 28.

Figure 2J:
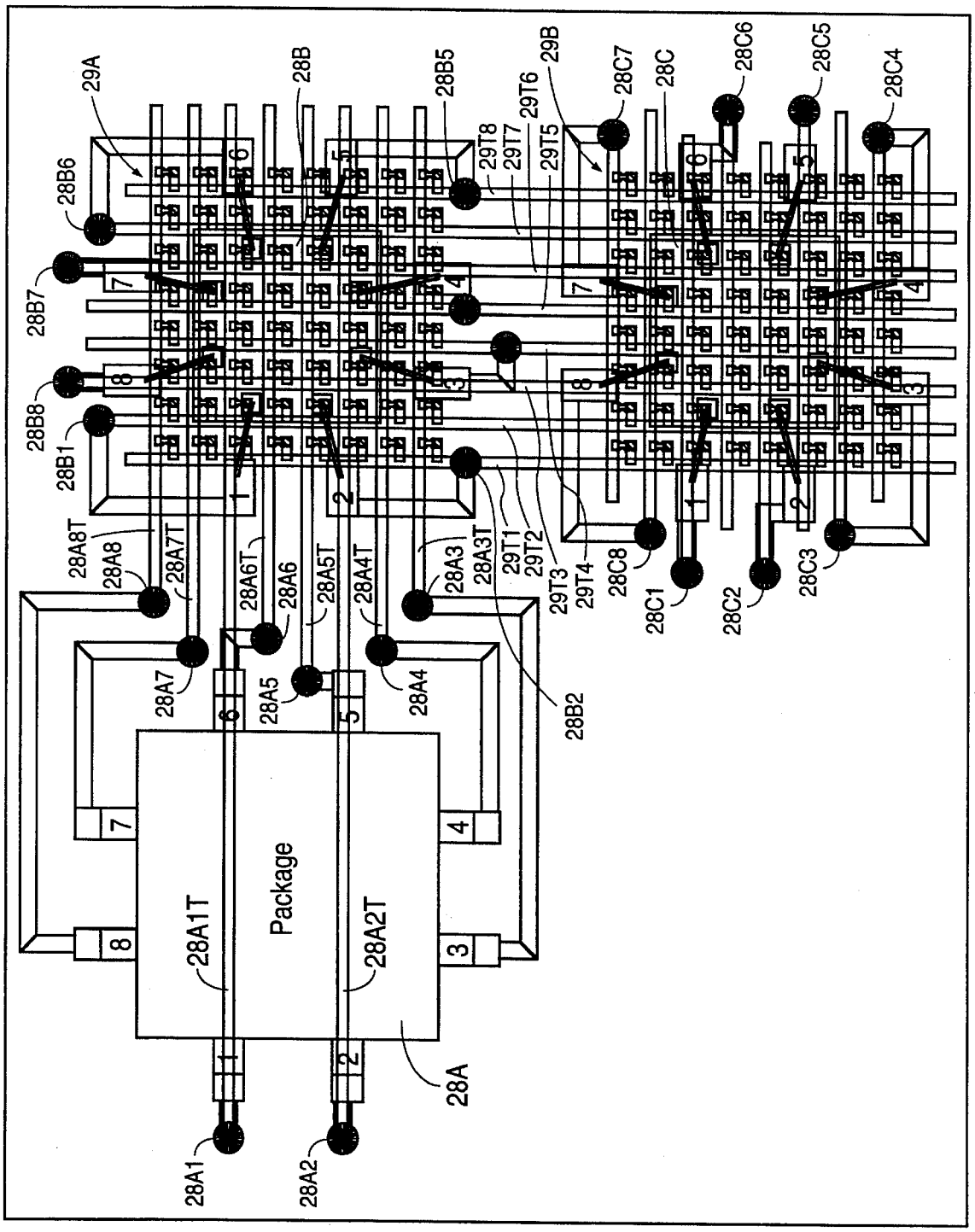
Figure 2K:
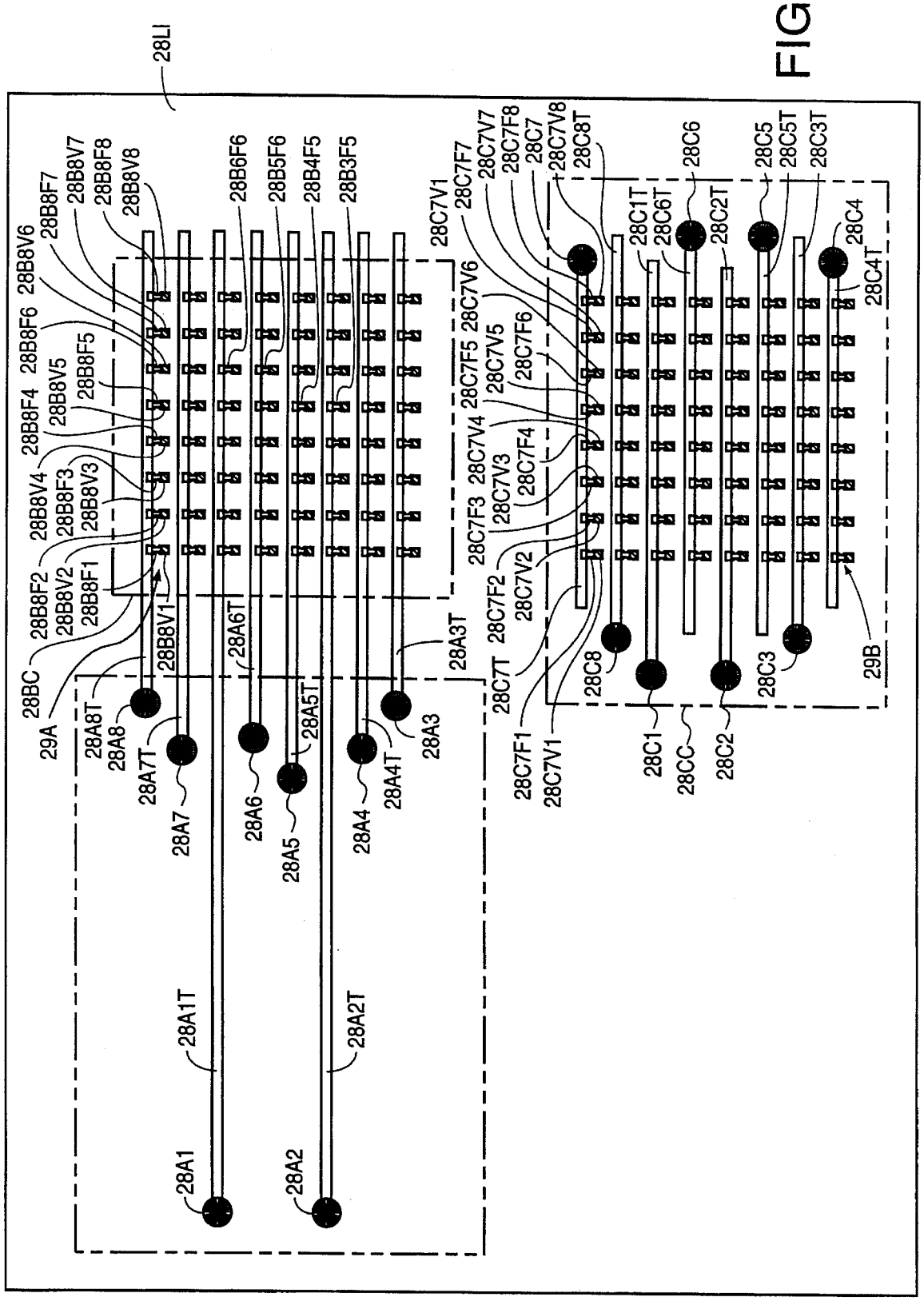
Figure 2L:
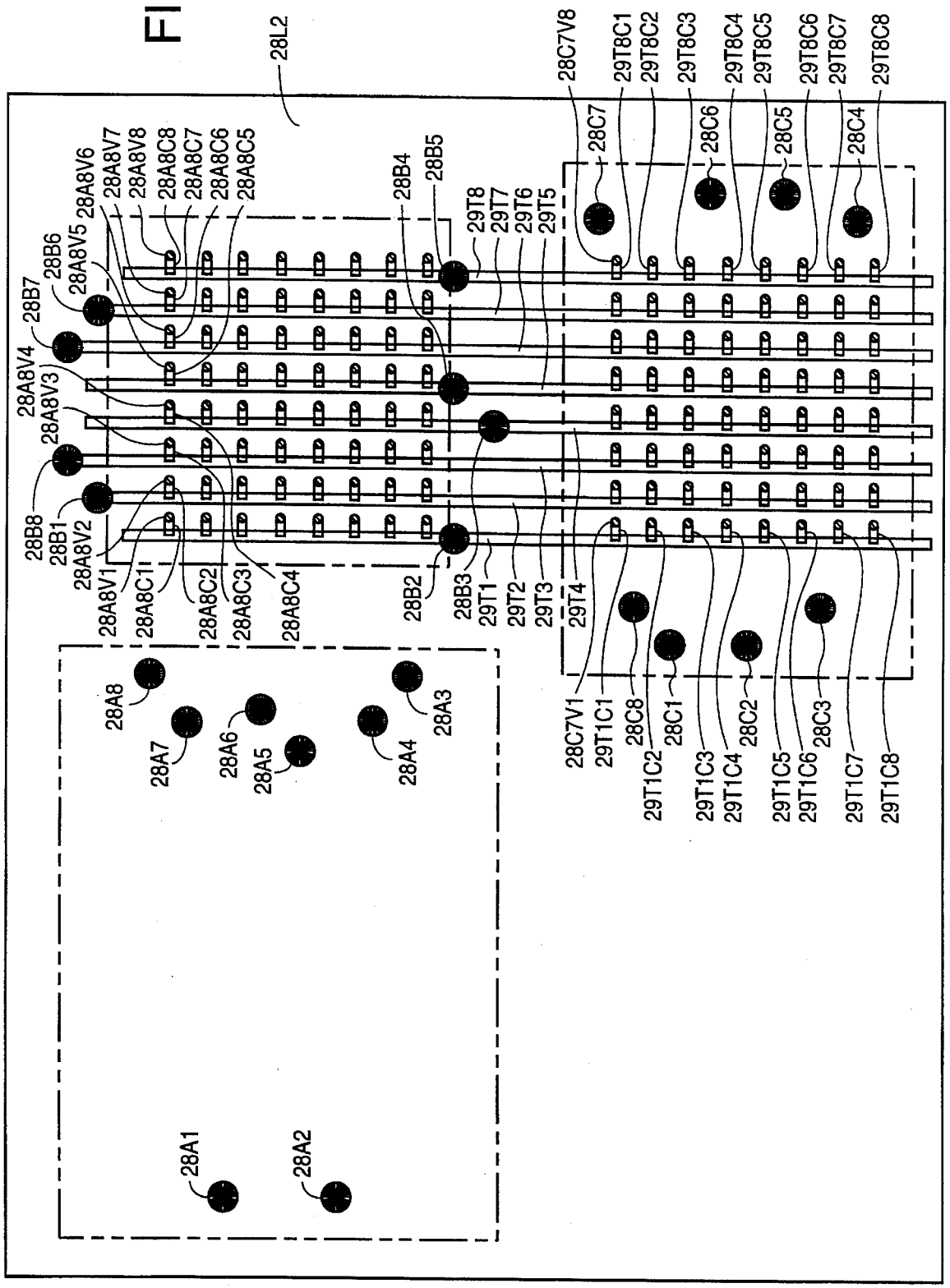

FIG. 2J is an illustrative composite of the traces and fuses on first inner layer 28L1 (FIG. 2K) and second inner layer 28L2 (FIG. 2L). Only some parts of FIGS. 2I, 2J, 2K and 2L are numbered for clarity.

First inner layer 28L1 (FIG. 2K) has a number of horizontal traces, such as traces 28A1T to 28A8T that connect component contacts, such as via holes 28A1 to 28A8 to a number of fuses in fuse matrix 29A (FIG. 2J).

Each fuse in first fuse matrix 29A is formed as part of first inner layer 28L1 (FIG. 2K) in the manner described above in reference to FIG. 1. All of the fuses of first fuse matrix 29A, such as fuses 28B6F6, 28B5F6, 28B4F5 are located in an area 28BC (dashed box in FIG. 2K) covered by die 28B (FIG. 2L).

Component contacts, such as via holes 28C1 to 28C8 are connected by traces 28C1T to 28C8T to a number of fuses in second fuse matrix 29B. Each of the fuses in second fuse matrix 29B is also formed as part of first inner layer 28L1 (FIG. 2K) in the manner described above in reference to FIG. 1. All of the fuses of second fuse matrix 29B are also located in an area 28CC (dashed box in FIG. 2K) covered by die 28C (FIG. 2L).

Chip on-board PCB 28 is formed of substrate, trace and fuse materials as described above. For example, inner layers 28L1 and 28L2 of chip on-board PCB 28 can be formed from any multichip module substrate, such as a substrate made of ceramics, polyimide, teflon, epoxy and aluminum oxide using conventional MCM processes, such as electroless plating. Moreover, the fuse and trace geometry and dimensions can be chosen as appropriate including from those described above, for example, in reference to FIGS. 2A, 2B and 2C.

A customer can appropriately program various fuses in fuse matrix 29A and fuse matrix 29B to interconnect any component contact to any other component contact in any manner to form any selected circuit, for example, as described below in reference to FIGS. 15A, 15B, 15C and 15D.

Although FIGS. 2I, 2J, 2K and 2L illustrate a chip on-board PCB 28, a multichip module in accordance with this invention can be built using the same architecture, and include die 28B and 28C without packaged integrated circuit 28A. In such an embodiment, a substrate 28 with die 28B and 28C is mounted inside a single package.

Figure 4B:
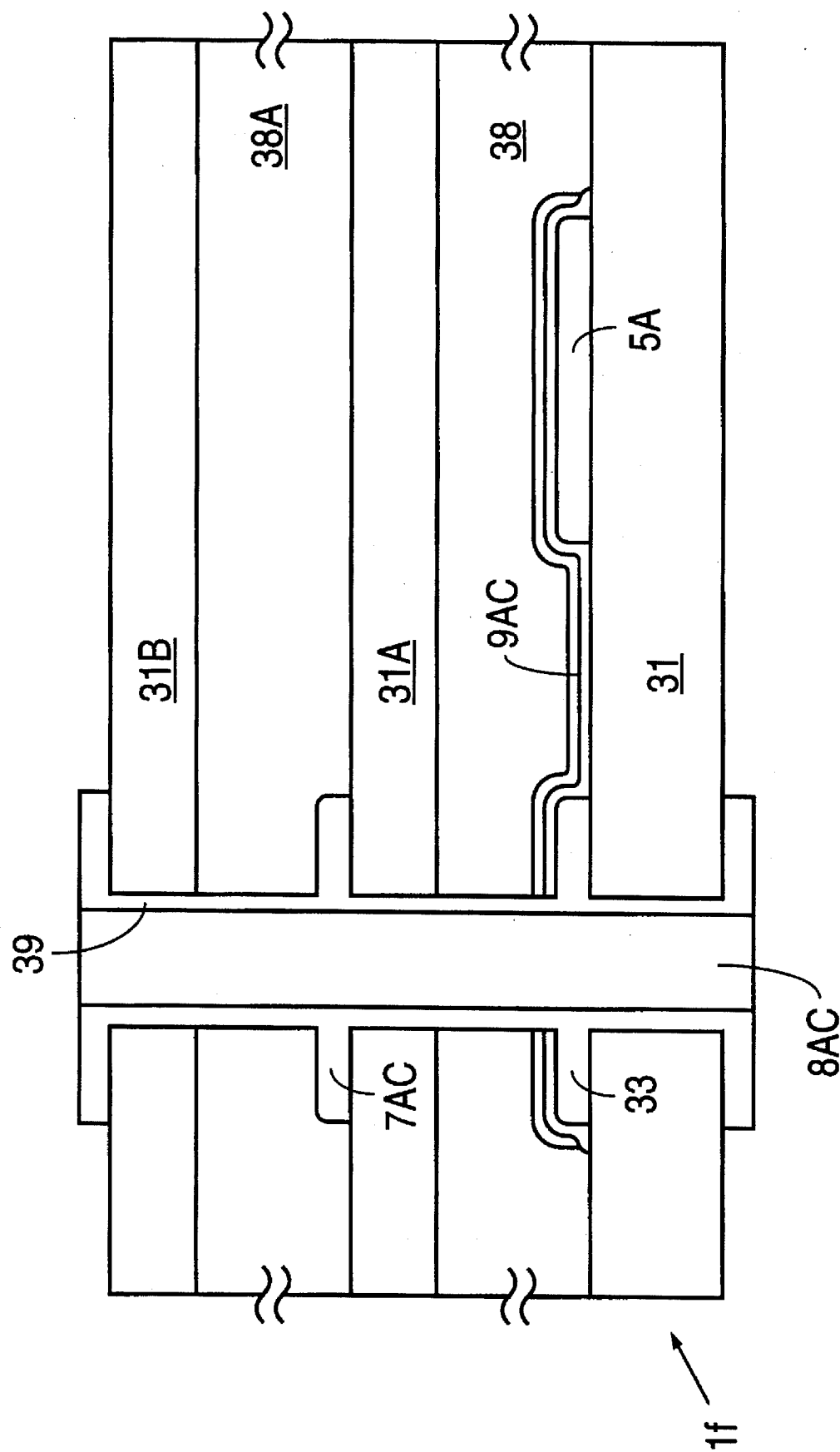

FIG. 3 is a process flow chart for incorporating a fuse into a PCB, PWB, MCM or IC package in accordance with this invention. FIG. 4A illustrates cross-sections 1a–1e of a PCB at the end of a corresponding step a-e of the process of FIG. 3. FIG. 4B illustrates a cross-section of PCB 1 of FIG. 1 taken in the direction Y—Y and formed in accordance with the process of FIG. 3.

As shown in FIG. 3 first, at step a, after a PCB core 31 (see PCB cross-section 1a of FIG. 4A) is formed by well known PCB process steps, a conductive electrode layer 32 is formed on PCB core 31 and a mask is used to develop a pattern photo image (not shown) for forming metal traces and pads. PCB core 31 can be any electrically insulating substrate material (such as for example, epoxy resin, polyimide, and can include a fiber glass matrix for mechanical strength). If a polyimide substrate is chosen to form PCB core 31, higher temperatures (up to 350° C.) can be used for fuse fabrication in PCB processing. In MCM or IC packages, if a ceramic substrate is chosen to form a substrate 31, higher temperatures (over 800° C.) can be used for fuse fabrication in MCM or IC package processing.

In step b, metal traces 33 and 34 (see PCB cross-section 1b of FIG. 4A) are formed by etching conducting layer 32 and stripping the mask. Next, in optional step c, an optional interfacial conductive layer 35 (for providing adhesion) can be blank formed over the entire PCB (see PCB cross-section 1c of FIG. 4A).

A fuse 37 (with narrow central separable portion 37-2 and broader connection portions 37-1 and 37-3) is formed of fuse layer 36 in step d, by masking and etching. First the surface of the PCB is marked so as to leave open only the areas at which a fuse and the associated trace and via holes are to be formed (such as for example, in FIG. 1, the areas covered by traces 5A–5E, fuses 9AA–9EE and linking via holes 8AA–8EE). Next, fuse material such as, for example, solder is formed over the surface of the mask and the PCB surfaces exposed by the open areas of the mask. Then the mask layer is stripped away by a lifting process. Next the fuse material is used as a mask to etch away the blank deposited optional interfacial layer 35.

After a dielectric layer 38 (such as for example, a plastic resin) is deposited, the above described steps a-d (FIG. 4A) can be repeated as often as necessary to produce, for example, the PCB cross-section 1e of FIG. 4A, having additional layers of substrate 31A and 31B, metal traces 33A and 34A and fuse 37A (formed of fuse layer 36A).

Next, linking via holes, such as, for example, via hole 8AC in PCB cross-section 1f of FIG. 4B, are made and plated with conductive material 39. Such linking via holes are formed by standard processes and techniques used in forming via holes for PCB, PWB, MCM or IC packages (such as, for example, drilling, or physical or chemical etching). PCB cross-section 1f of FIG. 4B, illustrates a cross-section of PCB 1 of FIG. 1 in the direction Y—Y. Cross-section 1f of FIG. 4B can be formed from cross-section 1d of FIG. 4A by forming conducting connector 7AC and metal trace 5A (see FIG. 1) in the same manner as described above for metal traces 33 and 34.

As shown in FIG. 4B, conducting material 39 in linking via hole 8AC connects metal trace 5A of a lower layer to conducting connector 7AC of an upper layer. In this manner, trace 5A (FIG. 1) is connected to trace 6C through conducting connector 7AC and fuse 9AC. Any necessary connections are made after the multi-layered structure is fabricated to connect matrix 2 (FIG. 1) to other vias and custom circuits, such as for example, traces on the uppermost surface layer of the printed circuit board.

The above described method of fabrication of a fuse for a PCB, PWB, MCM or IC package has several advantages. Compatibility of fuse fabrication with the PCB or MCM or IC package process flow allows fuses to be made easily, enables faster speed for product life cycle which allows rapid prototyping, and permits better placement and routing architecture for the programmable PCB, PWB, MCM, or IC packages.

In addition to or as an alternative to the use of the fuses described above, the terminals of electronic components can also be interconnected through antifuses. An antifuse is a normally open switch element in which the electrical connection is established by applying electrical energy, heat energy or light energy to the non-conducting material to make it conducting. An antifuse can include a thin layer of non-conductive dielectric material sandwiched between two electrodes so that upon programming, a conductive path is formed in the dielectric material to connect the two electrodes.

There appear to be no known attempts to integrate antifuses into PCBs, MCMs, or IC package substrates (such as PGA's). One reason is that all known previous antifuses made by semiconductor technology had a thickness in the range of 100Å (0.01 µm) to 1000Å (0.1 µm). However, antifuses made by semiconductor technology are too thin for use in PCB, PWB, MCM or IC packaging. Antifuse thickness must be orders of magnitude larger (0.1 µm to 1 mm) in order to be manufacturable and useable in the PCB, PWB, MCM or IC package environment. Firstly, it is very difficult to manufacture such thin 0.1 µm to 0.01 µm layers of materials using standard PCB, PWB, MCM or IC package manufacturing processes.

Secondly, maintaining mechanical integrity of the antifuse layers in the board or package environment is a major concern because PCBs, MCMs and IC packages are handled by hand and can easily get flexed. Finally, the antifuses used in semiconductor integrated circuits are created at high temperatures (300° C. to 800° C.) which are not normally available for plastic substrates used in PCBs, MCMs or IC packages (wherein the process temperatures are limited to around 150° C. or 250° C.).

Figure 5A:
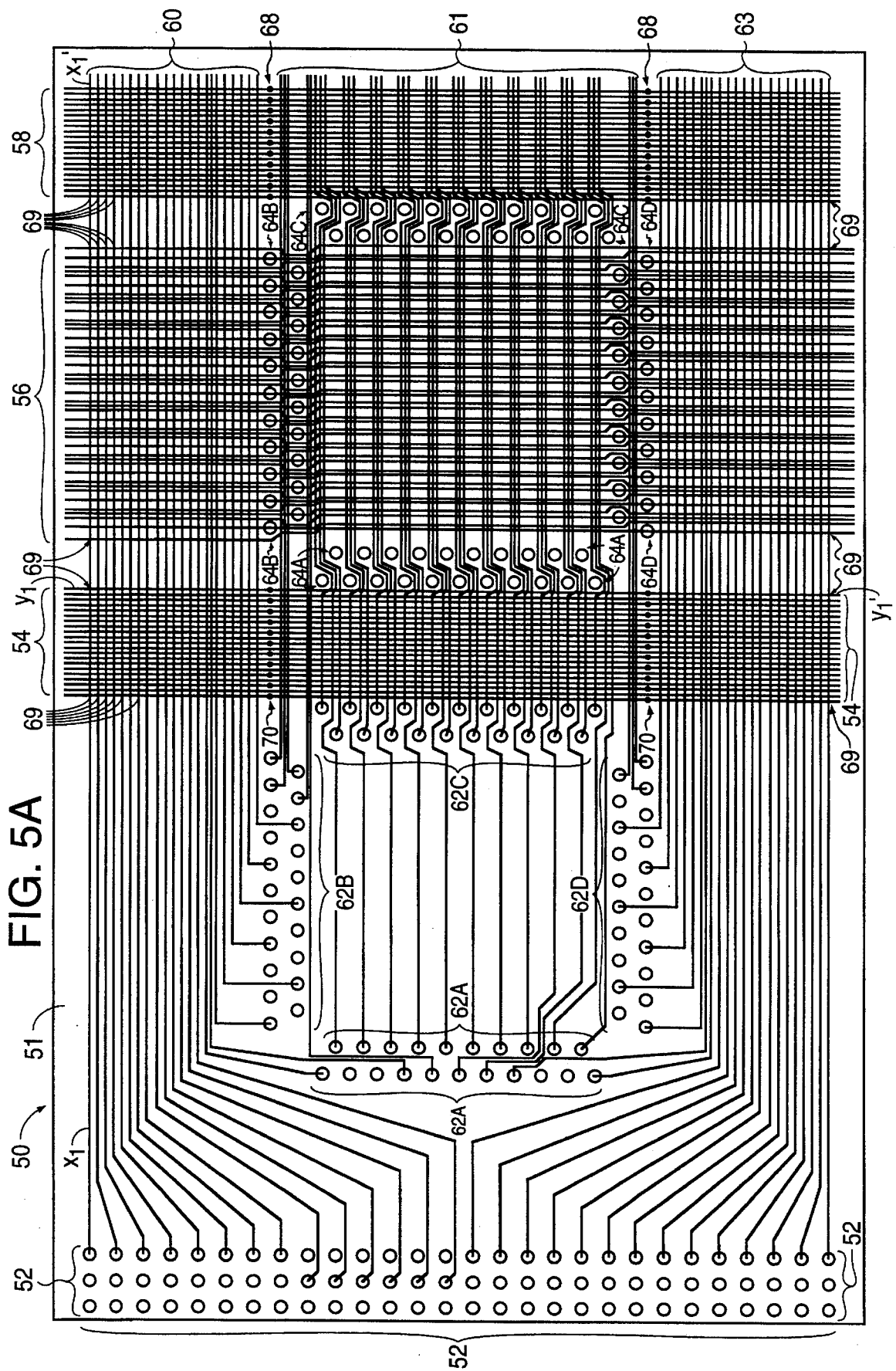
FIG. 5A illustrates a matrix of antifuses in a multi-layered printed circuit board in accordance with one embodiment of this invention.
Figure 5B:
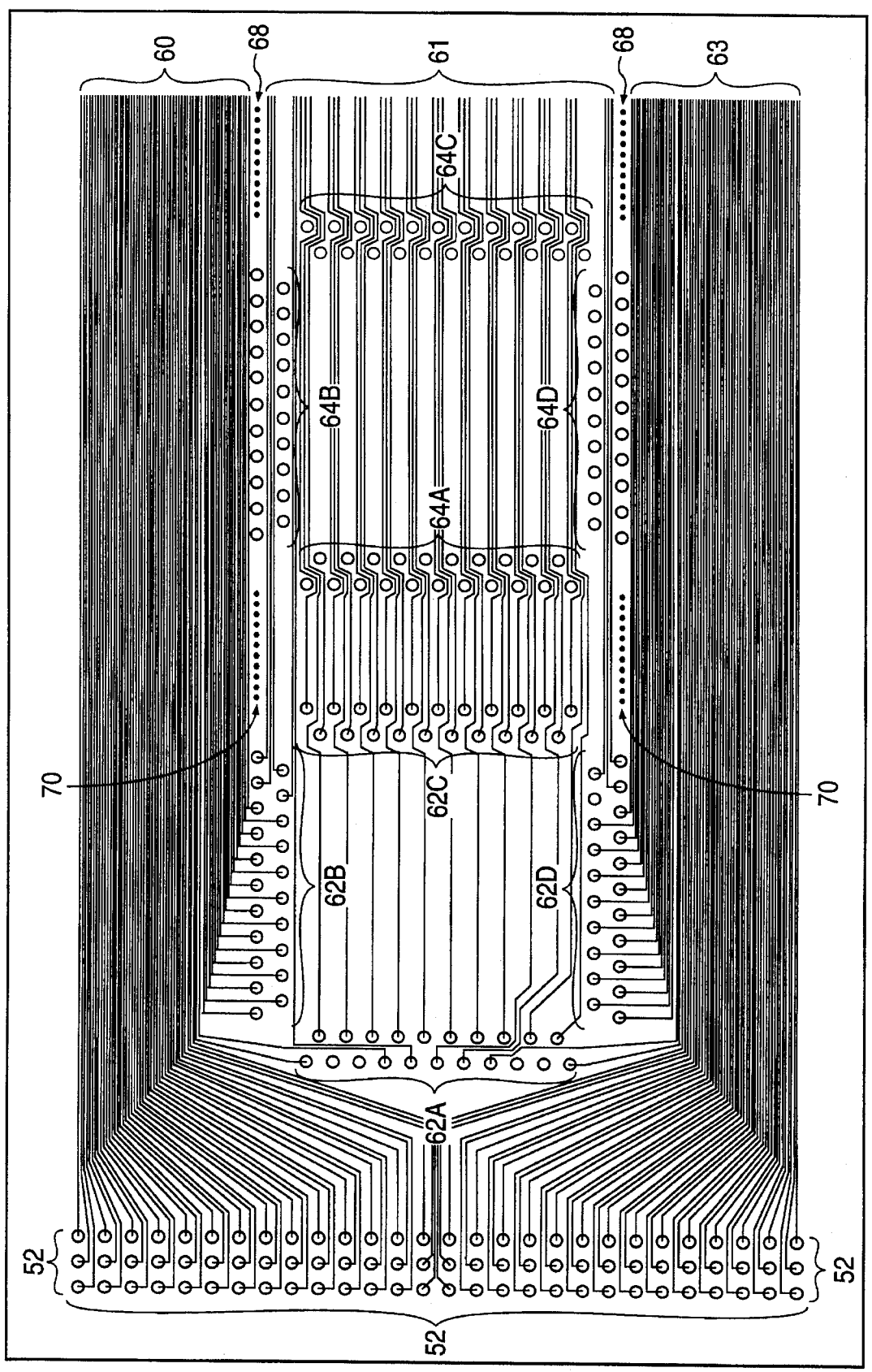
FIGS. 5B, 5C and 5D illustrate traces and via holes on each layer of the multi-layered printed circuit board of FIG. 5A.
Figure 5C:
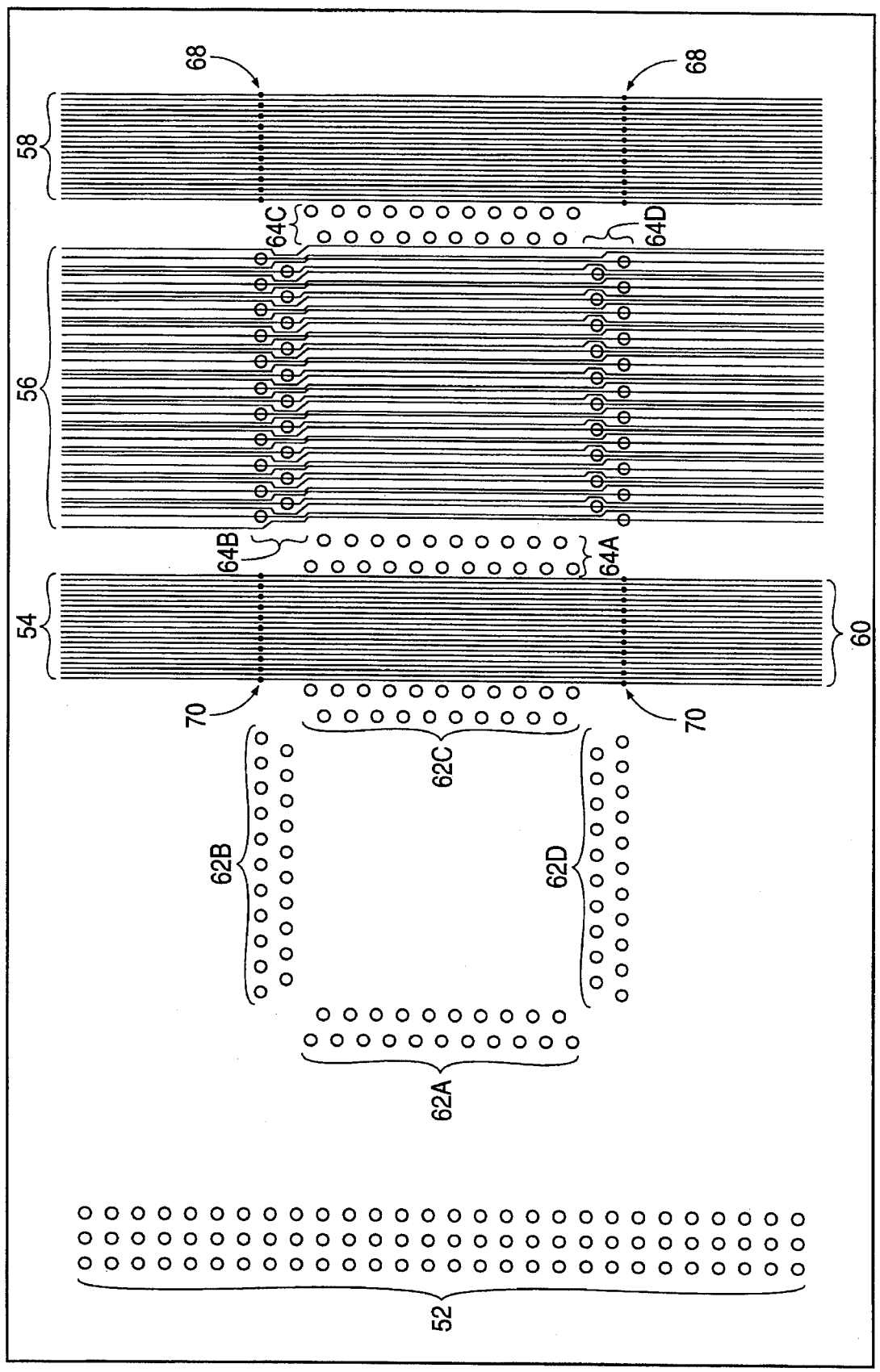
Figure 5D:
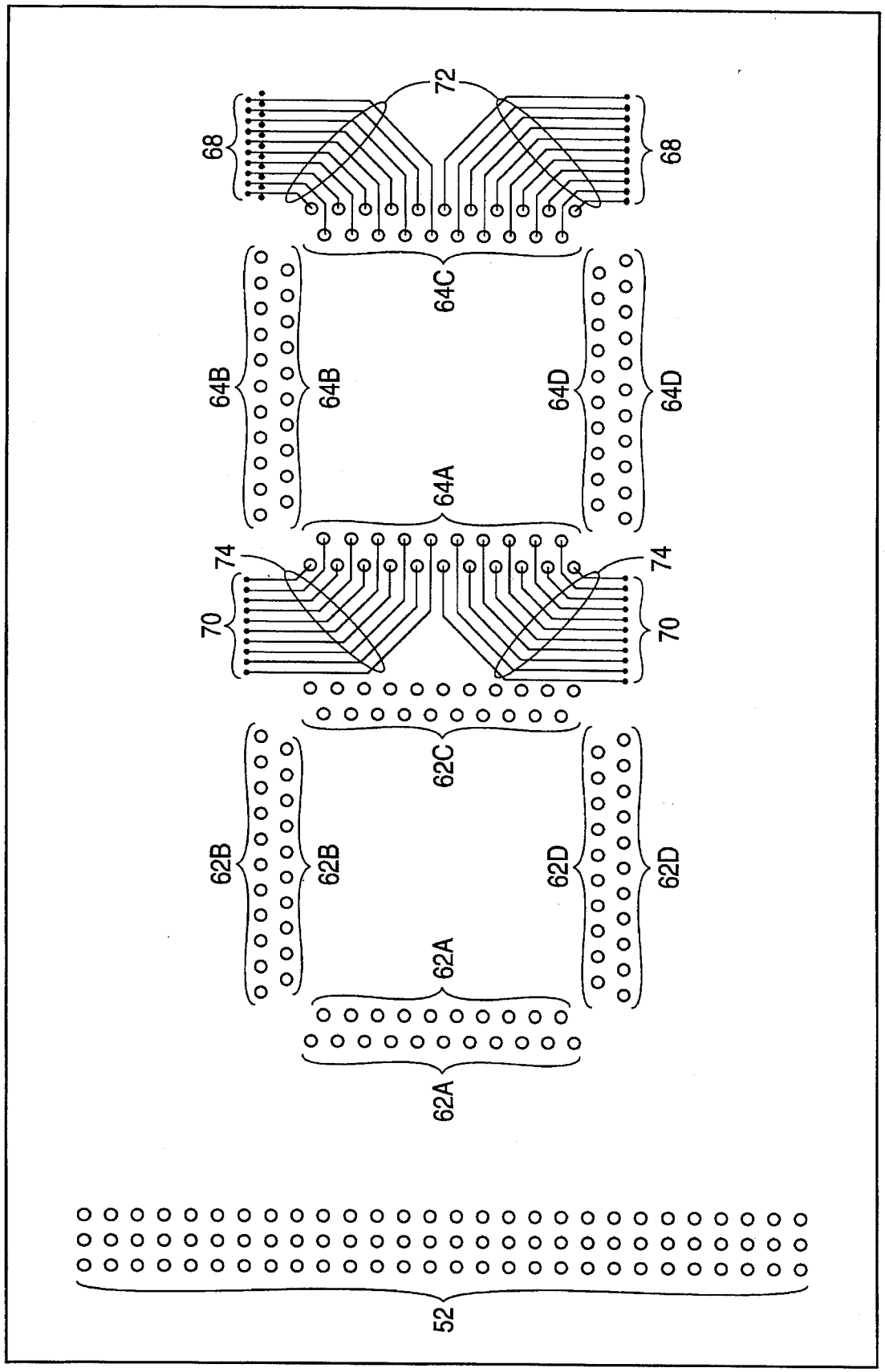

FIG. 5A illustrates matrices of antifuses manufactured in a printed circuit board in accordance with this invention. FIGS. 5B–5D illustrate traces and via holes in each layer of PCB 50 of FIG. 5A. As shown in FIG. 5A, a printed circuit board 50 includes a substrate 51 of electrically insulating material (such as, for example, epoxy resin, polyimide, parylene, conductor/polymer composite, alumina, magnesium oxide, zirconium oxide and can include a fiberglass matrix for mechanical strength) on which are formed programming via holes 52, sets of metal traces 54, 56 and 58, orthogonal sets of metal traces 60, 61 and 63 and socket via holes 62A–62D and 64A–64D to receive the terminals of an electronic component.

Antifuses 69 are formed in PCB 50 at each point at which a metal trace (also known as electrode trace) such as for example, trace $Y_1Y_1'$ of traces 54, crosses over another metal trace such as, for example, trace $X_1X_1'$ of traces 60. In FIG. 5A all of the antifuses 69 are not labeled for clarity. Linking via holes 70 (see FIGS. 5A–5D) are also formed in PCB 50 to connect metal traces 54 to other traces in various layers. Many metal traces and other features are not shown in FIG. 5A to simplify the drawing.

As shown in FIG. 5B, metal traces 60, 61 and 63 are formed as part of an inner upper electrode layer. As shown in FIG. 5C, metal traces 54, 56 and 58 are formed as part of an inner lower electrode layer. Any metal traces that cannot be accommodated on either the upper electrode layer or the lower electrode layer are formed as part of another layer (such as, for example, a bottom layer) and connected to the appropriate layer by linking via holes. FIG. 5D shows a bottom electrode layer in which are formed metal traces 72 and 74 that are connected by linking via holes 70 to metal traces 54 and 58 in the lower electrode layer of FIG. 5C.

Antifuses 69 of FIG. 5A are formed by providing antifuse dielectric materials between an upper electrode trace and a lower electrode trace. Antifuse materials for use in accordance with this invention include, but are not limited to, metal oxides. A metal oxide layer can be created either by chemical reaction of oxygen with metals or by physical deposition of metal oxide on top of metal traces on the printed circuit board, MCM or package substrate. Antifuse materials also include polymer materials such as for example, epoxy resin and polyimide. Polymer materials can be deposited using techniques such as for example, screen print, dry film and spin on.

FIG. 6 is a process flow chart for forming an antifuse in a PCB, PWB, MCM or IC package in accordance with this invention. FIG. 7A illustrates cross-sections 50a–50g of a structure manufactured in accordance with the process of FIG. 6. Initially a PCB core 81 (see PCB cross-section 50a of FIG. 7A) is formed by well known PCB process steps. PCB core 81 can be any electrically insulating substrate material (such as for example, epoxy resin, polyimide, alumina, magnesium oxide, zirconium oxide and can include a fiber glass matrix for mechanical strength). Then at step a, (FIG. 6), a conductive electrode layer 82 is deposited on PCB core 81 and a mask is used to develop a pattern photo image (not shown) for forming lower electrodes (on the layer shown in FIG. 5C). Then, etch and strip steps are used to form lower electrodes traces 83 and 84. Next, an interfacial conductive layer 85 can be optionally formed to provide adhesion. Interfacial layer 85 is used to improve adhesion of the antifuse material to the PCB, PWB, MCB or IC package materials and can be formed of, for example, copper and/or nickel.

Then a dielectric antifuse layer 86 is formed as shown in cross-section 50d of FIG. 7A. Then another interfacial conductive layer 87 is optionally formed to provide adhesion. Then conductive material is deposited and etched to form upper electrode 88. In this manner as shown in cross-section 50f, antifuses 86-1 and 86-2 are formed. After a dielectric layer 89 (see cross-section 50g of FIG. 6) is formed, the above described steps can be repeated as necessary to produce additional layers of antifuses (such as, for example, 86A-1 and 86A-2) and electrodes (such as, for example, 83A and 84A). A composite can be used to form an anitfuse dielectric 86A as described below in reference to FIG. 7B. Next, any necessary via holes can be formed and plated and any necessary connections can be made for custom circuitry.

In one embodiment of this invention, the thickness of an antifuse 86-1 (FIG. 7A) is in the range of 0.1 µm to 1 mm. If an antifuse is too thin, the antifuse cannot sustain the mechanical flexibility of a printed circuit board. If an antifuse is too thick, it takes a very long time to program. Also, if the antifuse is too thick, higher programming voltages are required which result in isolation problems. Therefore an increase in antifuse thickness increases the complexity of antifuse programming methodology. However, one advantage of a thick antifuse is that the antifuse has low capacitance with the resultant lower RC effects. Other advantages of a thick antifuse include ease of fabrication and better flexibility, as noted above.

A potential problem in making an antifuse having a relatively thick dielectric layer is forming a reliable conductive channel through the dielectric layer during programming of the antifuse. In conventional antifuses used in silicon ICs, electrode materials are melted and transported into a very thin (less than 0.1 µm) dielectric layer to form a conducting path or alternatively the dielectric material is converted to a conductive state, such as amorphous silicon. Breakdown in organic polymers can frequently produce conductive paths formed of relatively unstable carbon filaments. Melting and transporting electrode materials into relatively thick (1 µm to 10 µm) polymer films can be difficult if electrode materials have a higher melting temperature than polymers.

Conductive channel forming material, such as conductive particles 90A, 90B and 90C, can be dispersed throughout the body of an antifuse dielectric layer 86A (FIG. 7B), which body can be a polymer in one embodiment, to form a composite layer. The proportion of conductive particles in such a conductor/polymer composite layer can be increased up to a critical level (also referred to as "critical volume") while maintaining a high electrical resistivity, as described below.

Up to the critical level, the conductive particles remain physically separated from each other by the polymer. A slight increase in the volume fraction of the conductive particles causes a sharp drop in resistivity of the composite, as conductive particles contact each other and form conductive paths through the polymer. The resistivity of a composite can change by 10 orders of magnitude for a small increase in the fraction of conductive particles as shown, for example, in FIG. 1 of "Critical Volume Fractions in Conductive Composites" by G. R. Ruschan and R. G. Newnham, Journal of Composite Materials, Vol. 26, No. 18, 1992, that is incorporated herein in its entirety.

A composite filled to the critical level where the conductive particles are almost in contact can, nonetheless, have a very high resistance. In one example of such a composite, conductive particles formed of for example solder (melting temperature 150° C. to 200° C.) can be embedded in a polymer (melting temperature 300° C. to 400° C.), although electrode traces are formed of copper (melting temperature 1083° C.). A layer of such a composite can be used, instead of a dielectric layer as described above, to form an antifuse in accordance with this invention.

In one embodiment, a composite is formed of a polyimide or an epoxy as the polymer body and one or more type of conductive particles such as particles of nickel, silver and copper that form a volume fraction of 10–20 percent of the total composite volume.

Figure 7C:
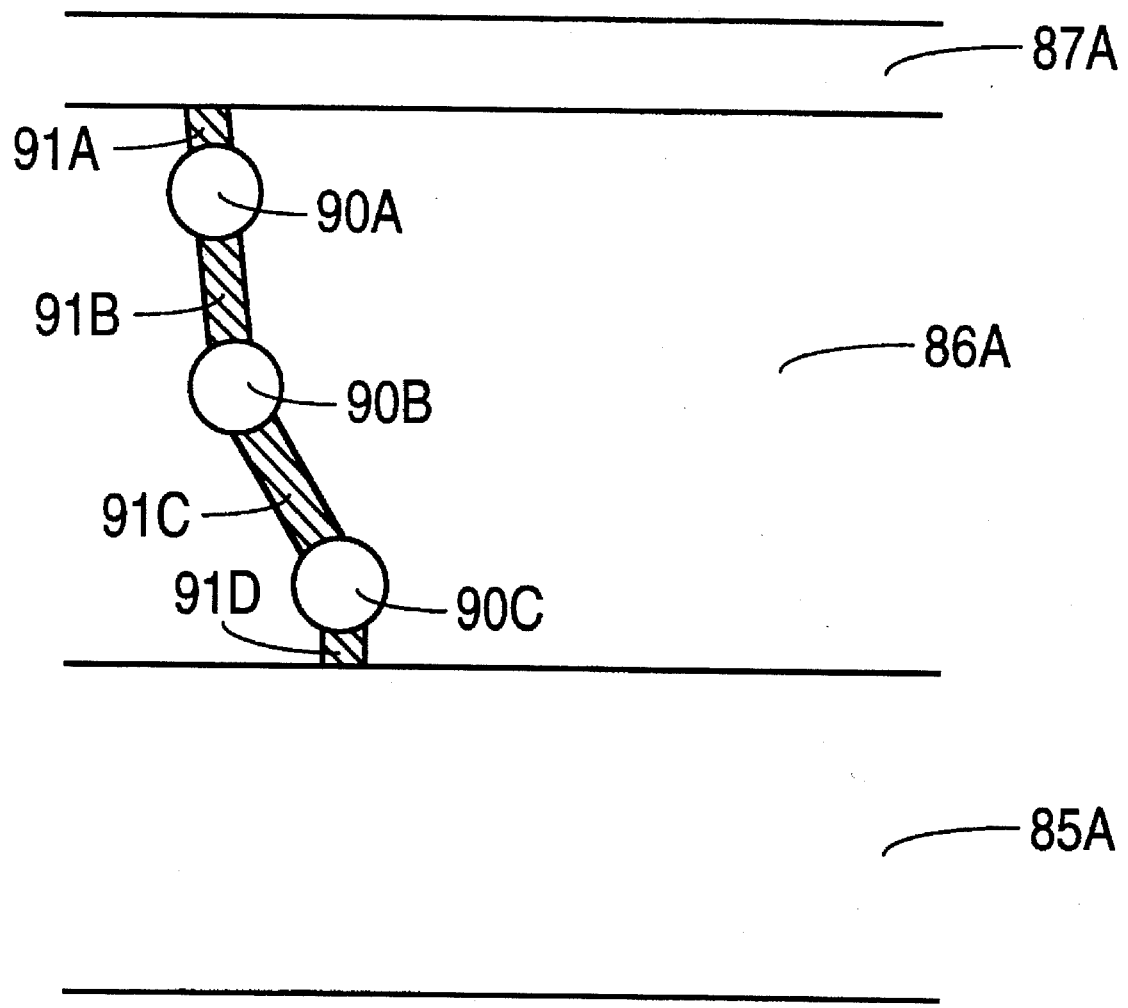
FIG. 7C illustrates the formation of a conductive link through the antifuse dielectric of FIG. 7B.

If a voltage is applied sufficient to cause a breakdown of the polymer body separating the conductive particles in a composite, a conductive path can be formed between the two electrodes of an antifuse, with minimal transportation of electrode material into the dielectric. For example, FIG. 7C illustrates a path formed by links 91A, 91B, 91C and 91D between conductive particles 90A, 90B, 90C, and the two electrodes of antifuse 86A-1. A link between two conductive particles can be formed due to fusion of the two conductive particles in the region where the dielectric between the particles breaks down.

If conductive particles in a composite layer have a lower melting temperature than the antifuse electrodes' melting temperature, deformation of the electrodes can be avoided. So conductive particles for an antifuse composite layer can be formed of low melting temperature materials, even if such materials are unsuitable for forming electrodes or interconnection traces of high melting temperature.

A composite layer, as described above, can be formed as a polymer sheet for use in a manner similar to the use of prepreg or dry photoresist layers and so laminated into PCBs, PWBs, MCMs and IC package multilayered structures. When laminated between two conductive layers, such a polymer sheet replaces the dielectric layer to form an antifuse. Alternatively the composite layer can be applied in the form of an ink or a paste and so used in the PCB, PWB, MCM and IC package multi-layered structures.

Use of conductive particles dispersed throughout an antifuse composite layer avoids the need to make the dielectric layer very thin and sandwiched between two conducting layers (also referred to as "electrodes"). Instead, the antifuse composite layer can be formed on a single level of a PCB, PWB, MCM or IC package in the same manner that a resistor or fuse is formed. Moreover, an antifuse using a composite layer as described above is compatible with PCB, PWB, MCM and IC package process technology, because such an antifuse can be made of conventional materials such as polymers and metal particles and formed by techniques such as screen printing.

In another embodiment of this invention, channel forming material for an antifuse is incorporated chemically into a polymer (not shown), rather than physically into a composite (FIG. 7B). Polymers containing a variety of metals, such as lead, tin, indium, zirconium and titanium can be used as precursors in the preparation of antifuse dielectric thin films on for example, ceramics substrates. Other metal containing polymers can also be used. Metallo-organic polymers can be used, for example, by plasma deposition. When a non metal containing polymer is electrically broken down with an applied field, conductive paths of carbon filaments are formed. Therefore, by using metallo-organic polymers to replace a dielectric layer, metals can be incorporated into a polymer layer between two electrodes to form an antifuse in accordance with this invention.

In yet another embodiment of this invention, composites formed of conductive particles and metallo-organic polymers are used to replace an antifuse dielectric layer. In this embodiment, the conductive channels are formed of materials from both the conductive particles and the metallo-organic polymers. This embodiment permits intimate mixing of materials so as to assist, for example, in uniform and/or rapid formation of alloys in the conductive channels.

In one embodiment of this invention, the antifuse area is kept as small as permitted by the line width of the upper and lower electrode traces.

An antifuse can be programmed by applying a voltage pulse using a voltage source of between 10V to 1000V. In one embodiment, an antifuse of polymer of 2 μm thickness is programmed by a voltage pulse of 1000 volts.

Given the thickness in the range of 0.1 μm to 1 mm, the breakdown field of the antifuse is between 0.01MV/cm to 1MV/cm (which is different from the 10MV/cm typical for the semiconductor antifuses such as, for example, silicon oxide). Materials that satisfy these requirements for antifuses include but are not limited to polymers (e.g. epoxy resin, polyimide parylene), polymers with conductive metal particle fillers (such as solder or copper balls inside a resin) and metal oxide (for example, aluminum oxide, magnesium oxide, or zirconium oxide).

An antifuse at the intersection of conductive trace $Y_1Y_1'$ (see FIG. 5A), and orthogonal conductive trace $X_1X_1'$ is programmed by a voltage $V_x$ applied at $X_1$ and a voltage— $V_y$ applied at $Y_1$. As a result of these voltages, only the antifuse element at the intersection of $Y_1Y_1'$ and $X_1X_1'$ receives the full programming voltage of $V_x+V_y$ and breaks down to form an interconnection therebetween with sufficiently low resistance (for example, resistance in the range of 1 milli-ohm to 100 ohms). A good interconnection can be accomplished by optimizing the programming voltage, current, time, antifuse material and electrode material.

Once the dielectric is ruptured, the resistance of the conductive state is determined by the size (i.e. the cross-sectional area and the length) of the conductive conduit (link). The size of the conductive link is determined by the amount of power dissipated in the link which melts the dielectric.

The antifuse matrix described above has several advantages. The antifuse matrix solves the speed and cost problems faced by previous attempts at field programmable PCB, PWB, MCM and IC packages. By eliminating the use of one or more silicon programmable chips or a silicon programmable substrate made using semiconductor technologies, the cost of the PCB, PWB, MCM or IC package is reduced substantially. In addition, the present approach can be adapted anywhere electrically conductive traces are patterned.

Another advantage of this invention is that because the antifuses can be built into inner layers of a multi-layered structure, the top surface is available for mounting electronic components and related custom traces. Another advantage is that no wires need to be connected to make any of the connections of an antifuse matrix. Therefore customizing a programmable structure of fuses and/or antifuses in accordance with this invention does not require a manufacturing facility at the customer site.

An antifuse is designed to be blown (i.e. to form a conductive link connecting the two electrodes of the antifuse) if necessary. Blown antifuses form an essential but normal part of a predetermined including using a user programmed antifuse matrix. One or more antifuses in a programmed antifuse matrix are blown antifuses. So an antifuse differs from a conventional capacitor buried inside an inner layer of a PCB, PWB, MCM and IC package because such a capacitor is designed to be operated as an intact capacitor, without any programming.

The above described method for antifuse fabrication has the advantage of compatibility with the PCB, PWB, MCM or IC package process steps which enables faster speed for product development and better placement and routing architecture for the programmable PCB, PWB, MCM, or IC package.

Although substrate 31 of FIG. 4 and substrate 81 of FIG. 7A have been described above as a PCB core, any appropriate electrically insulating substrate material can be used as substrate 31 or substrate 81 in accordance with this invention. For example, an electrically insulating substrate material can be used to build a programmable PCMCIA logic card or PCMCIA memory card (see PCMCIA I/O Card Interface Specification available from Personal Computer Memory Card International Association of 10308 East Duane Avenue, Sunnyvale, Calif. 94086 which is incorporated herein by reference). Also, an electrically insulating substrate material can be used to build smart cards, credit cards, cards used in automatic teller machines (ATMs), programmable cable connectors and programmable sockets all in accordance with this invention.

While the above description of fuses and antifuses for programmable logic structures is applicable in general to printed circuit boards, multichip modules and integrated circuit packages, this invention can be easily used to form various devices, such as, for example, a programmable cable, a programmable cable connector, a programmable socket and a programmable burn-in board.

Figure 8:
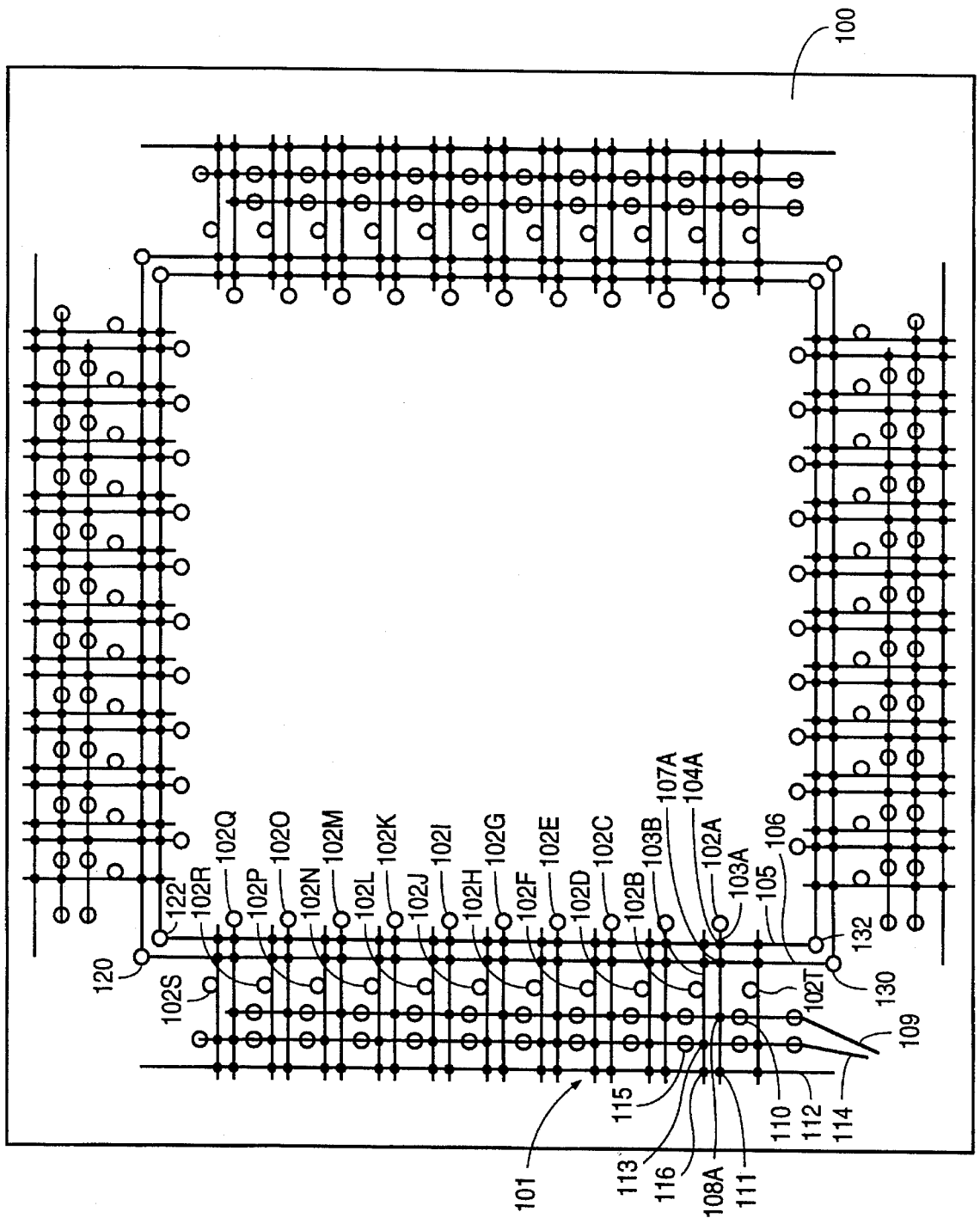
FIG. 8 illustrates an antifuse architecture for a programmable burn-in board in accordance with one embodiment of this invention.

FIG. 8 illustrates an antifuse matrix 101 for a programmable burn-in board 100 included in one embodiment of this invention. Burn-in board 100 can be used to burn-in i.e. exercise and stress electronic components in a burn-in oven at elevated temperatures. Burn-in accelerates infant mortality so that defective electronic components are discarded based on the results of subsequent testing. So burn-in ensures reliability of an electronic component during normal operation as part of a predetermined circuit.

As shown in FIG. 8, a burn-in board 100 is provided with socket via holes such as, for example, via holes 102A–102T on the left side of board 100 for receiving the terminals of an electronic component. For the sake of clarity, all the parts of board 100 in FIG. 8 are not labeled. Each socket via hole in FIG. 8 is connectable through antifuses to a source of any one of three signals: Vcc, Ground, Clock signal and/or to a resistor pack. In one embodiment, a resistor pack includes a number of resistor packaged into a single package. In another embodiment, a resistor pack includes a number of discrete resistor that can be individually mounted on a printed circuit board.

For example, as shown in FIG. 8, socket via hole 102A is connected by metal trace 103A through antifuse 104A to metal trace 105. Trace 105 is connected by via holes 122 and 132 to Ground. Also, via hole 102A is connected by trace 103A through antifuse 107A to trace 106. Trace 106 is connected by via holes 120 and 130 to Vcc. Via hole 102A is connected by trace 103A through antifuse 108A to via hole 110 which is connected by trace 109 to a resistor pack (not shown). Finally, via hole 102A is connected through antifuse 111 to trace 112 which in turn is connectable to the source of a Clock signal. Socket via hole 102B is connected in a manner similar to via hole 102A except that via hole 102B is connected to a different resistor pack by trace 114.

Although antifuses are shown in FIG. 8, fuses can be used in addition or as alternatives to antifuses to form a programmable burn-in board in accordance with this invention.

For a burn-in board, the operating temperature requirement of about 150° C. is more stringent than typical for a printed circuit board (100° to 125° C.). Therefore the antifuse or fuse materials as well as burn-in board substrates must survive at these severe operating temperatures. In accordance with this invention, antifuse dielectric materials for a programmable burn-in board include but are not limited to, high temperature epoxy resins, polyimide, conductor/polymer composites and metal oxides. By properly choosing fuse and antifuse materials, a programmable burn-in board can be made at very low additional cost as compared to a typical burn-in board.

Figure 9A:
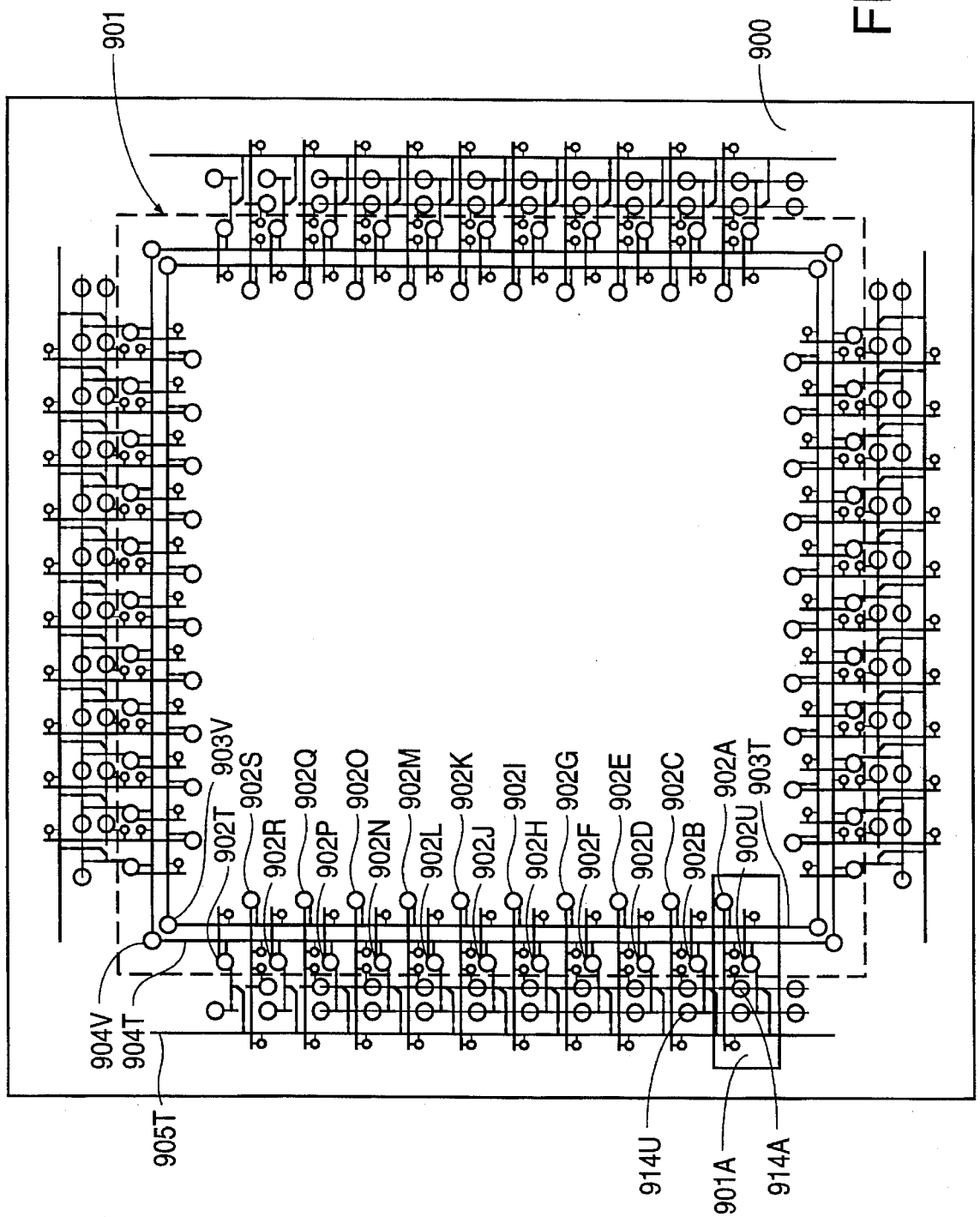
FIG. 9A illustrates a fuse architecture for a programmable burn-in board in accordance with one embodiment of this invention.

FIG. 9A illustrates a fuse matrix 901 for a programmable burn-in board 900 included in one embodiment of this invention. Fuse matrix 901 is a composite view of all layers of burn-in board 900 superimposed on each other, with insulating layers being transparent. Fuse matrix 901 can have a structure and be formed by a process similar to the structure and process for a fuse matrix described above, such as the description in reference to FIGS. 1 to 4, and FIGS. 17A to 17J.

Burn-in board 900 has a number of component contacts, such as for example, via holes 902A to 902U, for receiving the terminals of an electronic component. For the sake of clarity, all the parts of FIG. 9A are not labeled. Each of via holes 902A to 902U is connected by trace 903T and linking via hole 903V to a Ground terminal, by trace 904T and linking via hole 904V to a Vcc terminal, and by trace 905T to a source of a clock signal. Each via hole is also connected to one of two resistor packs. For example, linking via hole 914A connects via hole 902A to a first resistor pack and linking via hole 914U connects via hole 902U to a second resistor pack.

Figure 9B:
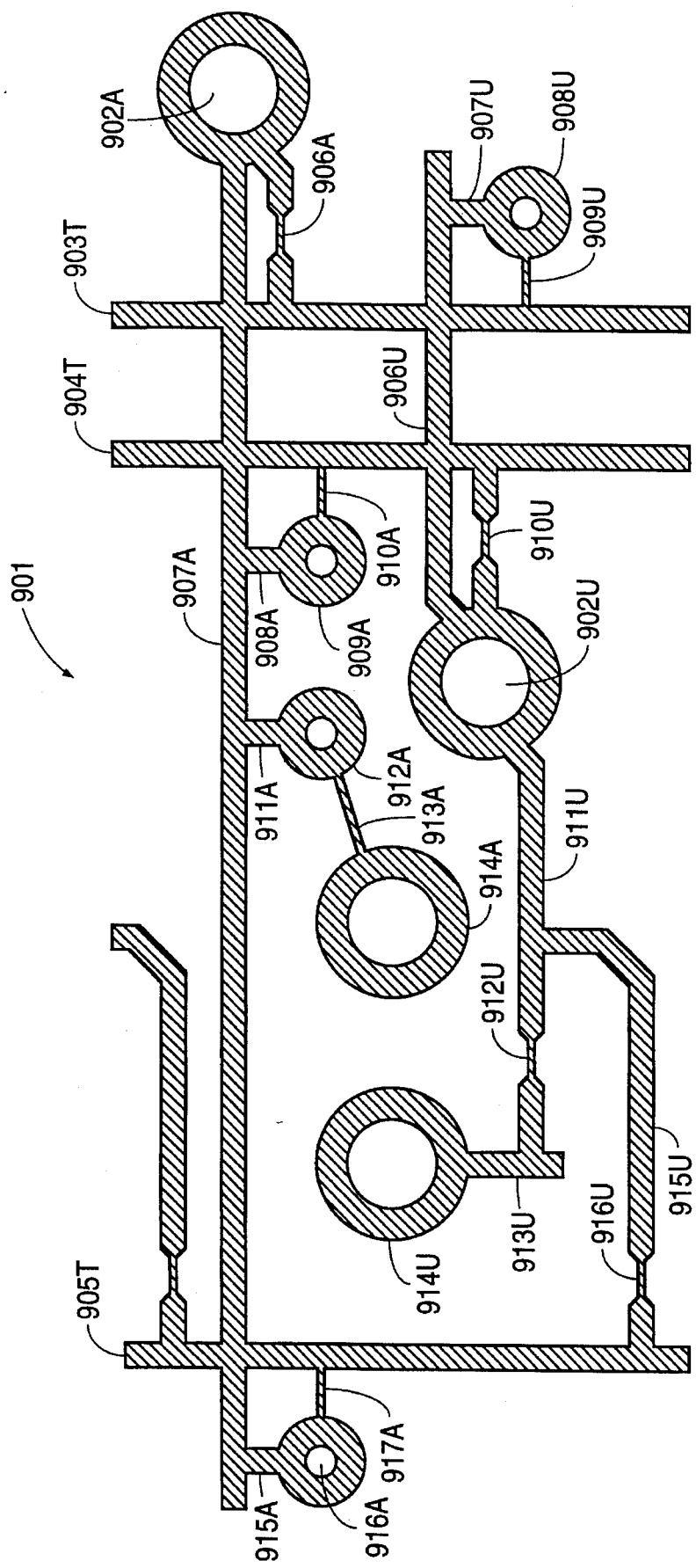
FIG. 9B is an enlarged view of a portion of the fuse architecture illustrated in FIG. 9A.

FIG. 9B is an enlarged view of the rectangular portion 901A of fuse matrix 901 of FIG. 9A. Via hole 902A is connected by fuse 906A through trace 903T to the Ground terminal (not shown). Both fuse 906A and trace 903T are formed as part of a first layer (not shown) of burn-in board 900. Also, via hole 902A is connected by trace 907A through trace 908A to linking via hole 909A. Both traces 907A and 908A are formed as part of a second layer (not shown). Via hole 909A is connected by fuse 910A through trace 904T to the source of Vcc signal. Both fuses 910A and trace 904T are formed as part of the first layer of board 900.

Via hole 902A is connected to a resistor pack and to a source of a Clock signal. Via hole 902A is connected by trace 907A through trace 911A to linking via hole 912A. Both traces 907A and 911A are formed as part of the second layer of board 900. Linking via hole 912A is connected by fuse 913A through linking via hole 914A to a resistor pack (not shown). Fuse 913A is formed as part of the first layer of board 900. Via hole 902A is also connected by trace 907A through trace 915A to linking via hole 916A. Both traces 907A and 915A are formed as part of the second layer of board 900. Linking via hole 916A is connected by fuse 917A through trace 905T to a source of a Clock signal (not shown). Both fuse 917A and trace 905T are formed on the first layer. In this manner, via hole 902A is connected to the sources of Ground, Vcc, a Clock signal and to a resistor pack through fuses 906A, 910A, 913A and 917A respectively.

Via hole 902U is connected to a Ground terminal and to a source of Vcc. Via hole 902U is connected by trace 906U through trace 907U to linking via hole 908U. Both traces 906U and 907U are formed as part of the second layer of board 900. Linking via hole 908U is connected by fuse 909U to trace 903T which is connected to a terminal Ground. Fuse 909U and trace 903T are formed as part of the first layer of board 900. Via hole 902U is also connected by fuse 910U through trace 904T to a source of Vcc. Both fuse 910U and trace 904T are also formed as part of the first layer of board 900.

Via hole 902U is connected to a resistor pack and to a source of a Clock signal. Via hole 902U is connected by trace 911U through fuse 912U to trace 913U which is connected by linking via hole 914U to a second resistor pack (not shown). Trace 911U, fuse 912U and trace 913U are formed as part of the first layer of board 900. Via hole 902U is also connected by trace 911U through trace 915U to fuse 916U. Trace 915U and fuse 916U are also formed as part of the first layer of board 100. Fuse 916U is connected by trace 905T to a source of the clock signal (not shown). Trace 905T is also formed on the first insulating layer of board 100.

In this manner, via hole 902U is connected through fuses 912U, 909U, 910U, and 916U to a second resistor pack and to sources of ground, Vcc, a and Clock signal. Therefore, a customer can customize burn-in board 900 to test an electronic component in any desired manner by blowing three of the four fuses that are coupled to each of the component contacts, such as for example, via holes 902A and 902U (FIG. 9A) as described above.

As the operating temperature requirement of 150° C. for a burn-in board is more stringent than typical for a printed circuit board (100°–125° C.), fuse materials for a programmable burn-in board include but are not limited to Ni/P. Depending on the needs of a particular application, one of the various fuse dimensions and geometries described above can be chosen to provide the desired fuse blowing characteristics for a burn-in board.

A burn-in board, such as burn-in board 100 or 900 has several advantages. Burn-in boards 100 and 900 are less expensive than conventional burn-in boards due to elimination of silicon chips that were necessary in the prior art to provide electrically programmable elements.

Figure 10A:
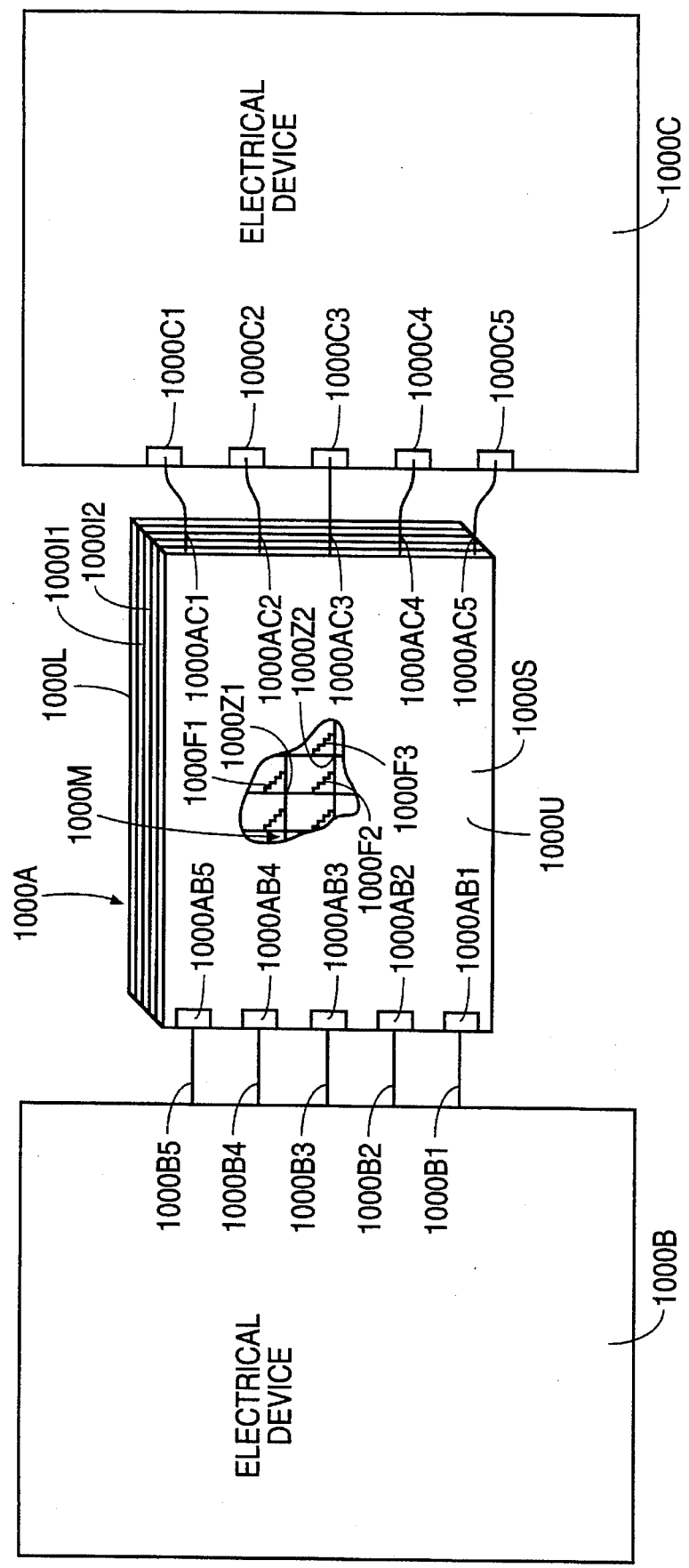
FIG. 10A illustrates a reconfiguration device that uses a multi-layered structure of programmable elements in accordance with this invention.

A multi-layered structure containing a matrix of fuses can also be used in a reconfiguration device 1000A included in one embodiment illustrated in FIG. 10A to couple a first electrical device 1000B to a second electrical device 1000C. Reconfiguration device 1000A can be included in several embodiments, such as a socket adapter (FIG. 10B), a programmable socket (FIG. 11A), a cable adapter (FIGS. 12A and 12B) and a programmable cable (FIG. 13A) as described below.

Reconfiguration device 1000A includes a number of first electrical contacts, such as electrical contacts 1000AB1 to 1000AB5, that are arranged in a first configuration suitable for coupling to terminals, such as terminals 1000B1 to 1000B5 of first electrical device 1000B. Reconfiguration device 1000B also includes a number of second electrical contacts, such as electrical contacts 1000AC1 to 1000AC5 that are arranged in a second configuration suitable for coupling to terminals, such as terminals 1000C1 to 1000C5 of second electrical device 1000C.

Figure 10B:
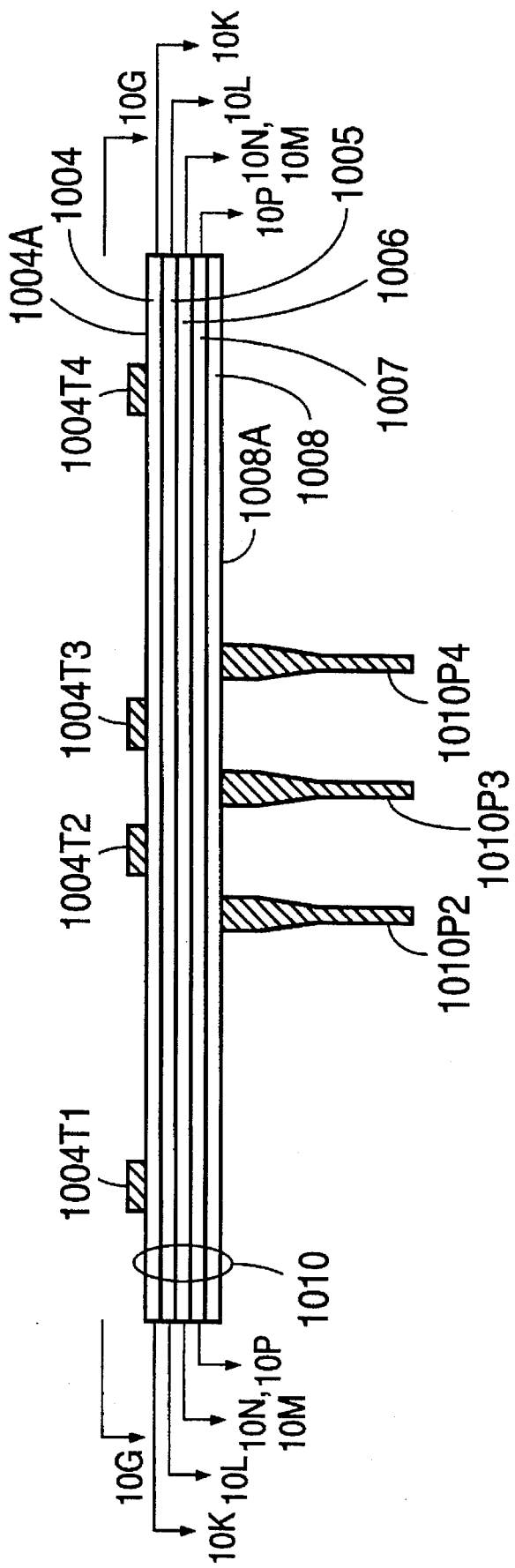
FIG. 10B illustrates a reconfiguration device comprising a socket adapter for coupling a packaged integrated circuit to an integrated circuit socket in accordance with this invention.

In accordance with this invention, the configuration of a plurality of electrical contacts can be of at least two types: spatial configuration and pin-out configuration. Spatial configuration (examples of which are illustrated in FIGS. 10D and 10E) is defined by the geometrical arrangement of and the distances between the electrical contacts. Pin-out configuration is defined by the one-to-one correspondence or mapping between the electrical contacts and the terminals of an electrical device to which the electrical contacts are to be coupled.

Moreover, electrical contacts, such as electrical contacts 1000AB1 to 1000AB5 can be of at least two types: male and female. Male electrical contacts are electrical contacts suitable for coupling to female electrical contacts and vice versa. For example, female electrical contacts can be mounting pads suitable to receive surface mount leads of a packaged integrated circuit. As another example, male electrical contacts can be pins suitable for insertion into plated holes of a cable connector.

In addition to electrical contacts, reconfiguration device 1000A also includes a multilayered structure 1000S, such as a PCB, PWB, MCM or IC package of the type described above, for example, in reference to FIGS. 2A and 2B. Multi-layered structure 1000S contains a matrix 1000M (see break-away view of FIG. 10A) of fuses and/or antifuses, (such as fuses 1000F1 and 1000F2 and antifuses 100021 and 100022). Matrix 1000M interconnects first electrical contacts 1000AB1 to 1000AB5 to second electrical contacts 1000AC1 to 1000AC5 respectively. Matrix 1000M can be any matrix of fuses and/or antifuses of the type described above.

In this embodiment (FIG. 10A), matrix 1000M is formed as part of a plurality of electrically conducting layers, separated from each other by insulating material, such as PCB core the conducting layers of matrix 1000M can be, for example first layer 100011 and second layer 100012, that are interposed between a first exposed surface, such as uppermost exposed surface 1000U and a second exposed surface, such as lower-most exposed surface 1000L of multilayered structure 1000S. Matrix 1000M includes a number of row traces formed on first layer 100011, and a number of column traces formed on second layer 100012. The row traces on first layer 100011 are coupled to first electrical contacts 1000AB1 to 1000AB5, for example, as shown in FIG. 12D. The column traces on second layer 100012 are coupled to second electrical contacts 1000AC1 to 1000AC5, through a number of traces and/or linking via holes, for example, as shown in FIGS. 12E and 12F.

In this embodiment, row traces on first layer 100011 are formed transverse to column traces on second layer 100012. The row traces are coupled to the column traces by fuses, similar to the fuses in matrix 2 (above). All fuses in reconfiguration device 1000A are formed on first inner layer 100011 in this embodiment.

In an alternative embodiment (FIG. 10A), row traces on first layer 100011 are separated from column traces on second layer 100012 by antifuse dielectric, to form a matrix similar to the matrix described above in reference to FIGS. 5A, 5B, 5C and 5D.

A customer can electrically program the fuses and/or antifuses of a matrix 1000M using a simple, inexpensive electrical programmer at the customer's location. For example a customer can preserve a fuse between any one of first electrical contacts 1000AB1 to 1000AB5 and any one of the second electrical contacts 1000AC1 to 1000AC5 and blow all other undesirable fuses using an electrical programmer to form any predetermined circuit desired by the customer, as described below in reference to FIGS. 15A to 15H.

The cost and size of reconfiguration device 1000A is considerably reduced by elimination of the use of programmable substrates fabricated by semiconductor technologies, as was necessary in the prior art, for example U.S. Pat. Nos. 4,609,241 and 5,144,567, to provide electrically programmable elements. The programmability of the fuses and/or antifuses in matrix 1000M greatly reduces the time-to-market and product life cycle of various embodiments of reconfiguration device 1000M, such as socket adapter 1010, component socket 1100, cable adapter 1200 and cable 1350 described below.

A compact and inexpensive reconfiguration device 1000A, when properly programmed in accordance with this invention, can couple each and everyone of a set of first electrical contacts to any corresponding one of a second set of second electrical contacts. A reconfiguration device 1000A avoids the high nonrecurring design and engineering costs associated with conventional fabrication of a small number of customized devices for different pin-out configurations, even when the devices have a common spatial configuration, because matrix 1000M can be easily programmed by a customer. Programming a generalized fuse matrix in a multi-layered structure of a reconfiguration device requires very little time, thereby avoiding the long lead time required, for example, for development and fabrication of customized sockets, customized socket adapters, customized cables, customized cable adapters and customized burn-in boards.

One embodiment of reconfiguration device 1000A is a socket adapter 1010 (FIG. 10B) for coupling an electronic component, such as packaged integrated circuit 1001 (FIG. 10C) to a component socket, such as pin-grid-array (PGA) socket 1002. PGA socket 1002 is mounted on printed circuit board 1003 in the conventional manner. Printed circuit board 1003 contains a circuit designed to operate with an electronic component different from packaged integrated circuit 1001. One specific embodiment of socket adapter 1010 is used to couple a first electronic component, such as 3.3V Intel 486 SX microprocessor, to a component socket is connected to an electrical device, such as a motherboard of a personal computer, that was originally designed for use with a second electronic component, such as a 5.0V Intel 486 DX microprocessor.

Figure 11A:
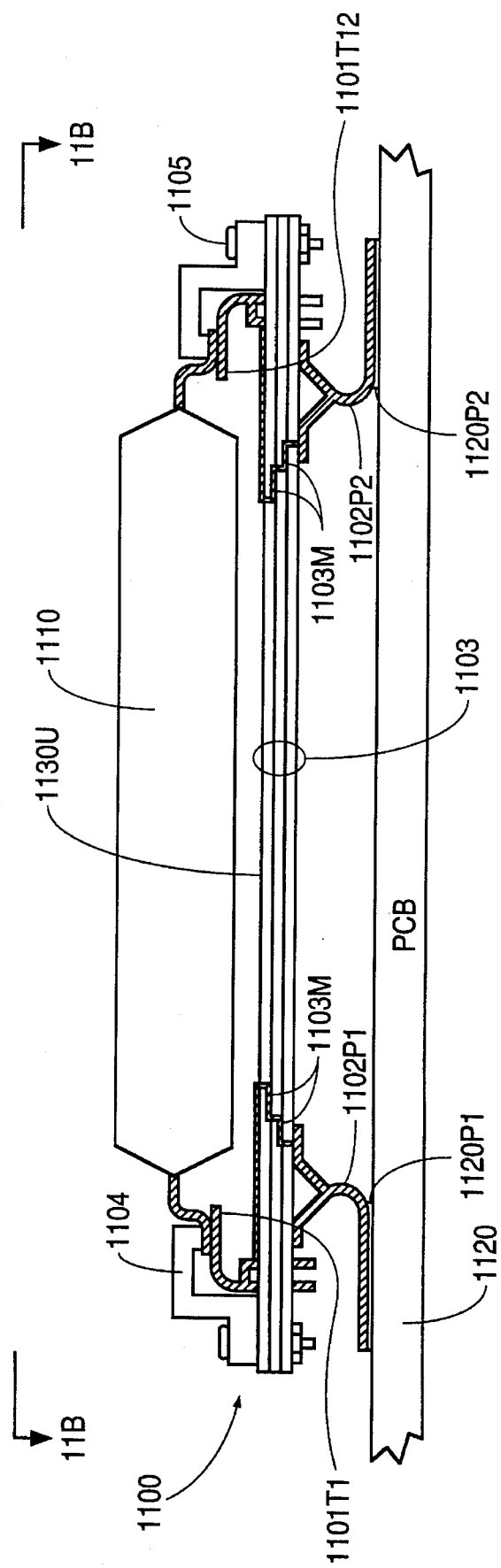
FIGS. 11A and 11B illustrate a reconfiguration device that comprises in this embodiment, a component socket for coupling a packaged integrated circuit to a printed circuit board.
Figure 11B:
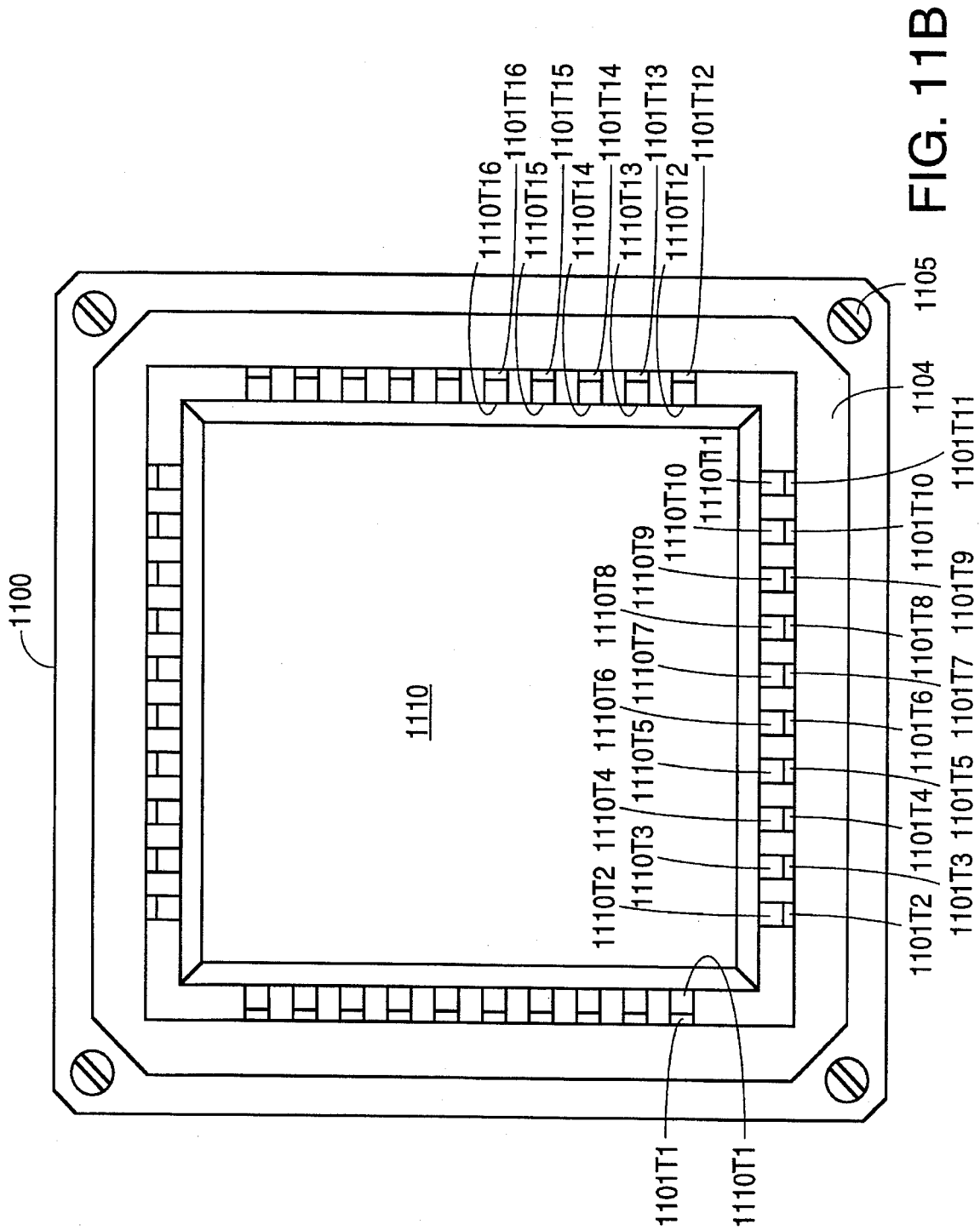

Although socket adapter 1010 is illustrated as having a number of planar layers, such as layers 1004 to 1008, socket adapter 1010 can be formed as an integral part of a programmable component socket, such as a PGA socket or a surface mount socket (FIGS. 11A and 11B).

Socket adapter 1010 (FIG. 10B) has an upper-most exposed surface 1004A and a lower-most exposed surface 1008A that are parallel and opposite to each other, and a number of layers, such as layers 1005 to 1008 that are interposed between upper-most exposed surface 1004A and lower-most exposed surface 1008A. In FIG. 10B, upper-most exposed surface 1004A includes a surface of conducting layer 1004 and a surface of insulating substrate 10004S that is not covered by layer 1004. Socket adapter 1010 has a thickness T1=0.1 inch in one embodiment.

Figure 10C:
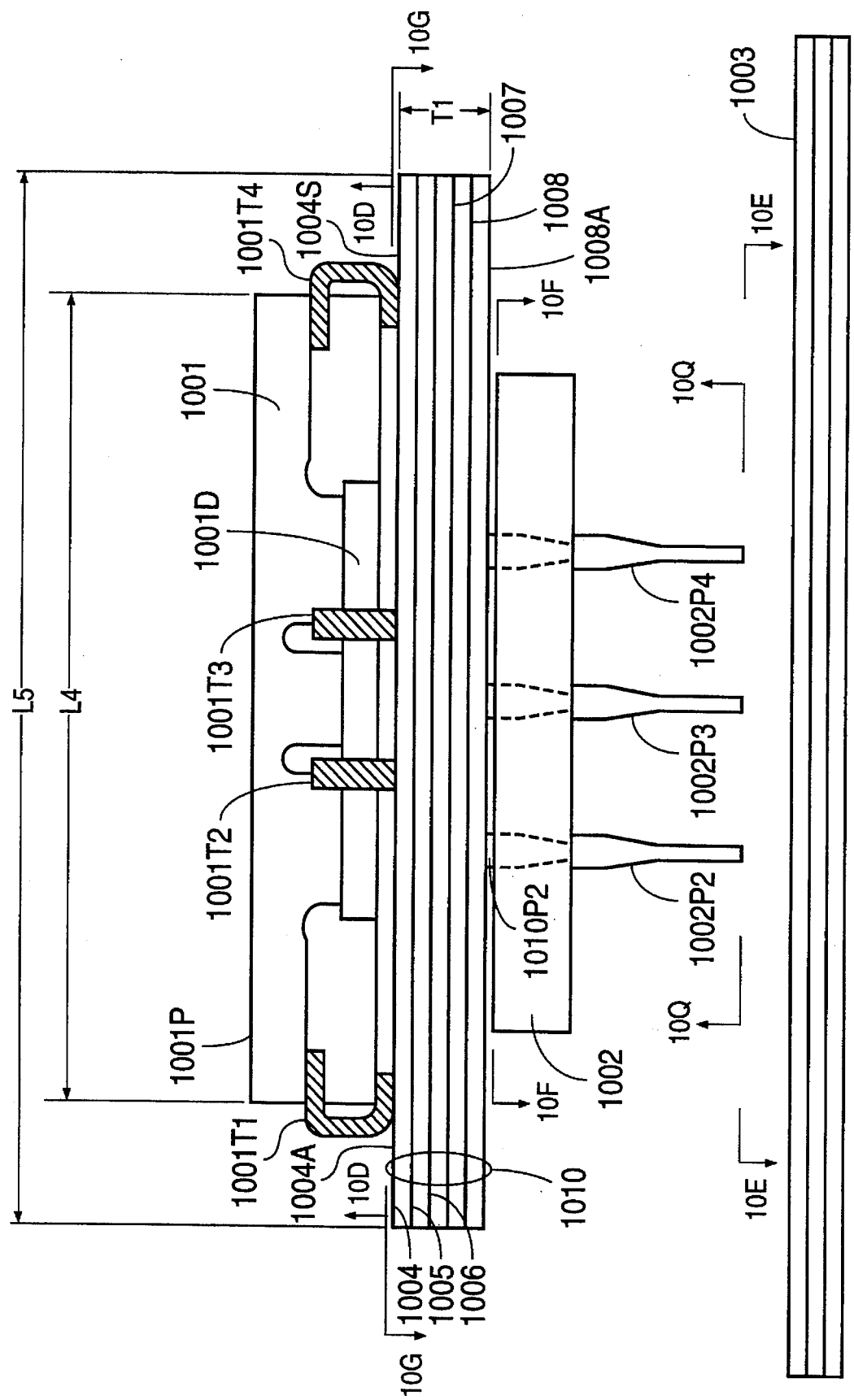
FIG. 10C illustrates the use of the socket adapter of FIG. 10B with a packaged integrated circuit, a component socket and a printed circuit board.
Figure 10D:
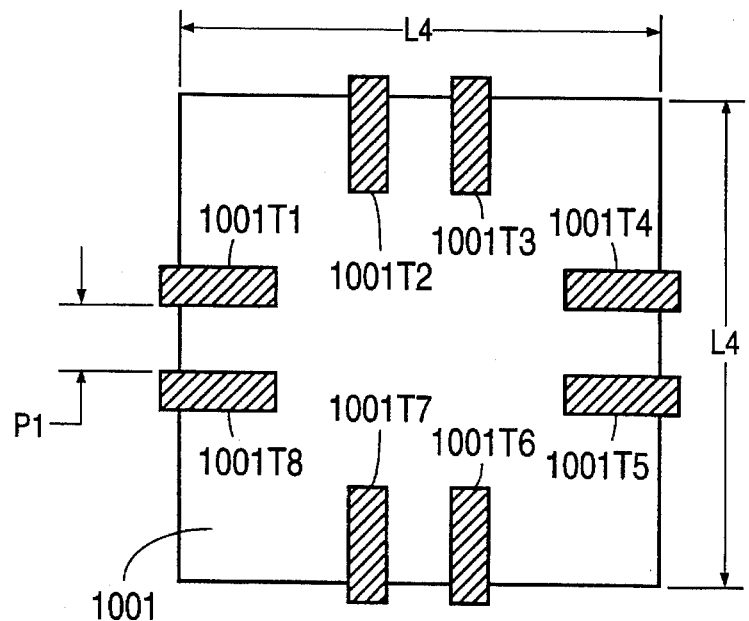
FIG. 10D is a bottom view of the electronic component of FIG. 10C, in the direction 10D—10D.
Figure 10E:
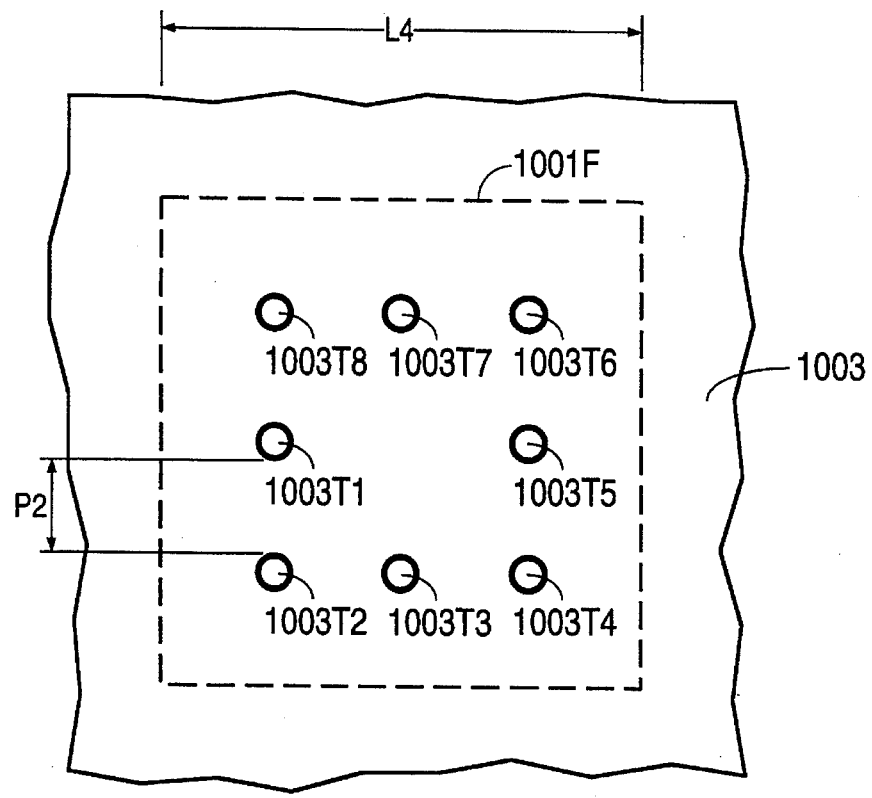
FIG. 10E is an illustration of the configuration of plated holes in the printed circuit board of FIG. 10C, in the direction 10E—10E.

Socket adapter 1010 has a number of component contacts suitable for supporting a packaged integrated circuit 1001 (FIG. 10C). Packaged integrated circuit 1001 includes a die 1001D mounted inside a plastic leaded chip carrier (PLCC) package 1001P. PLCC package 1001P has a number of terminals, such as surface mount leads 1001T1 to 1001T8 arranged in a spatial configuration of pairs, such as pairs (1001T1, 1001T8), (1001T2, 1001T3), (1001T4, 1001T5) and (1001T6, 1001T7) around the four ends of a "+" sign (FIG. 10D).

In the embodiment of FIG. 10D, each terminal in a pair is separated from another terminal in that pair by pitch P1, typically 0.050 inch (for PLCC package). Packaged integrated circuit 1001 is square with a side length L4 of typically 1.2 inch (for an 84 PLCC package).

In the specific embodiment illustrated in FIG. 10D, packaged integrated circuit 1001 includes a microprocessor inside die 1001D. Surface mount lead 1001T1 is a power input terminal for connection to a source of Vcc, surface mount lead 1001T2 is a clock input terminal for connection to a source of a Clock signal, surface mount leads 1001T3 and 1001T4 are address terminals, for connection to an address bus, surface mount leads 1001T4 to 1001T7 are data terminals for connection to a data bus, and surface mount lead 1001T8 is an interrupt terminal for connection to a peripheral.

Printed circuit board 1003 (FIG. 10E) has a number of component contacts, such as plated holes 1003T1 to 1003T8, each hole being equidistant from adjacent plated holes, arranged in a spatial configuration around the perimeter of a square (FIG. 10D). In the embodiment of FIG. 10E, each plated hole is separated from another plated hole by pitch P2, typically 0.1 inch.

In the specific embodiment illustrated in FIG. 10E, plated holes 1003T1 and 1003T2 are connected to address lines of a bus (not shown) driven by a memory bus controller (not shown) on printed circuit board 1003. Plated holes 1003T3, 1003T4 and 1003T5 are connected to data lines of the bus and are also driven by the memory bus controller. Plated hole 1003T6 is connected to an interrupt line in the bus. Plated hole 1003T7 is connected to a power supply circuit (not shown) on printed circuit board 1003. Plated hole 1003T8 is connected to a clock driver (not shown) on printed circuit board 1003.

Figure 10F:
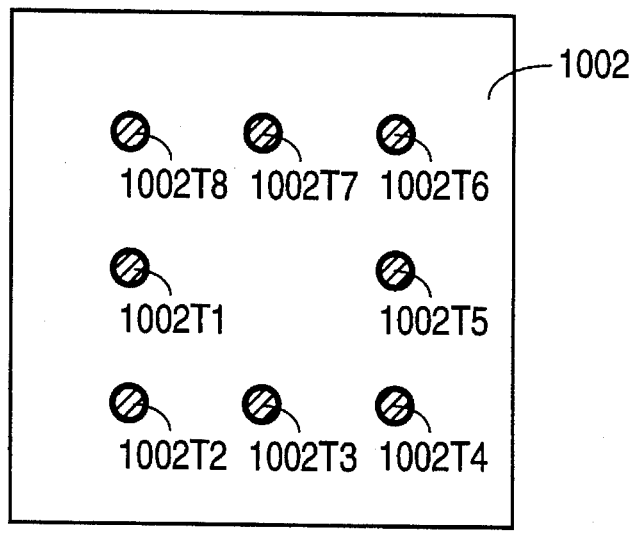
FIG. 10F is an illustration of a bottom view of the PGA socket of FIG. 10C, in the direction 10F—10F.
Figure 10G:
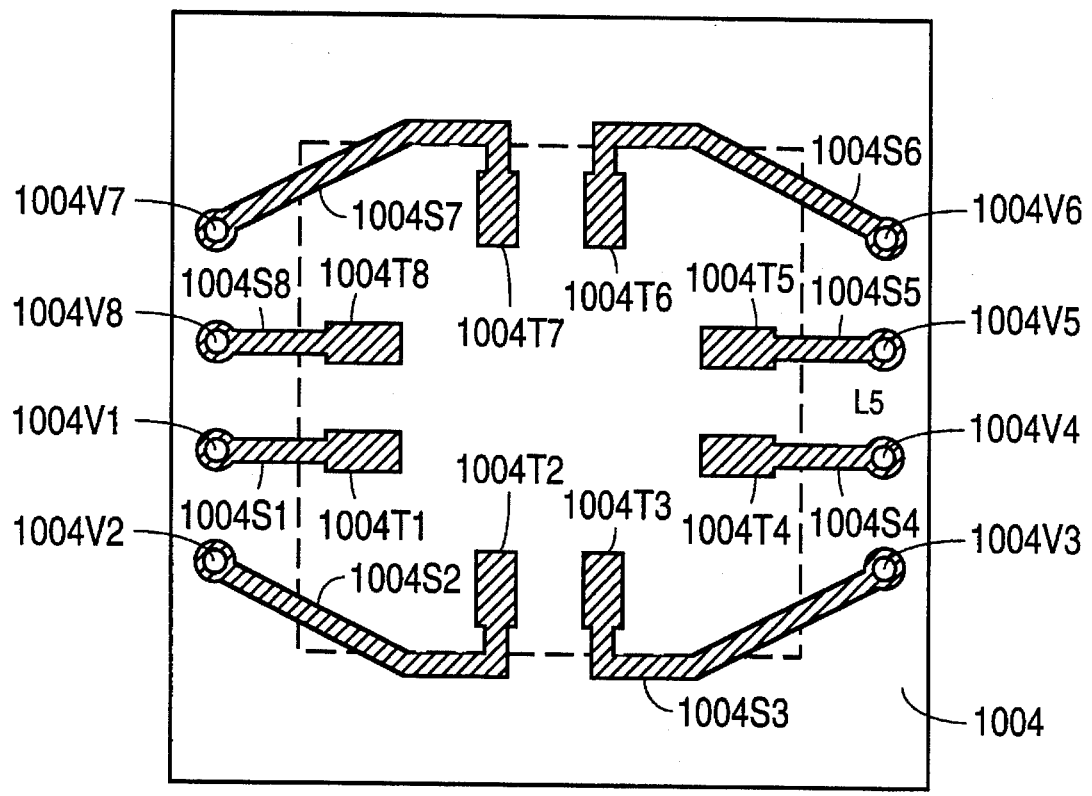
FIG. 10G illustrates the traces and via holes of the socket adapter of FIG. 10C, in the direction 10G—10G.
Figure 10H:
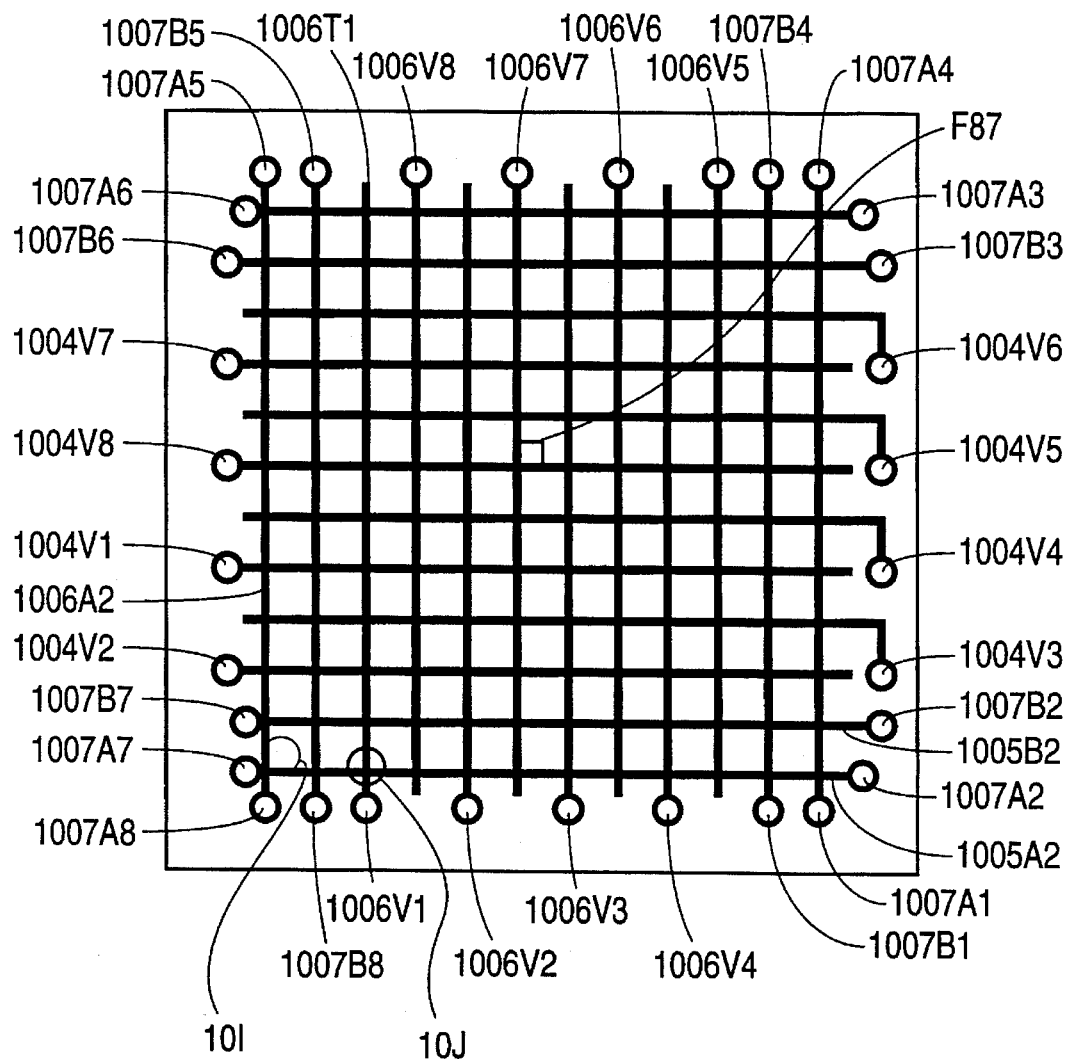
FIGS. 10H, 10I and 10J illustrate a matrix of fuses and/or antifuses for the socket adapter illustrated in FIG. 10B.
Figure 10I:
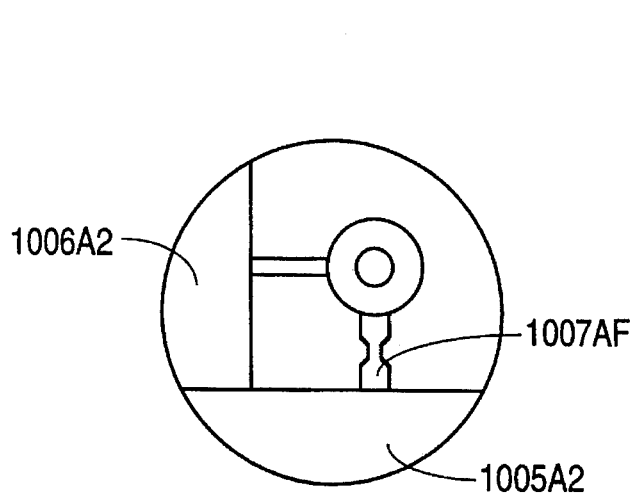
Figure 10J:
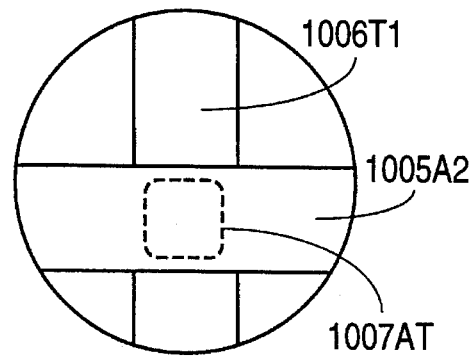
Figure 10K:
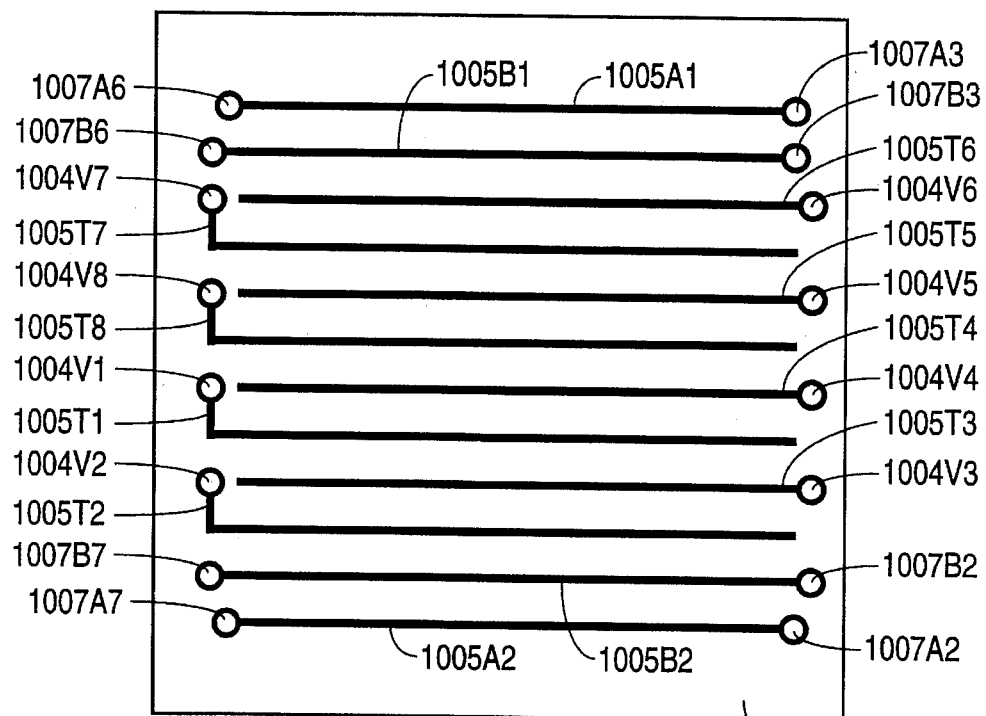
FIGS. 10K, 10L, 10M and 10N illustrate the traces and via holes on various layers of the socket adapter of FIG. 10B that form the matrix illustrated in FIG. 10H.

PGA socket 1002 (FIG. 10C) has a number of electrical contacts, such as pins 1002P2, 1002P3 and 1002P4 that are suitable for coupling to component contacts, such as plated holes 1003T2, 1003T3, and 1003T4 of printed circuit board 1003 (FIG. 10E). Pins 1002P1 to 1002P8 of PGA socket 1002 have the same spatial configuration (FIG. 10Q) as the spatial configuration of the plated holes of printed circuit board 1003 (FIG. 10E), for example, arranged around the perimeter of a square.

PGA socket 1002 also has a number of component contacts, such as plated holes 1002T1 to 1002T8, (FIG. 10F) that are formed in pins 1002P1 to 1002P8 for receiving terminals of an electronic component. Therefore, PGA socket 1002 does not provide any reconfiguration and instead, provides a direct one-to-one mapping of plated holes 1002T1 to 1002T8, to pins 1002P1 to 1002P8 respectively. Thus an electronic component having component contacts in a different spatial configuration, such as that described above in reference to FIG. 10D, cannot be coupled by component socket 1010 to printed circuit board 1003, without socket adapter 1010 (FIG. 10B).

Socket adapter 1010 has a number of component contacts, such as mounting pads 1004T1 to 1004T8, that are formed on upper-most exposed surface 1004A of inner layer 1004 (FIG. 10G) in a "+" sign spatial configuration, suitable for receiving surface mount leads 1001T1 to 1001T8 described above. Mounting pads 1004T1 to 1004T8 are connected by traces 1004S1 to 1004S8, and by linking via holes 1004V1 to 1004V8 respectively to a matrix 1020 (FIG. 10H) of fuses (FIG. 10I) and/or antifuses (FIG. 10J).

Matrix 1020 (FIG. 10H) is a composite of row traces 1005T1 to 1005T8 (FIG. 10J), formed as a part of layer 1005 and connected to linking via holes 1004V1 to 1004V8, and of column traces 1006T1 to 1006T8 (FIG. 10K), formed as part of layer 1006 and connected to linking via holes 1006V1 to 1006V8.

Figure 10L:
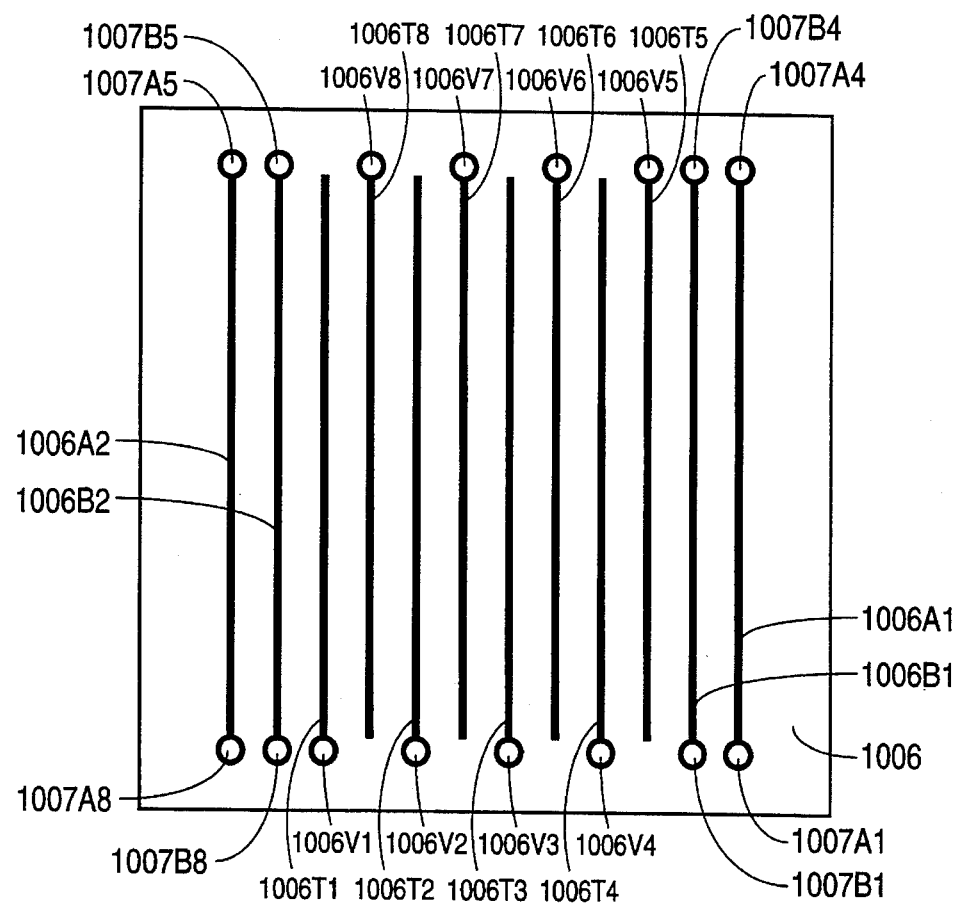
Figure 10M:
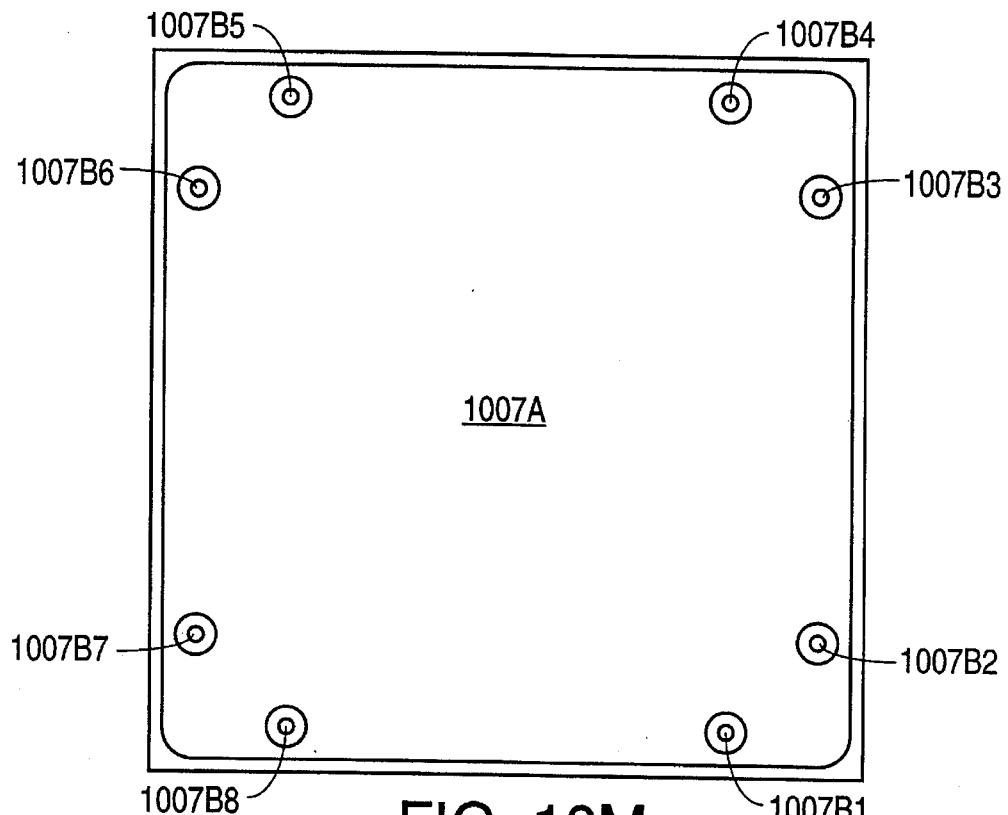
Figure 10N:
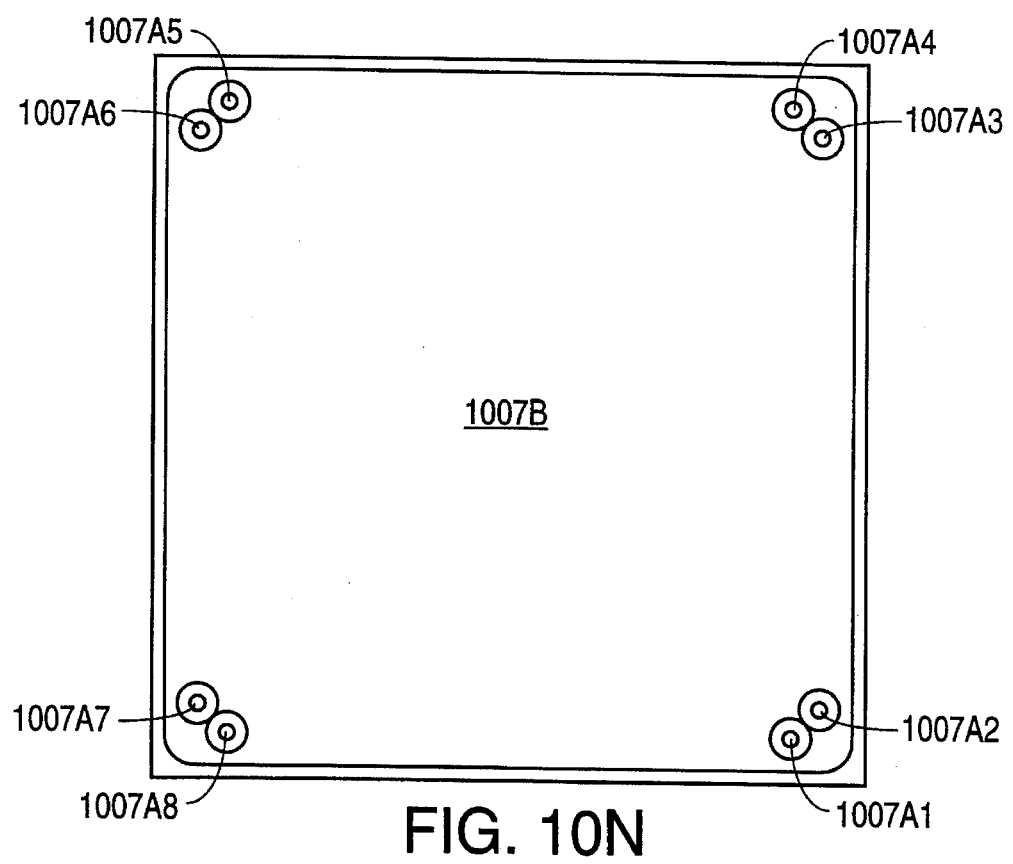

Matrix 1020 also includes additional row traces, such as traces 1005A1, 1005B1, 1005A2 and 1005B2 on layer 1005 that are connected to pairs of linking via holes such as pair (1007A3, 1007A6), (1007B3, 1007B6), (1007A2, 1007A7) and (1007B2, 1007B7) respectively that are in turn connected to Ground plane 1007A (FIG. 10L). Matrix 1020 also includes a number of additional column traces on layer 1006, such as traces 1006A1, 1006B1, 1006A2 and 1006B2, that are connected to pairs of linking via holes such as pair (1007A1, 1007A4), (1007B1, 1007B4), (1007A5, 1007A8) and (1007B5, 1007B8) respectively that are in turn connected to Vcc plane 1007B (FIG. 10M).

Both types of programmable elements, a fuse and an antifuse, are used in matrix 1020 in alternative embodiments. FIG. 10I illustrates the use of a fuse 1007AF to couple a row trace 1005A2 to a column trace 1006A2 in a manner similar to fuse matrix 2 described above (FIG. 2D). FIG. 10J illustrates the use of an antifuse 1007AT to couple a row trace 1005A2 to a column trace 1006T1 in a manner similar to the antifuse matrices described above (FIG. 5A). In another embodiment, both types of programmable elements, fuse and antifuse are used together in matrix 1020, thereby to make matrix 1020 reprogrammable as described below.

Figure 10P:
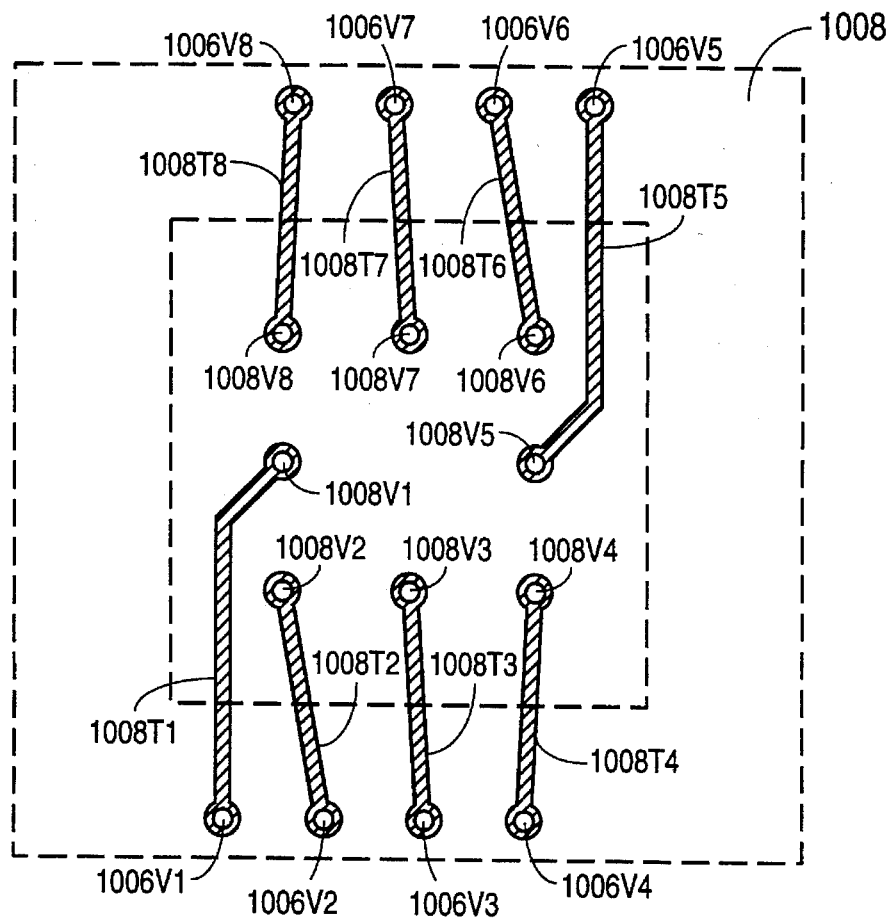
FIG. 10P illustrates the traces and via holes for connecting the matrix of FIG. 10H to the electrical contacts of the socket adapter illustrated in FIG. 10B.
Figure 10Q:
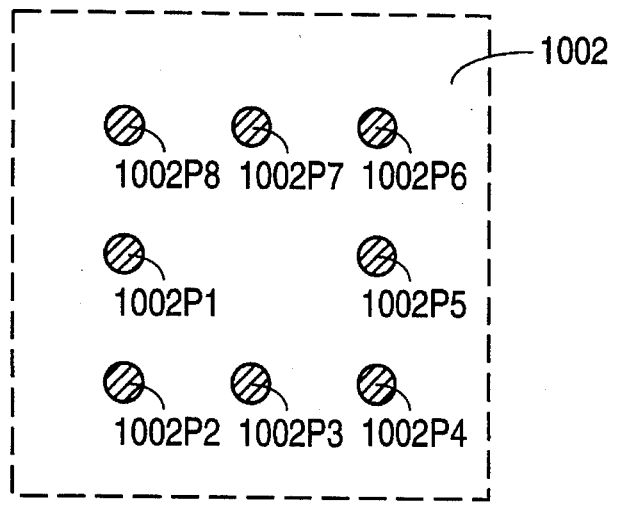
FIG. 10Q illustrates a bottom view of the component socket of FIG. 10C in the direction 10Q—10Q.

Linking via holes 1006V1 to 1006V8 (FIG. 10H) of matrix 1020 connect column traces 1006T1 to 1006T8 in layer 1006 to several traces 1008T1 to 1008T8 in layer 1008 (FIG. 10P). The traces in layer 1008 are in turn connected to linking via holes 1008V1 to 1008V8 arranged around the perimeter of a square.

Linking via holes 1008V1 to 1008V8 run through layer 1008 (FIGS. 10P and 10B) to a number of electrical contacts such as pins 1010P1 to 1010P8 (FIG. 10B) that are formed on the lower-most exposed surface 1008A in a spatial configuration suitable for insertion into plated holes 1002T1 to 1002T8 (FIG. 10F) of PGA socket 1002 described above.

Socket adapter 1010 can be fabricated from conventional printed circuit board materials as described above, for example, in reference to FIGS. 2A and 2B. Such a socket adapter allows an electronic component having terminals in one spatial configuration to be coupled to a component socket having component contacts in a different spatial configuration. Moreover, as socket adapter 1010 contains an electrically programmable matrix 1020 of fuses and/or antifuses, a packaged integrated circuit 1001 having one pin-out configuration can be coupled to a PGA socket 1002 having a different pin-out configuration, as described below in reference to FIGS. 15A and 15B, resulting in significant flexibility and rapid prototyping.

Socket adapter 1010 has all Of the advantages of reconfiguration device 1000A. For example, a customer can purchase blank, off-the-shelf socket adapters and customize matrix 1020 inside socket adapter 1010 at the customer location, as per the customer's needs. Also, socket adapter 1010 is inexpensive and compact due to embedded matrix 1020 of fuses and/or antifuses. Matrix 1020 eliminates the need for a silicon chip, as was necessary in the prior art to provide programmable elements. Socket adapter 1010 can be used in the development of new products or prototypes using IC components which may need replacement during evaluation. A socket adapter 1010 is used instead of direct soldering of IC components to a PCB because such soldering requires a major effort to desolder if any replacement of IC component is required, especially for a high pin count package (such as 68 pins).

Although a specific fuse geometry is illustrated in FIG. 10H, any other fuse geometry in the enclosed description can be used in accordance with this invention, to obtain suitable fuse blowing characteristics.

FIG. 11A is an illustrative cross-sectional view of a component socket 1100 for coupling a packaged integrated circuit such as a Quad-flat package (QFP) 1110, to a printed circuit board (PCB) 1120. FIG. 11B is an illustrative top plan view of component socket 1100 in the direction 11B–11B of FIG. 11A. Component socket 1100 has a number of component contacts, such as mounting pads 1101T1 to 1101T16 (FIG. 11B). For clarity, all of the parts in FIGS. 11A and 11B are not labeled.

The component contacts of component socket 1100 are formed on an upper-most surface 1103U in a spatial configuration identical to the spatial configuration of the surface mount leads of QFP 1110, such as surface mount leads 1101T1 to 1101T16 respectively. Component socket 1100 also includes:

1) a multi-layered structure 1103 (FIG. 11A) that contains a matrix (not shown) of fuses similar to matrices described above;

2) a number of electrical contacts, such as surface mount leads 1102P1 and 1102P2 suitable for coupling to the component contacts, such as mounting pads 1121P1 and 1121P2 of printed circuit board 1120; and 3) other parts found in conventional component sockets, such as socket lid 1104 and clamping screw 1105.

The matrix of fuses inside component socket 1100 initially connects all mounting pads to all electrical contacts. A customer can program the matrix of fuses to preserve any desired fuse and blow away all the undesirable fuses.

Component socket 1100 has many of the advantages of reconfiguration device 1000A (above). Specifically, component socket 1100 allows a number of different pin-out configurations to share a single design, which in turn reduces development and fabrication costs and time. Also, component socket 1100 can be fabricated inexpensively because all of the parts are built into a single unit. Furthermore, component socket 1100 has the advantage of a smaller volume and lower cost due to elimination of the need for packaging an IC in an expensive PGA package and the ability to handle a QFP package in a prototyping environment.

Figure 11C:
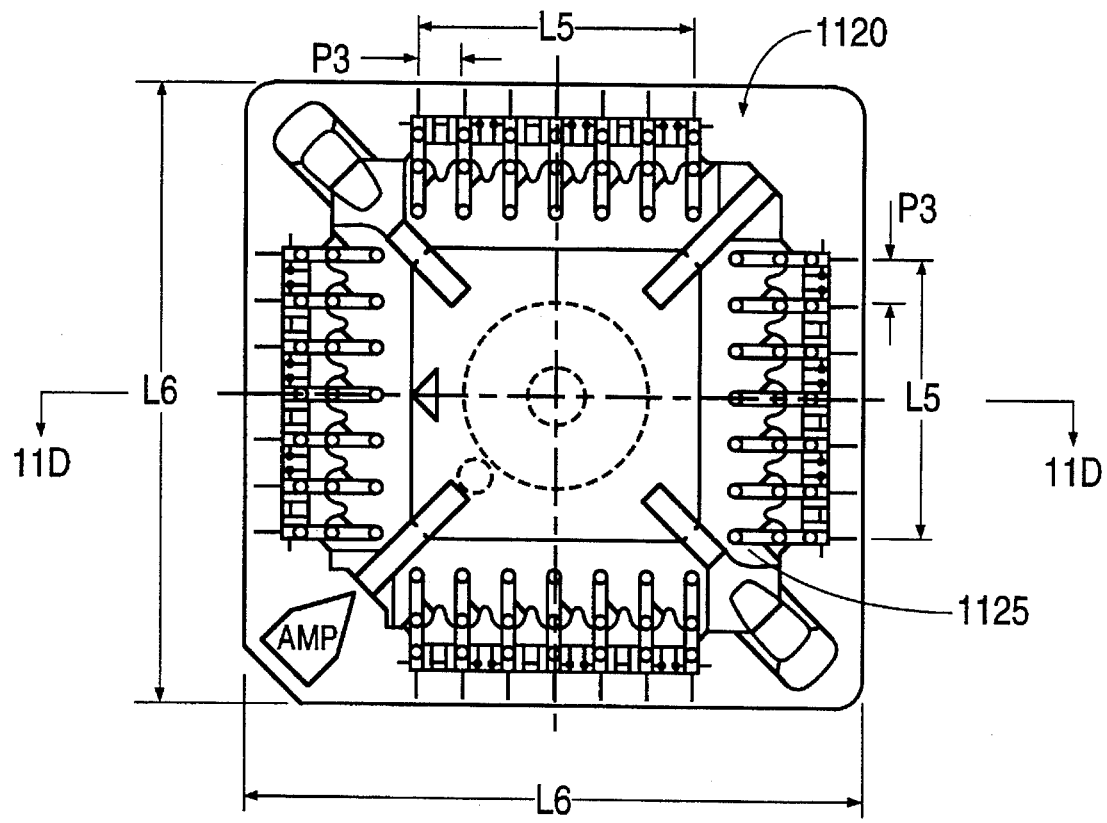
FIGS. 11C and 11D illustrate another embodiment of a component socket in accordance with this invention.
Figure 11D:
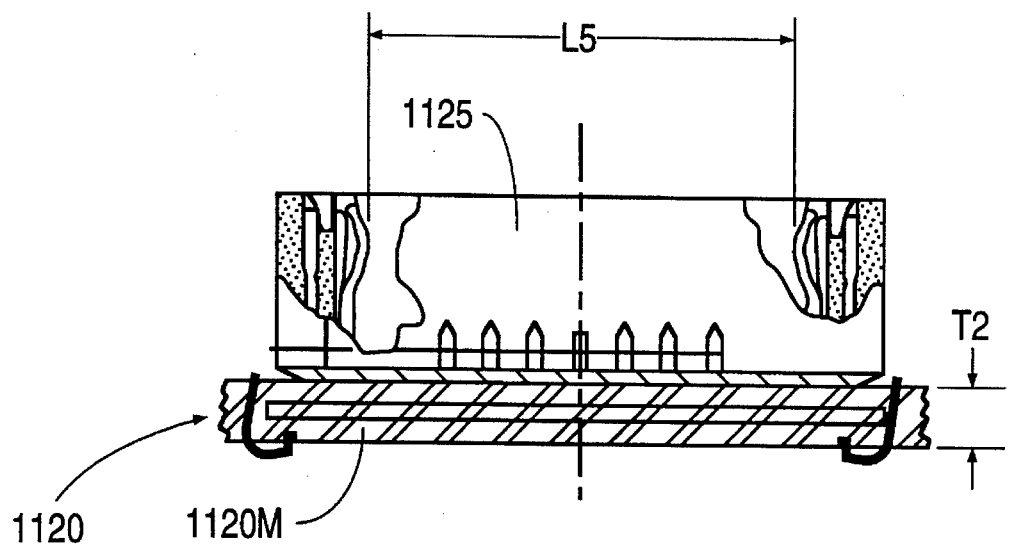

FIGS. 11C and 11D illustrate another embodiment of a component socket 1120 in accordance with this invention. Component socket 1120 connects a packaged integrated circuit 1125 with twenty-eight pins to a printed circuit board using a multi-layered structure 1120M (FIG. 11D) that contains a fuse matrix (not shown in FIGS. 11C and 11D). Multi-layered structure 1120M is similar to the structures described above, such as multi-layered structure 1103 (FIG. 11A) and has dimensions that allow multi-layered structure 1120M to be mounted inside component socket 1120. Multi-layered structure 1120M has a square shape, with length L5, 0.3 inch in one embodiment, and thickness t2, 0.06 inch in the same embodiment. Component socket 1120 also has a square shape with a length L6, 0.5 inch in one embodiment. The component contacts of component socket 1120 are separated from each other by a pitch P3, typically 0.05 inch.

Figure 11E:
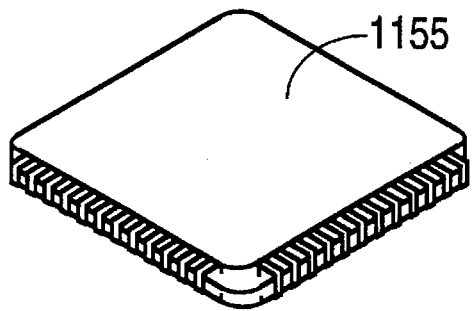
FIGS. 11E, 11F, 11G and 11H illustrate the various types of packaged integrated circuits having terminals that are received by various embodiments of component sockets in accordance with this invention.
Figure 11F:
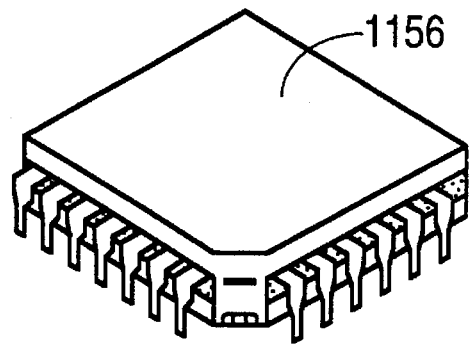
Figure 11G:
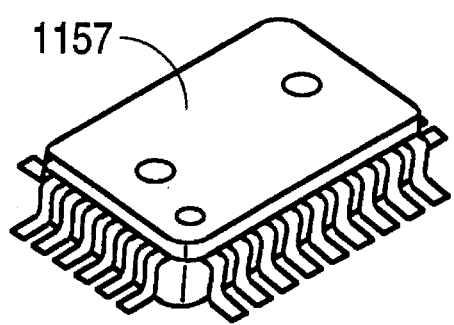
Figure 11H:
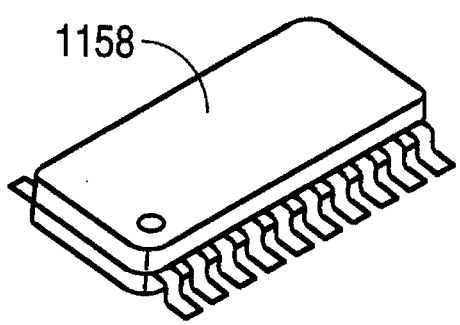

Although component sockets 1100 and 1120 are illustrated in FIGS. 11A, 11B, 11C and 11D as having component contacts suitable to receive terminals of quad-flat packages, a component socket in accordance with this invention can have other types of component contacts suitable to receive the terminals of packages, such as leadless-chip-carrier package 1155 (FIG. 11E), plastic-leaded-chip-carrier package 1156 (FIG. 11F), quad-flat package 1157 (FIG. 11G) and small-out-line package 1158 (FIG. 11H).

In one embodiment, a matrix of fuses and/or antifuses is formed as a part of an IC package, such as leadless-chip-carrier package 1155 instead of being formed in a component socket or a socket adapter described above. Such an IC package can be formed using fuse/antifuse materials as described herein and conventional substrate materials.

Figures 12A, 12B:
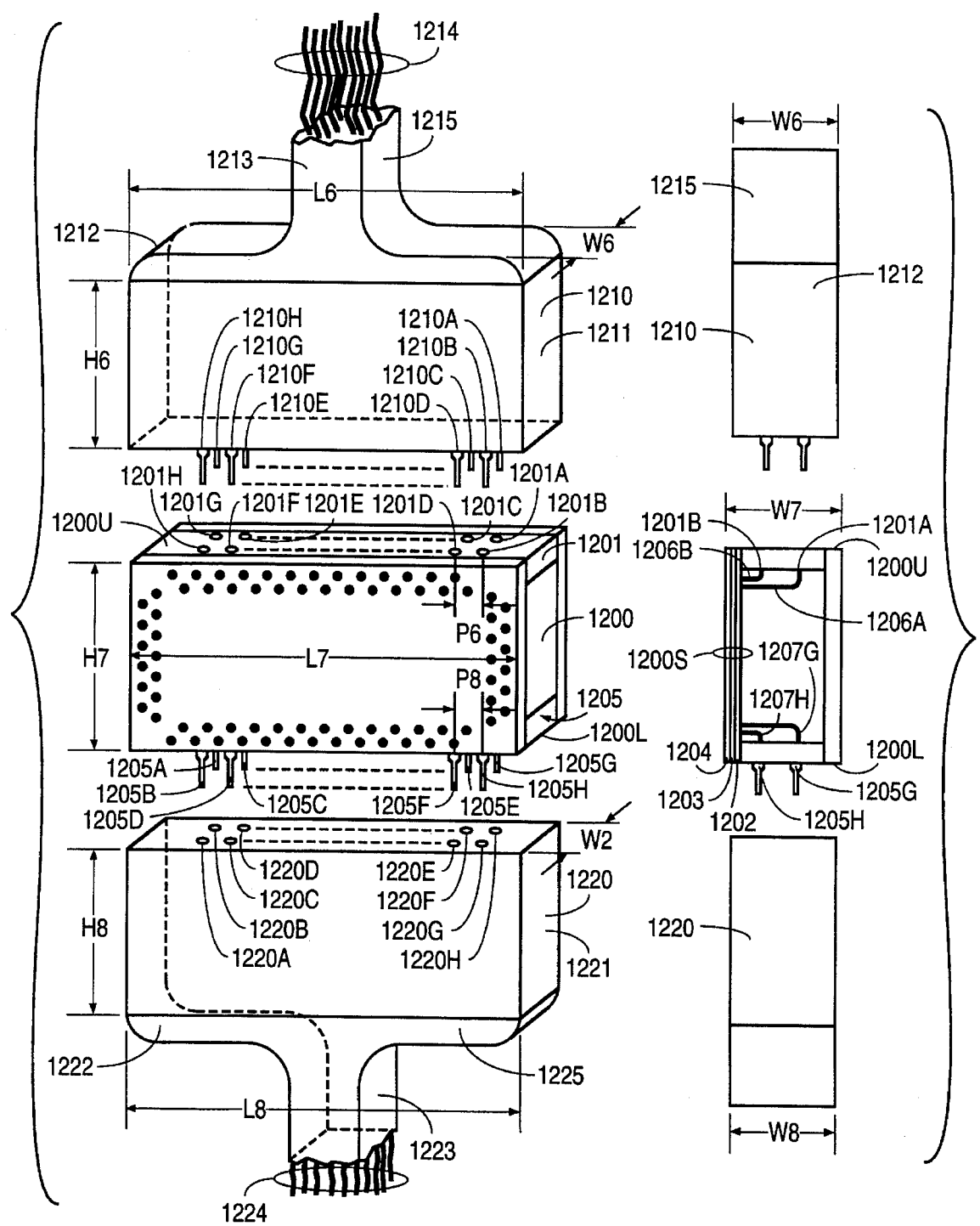
FIGS. 12A and 12B are perspective and side exploded views respectively that illustrate a reconfiguration device that comprises in this embodiment, a cable adapter for coupling two cable connectors.
Figure 13A:
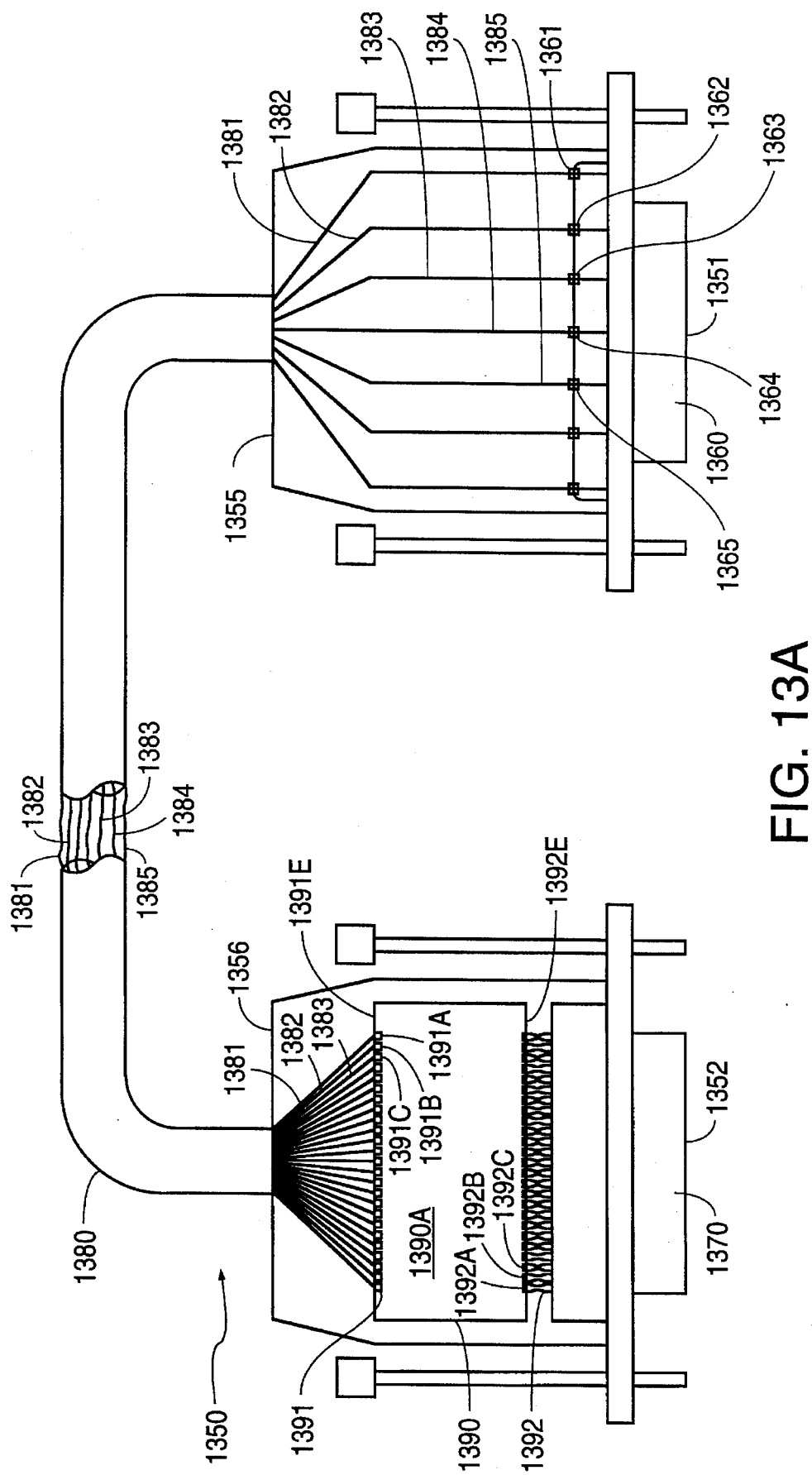
FIG. 13A illustrates yet another reconfiguration device that comprises in this embodiment, a programmable cable for coupling two electrical devices.

FIG. 12A is an exploded perspective view illustrating a reconfiguration device that is, in this specific embodiment, a cable adapter 1200 for coupling the terminals of a first cable connector 1210 of a first connector type to the terminals of a second cable connector 1220 of a second connector type. FIG. 12B is an exploded side view illustrating cable adapter 1200 of FIG. 12A in relation to first cable connector 1210 and second cable connector 1220.

Cable adapter 1200 has a first exposed surface, such as an upper-most exposed surface 1200U and a second exposed surface, such as a lower-most exposed surface 1200L. Cable adapter 1200 also includes a multi-layered structure 1200S of layers 1202, 1203 and 1204. In this embodiment, layers 1202, 1203 and 1204 of multi-layered structure 1200S are arranged perpendicular to upper-most exposed surface 1200U and lower-most exposed surface 1200L. Therefore multi-layered structure 1200S is interposed between upper-most exposed surface 1200U and lower-most exposed surface 1200L.

Cable adapter 1200 has a number of first cable contacts, such as plated holes 1201A to 1201H that are formed in upper-most exposed surface 1200U in a spatial configuration suitable to receive terminals 1210A to 1210H, respectively of first cable connector 1210. In the specific embodiment of FIGS. 12A and 12B, plated holes 1201A to 1201H are eight of forty-four pins (not shown) of a RS 488 type connector that is well known to a person of skill. All of the parts in FIGS. 12A and 12B are not shown for clarity.

Cable adapter 1200 also has a number of second cable contacts, such as pins 1205A to 1205H that, in this embodiment, are pins arranged in lower-most exposed surface 1200L in a spatial configuration suitable for insertion into plated holes 1220A to 1220H of cable connector 1220. In the specific embodiment of FIGS. 12A and 12B, pins 1205A to 1205H are eight of twenty-six (not all shown) pins of a RS232 type connector that is well known to a person skilled in the PC arts. Therefore each of first cable contacts can be electrically connected to any of second cable contacts through a programmable cable adapter.

In this embodiment, cable connector 1210 is part of a cable 1215. Cable 1215 includes a number of flexible electrical conductors 1214 that are encased in conductor casing 1213 and are connected to terminals in cable connector 1210 in cable head 1212. Electrical conductors 1214 and cable connector 1210 are encased in a housing 1211 that is typically made of plastic.

Similarly, cable connector 1220 of FIG. 12A is part of a cable 1225. Cable 1225 includes a number of flexible electrical conductors 1224 that are encased in conductor casing 1223 and are connected to terminals in cable connector 1220 in cable head 1222. Electrical conductors 1224 and cable connector 1220 are encased in housing 1221 that is typically made of plastic.

In this embodiment, width W7 of cable adapter 1200 is less than or equal to the largest of widths W6 and W8 of cable connectors 1210 and 1220 respectively. Similarly, a length L7 and height H7 of cable adapter 1200 are less than or equal to the largest of lengths L6 and L8 of and the largest of height H6 and H8 of cable connectors 1210 and 1220. In other embodiments, width W7 can be larger than the largest of width W6 and W8, if the fuse matrix is large, for example 100×100 fuses. In one specific embodiment, cable adapter 1200 has a width W7=0,630 inches, height H7=1.2 inches and length L7=1.8 inches.

Figure 12C:
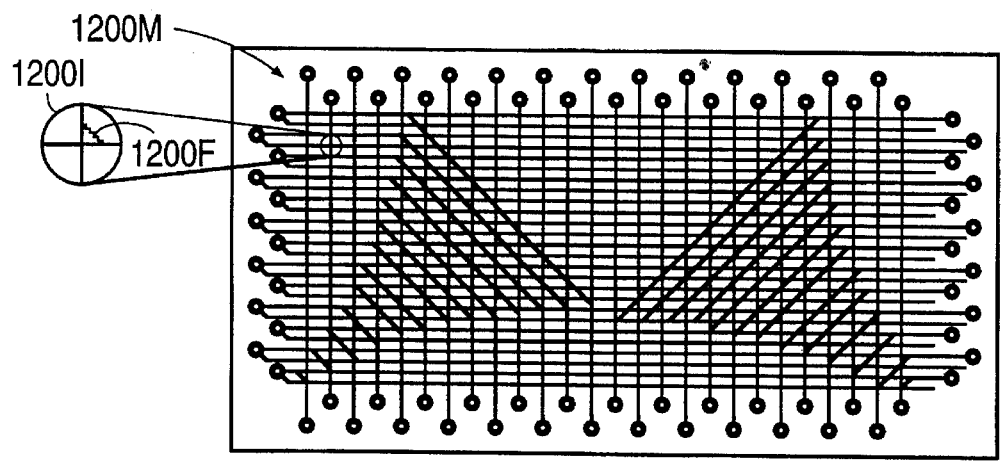
FIGS. 12C, 12D, 12E and 12F illustrate the traces and via holes on each layer of the cable adapter illustrated in FIGS. 12A and 12B.
Figure 12D:
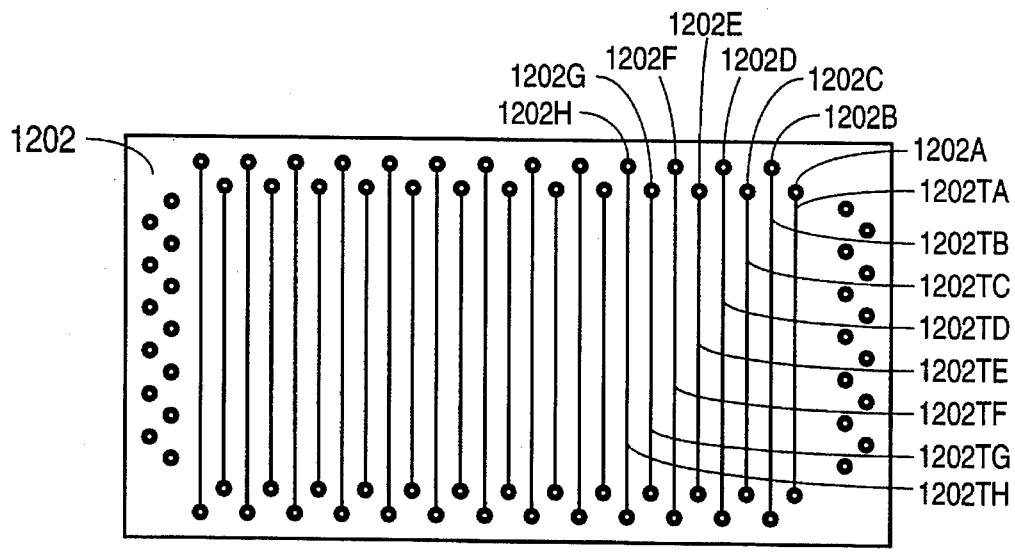
Figure 12E:
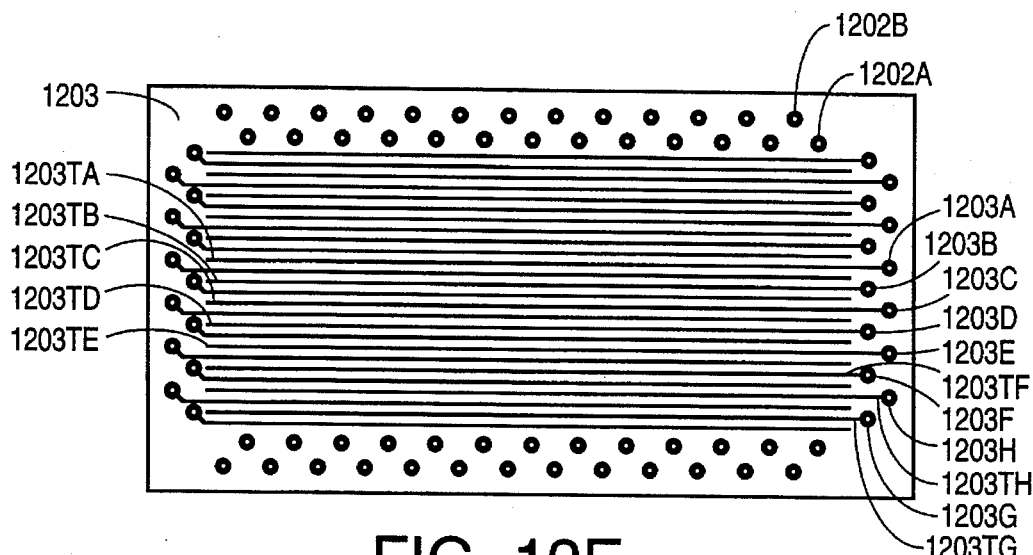
Figure 12F:
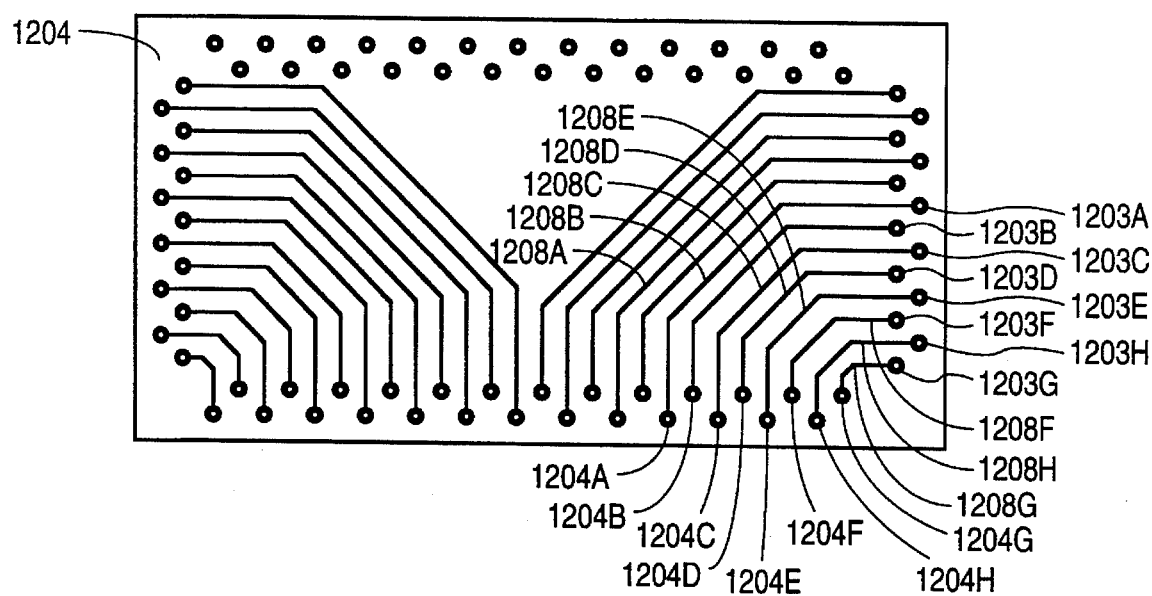

Multi-layered structure 1200S (FIG. 12B) has a matrix 1200M (FIG. 12C) of fuses and/or antifuses that connect first cable contacts, such as plated holes 1201A to 1201H, to second cable contacts, such as pins 1205A to 1205H. Matrix 1200M is a composite of the traces, fuses and vias in layers 1202, 1203 and 1204 of multi-layered structure 1200S.

As shown in FIG. 12A, first cable contacts 1201A to 1201H are formed on upper-most exposed surface 1200U and are connected by pins, such as pins 1206A and 1206B (FIG. 12B) through linking via holes 1202A to 1202H (FIG. 12D) to a number of column traces in a first layer 1202, such as traces 1202TA to 1202TH. For clarity, all of the parts of FIGS. 12C, 12D, 12E and 12F are not numbered.

Similarly, second cable contacts 1205A to 1205H are formed on lower-most surface 1200L and are connected by pins, such as pins 1207G and 1207H (FIG. 12B) to linking via holes 1204A to 1204H (FIG. 12E). Linking via holes 1204A to 1204H are connected by a number of traces 1208A to 1208H through linking via holes 1203A to 1203H to row traces on layer 1203 (FIG. 12E), such as traces 1203TA to 1203TH.

Each of row traces, such as row traces 1203TA to 1203TH is coupled to each of the column traces, such as column traces 1202TA to 1202TH by fuses or antifuses (not shown) as described above, for example in reference to FIG. 1 or FIG. 5A. Therefore, by appropriately programming fuses such as fuse 1200F (inset 1202I) in matrix 1200M (FIG. 12C) of cable adapter 1200, a user can effectively reconfigure any pin of cable connector 1210 to match any plated hole of cable connector 1220.

Cable adapter 1200 has all of the advantages described above for reconfiguration device 1000A. Moreover, cable adapter 1200 allows customers that have already purchased cables to connect the purchased cables to other types of cables and/or connectors of electrical devices. Therefore, by using a different cable adapter 1200 each time that an existing cable is to be connected to a different cable, an existing cable can be reconfigured many times to connect to various other cables.

One embodiment of a cable adapter 1200 has a cable connector 1210 in the form of a RS232 DB9 pin connector and a cable connector 1220 in the form of an RS232 DB15 pin connector. Such a cable adapter 1200 can be used to connect, for example, an RS232 port in an IBM PC with a DB9 pin connector to another device, such as a dot matrix printer (or a modem) having a DB15 pin connector.

Another embodiment of a cable adapter 1200 has both cable connectors 1210 and 1220 in the form of RS232 DB9 pin connectors (not shown). In this embodiment, pins 2 and 3 (not shown) are swapped between connectors 1210 and 1220 and pins 4 and 5 (not shown) are also swapped between connectors 1210 and 1220. Such a cable adapter 1200 can be used to connect an IBM PC RS232 port to, for example, a RS232 port of a laser printer.

Although cable adapter 1200 is illustrated as connecting cable connectors 1210 and 1220 of two different cables 1215 and 1225, a cable adapter in accordance with this invention can connect a cable connector in any electrical device to a cable connector of any other electrical device. In one embodiment, cable connectors 1210 and 1220 are HD-20 connector and HD-22 connector respectively, available for example, from AMP, Inc., Harrisburg, Pa. 17105 (phone 1-800-522-6752).

A reconfiguration device in one embodiment of this invention is a cable 1350 (FIG. 13A) that includes a printed circuit board (PCB) 1390. Cable 1350 has a first cable head 1355 at a first cable end 1351, a second cable head 1356 at a second cable end 1352 and a sheath 1380 that physically joins first cable head 1355 to second cable head 1356. PCB 1390 is located inside second cable head 1356.

Cable 1350 also includes a number of electrical conductors, such as conductors 1381, 1382, 1383, 1384 and 1385 that are bundled together by sheath 1380. Conductors 1381 to 1385 are flexible and insulated from each other inside sheath 1380. Each of conductors 1381 to 1385 is connected to a selected one of terminals 1361 to 1365 respectively of a first cable connector 1360 located at first cable end 1351.

Figure 13B:
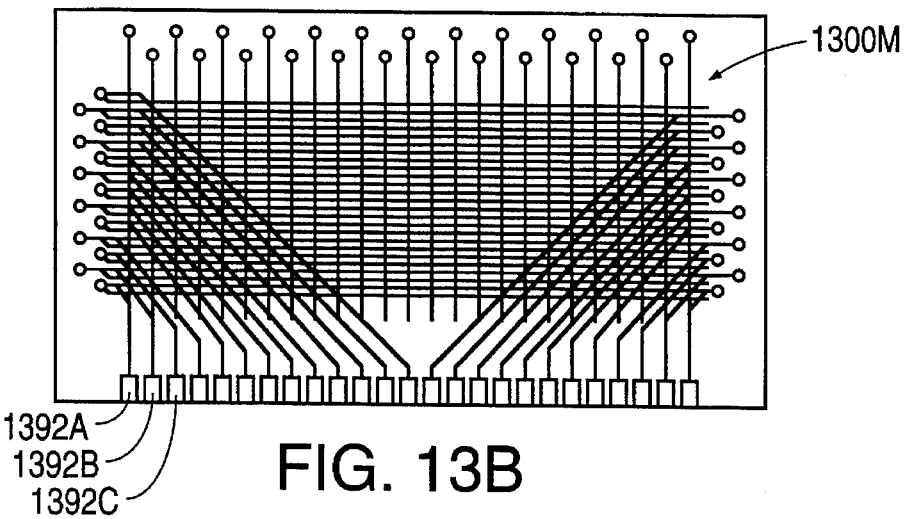
FIGS. 13B, 13C, 13D and 13E illustrate the traces and via holes on each layer of the multi-layered structure of the programmable cable illustrated in FIG. 13A.
Figure 13C:
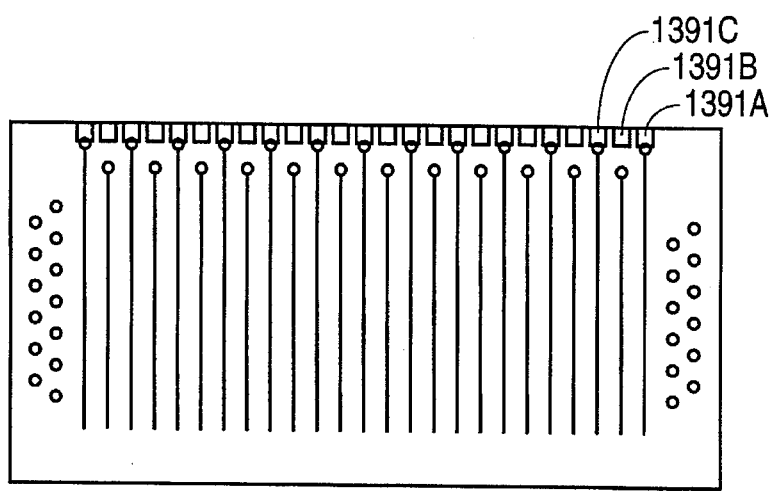
Figure 13D:
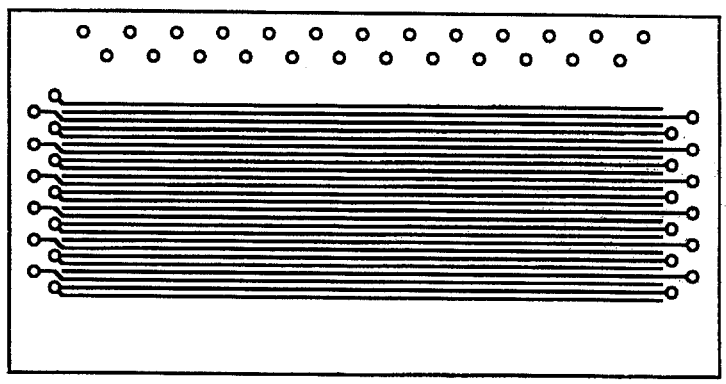
Figure 13E:
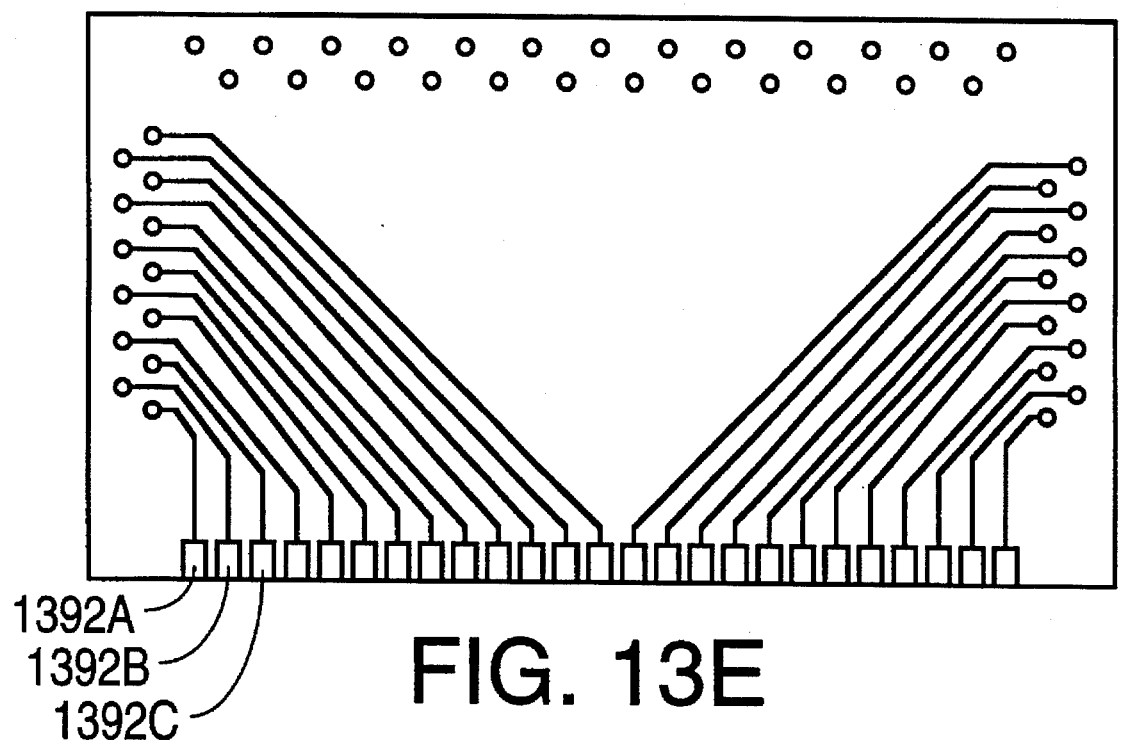

PCB 1390 is a multi-layered structure with programmable elements for coupling the conductors of cable 1350, such as conductors 1381 to 1385, to a second cable connector 1370 located at a second cable end 1352. PCB 1390 contains a matrix 1300M (FIG. 13B) of fuses and/or antifuses of the type described above. PCB 1390 has an upper-most exposed surface 1390A, and a number of layers such as layers 1392, 1393 and 1394 (FIGS. 13C, 13D and 13E) that are similar to layers 1202, 1203 and 1204 described above, except that first cable contacts, such as cable contacts 1391A, 1391B, 1391C, are formed on the same upper-most surface 1390A as second cable contacts, such as cable contacts 1392A, 1392B, and 1392C.

First cable contacts, such as cable contacts 1391A, 1391B, 1391C, are formed at a first edge 1391E of printed circuit board 1390, opposite to a second edge 1392E. A number of second cable contacts, such as cable contacts 1392A, 1392B and 1392C are formed at second edge 1392E. Each of first cable contacts, such as cable contacts 1391A, 1391B and 1391C is connected to an electrical conductor, such as electrical conductors 1381, 1382 and 1383 respectively. Each of second cable contacts, such as cable contacts 1392A, 1392B and 1392C, is connected to terminal, such as terminals 1371, 1372 and 1373, of second cable connector 1370 at second cable end 1352. In one embodiment, first cable connector 1360 is an HD-20 connector and second cable connector 1370 is an HD-22 connector, available from, for example, AMP, Inc. (above).

In one embodiment, PCB 1390 has dimensions sufficient to fit into a conventionally sized cable head, such as second cable head 1356.

Programmable cable 1350 has all of the advantages of reconfiguration device 1000A. Therefore, inclusion of a programmable element inside a cable allows a number of customized cables to share the same design and hence reduces the long lead time and development costs associated with conventional fabrication of a small number of customized cables. Also, building all parts into a single cable reduces handling, shipping and storage space problems and associated costs. Moreover, the end user receives a single cable without need for any assembly.

Figure 14A:
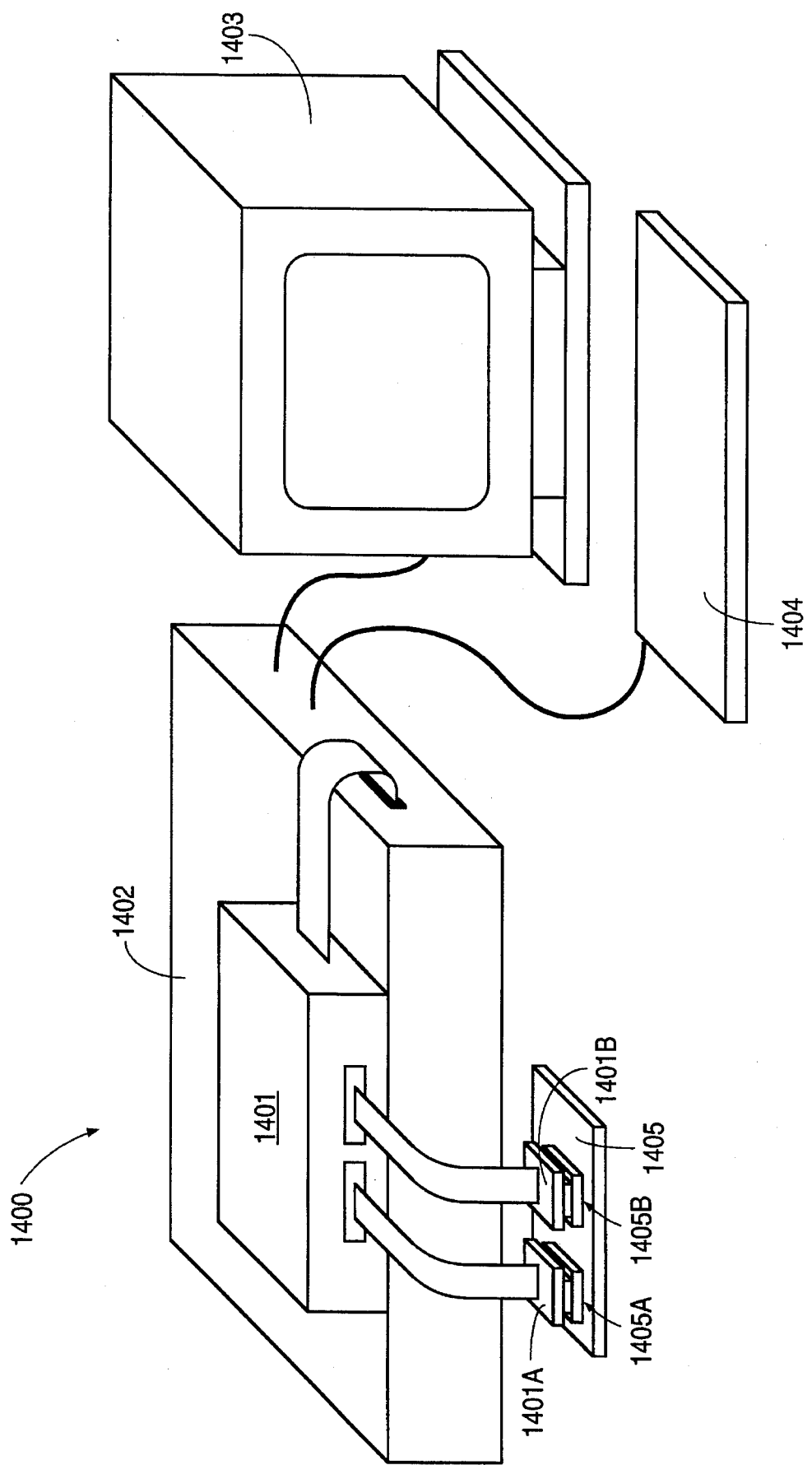
FIG. 14A illustrates a programmer for programming a matrix of fuses in a multi-layered structure in accordance with this invention.
Figure 14B:
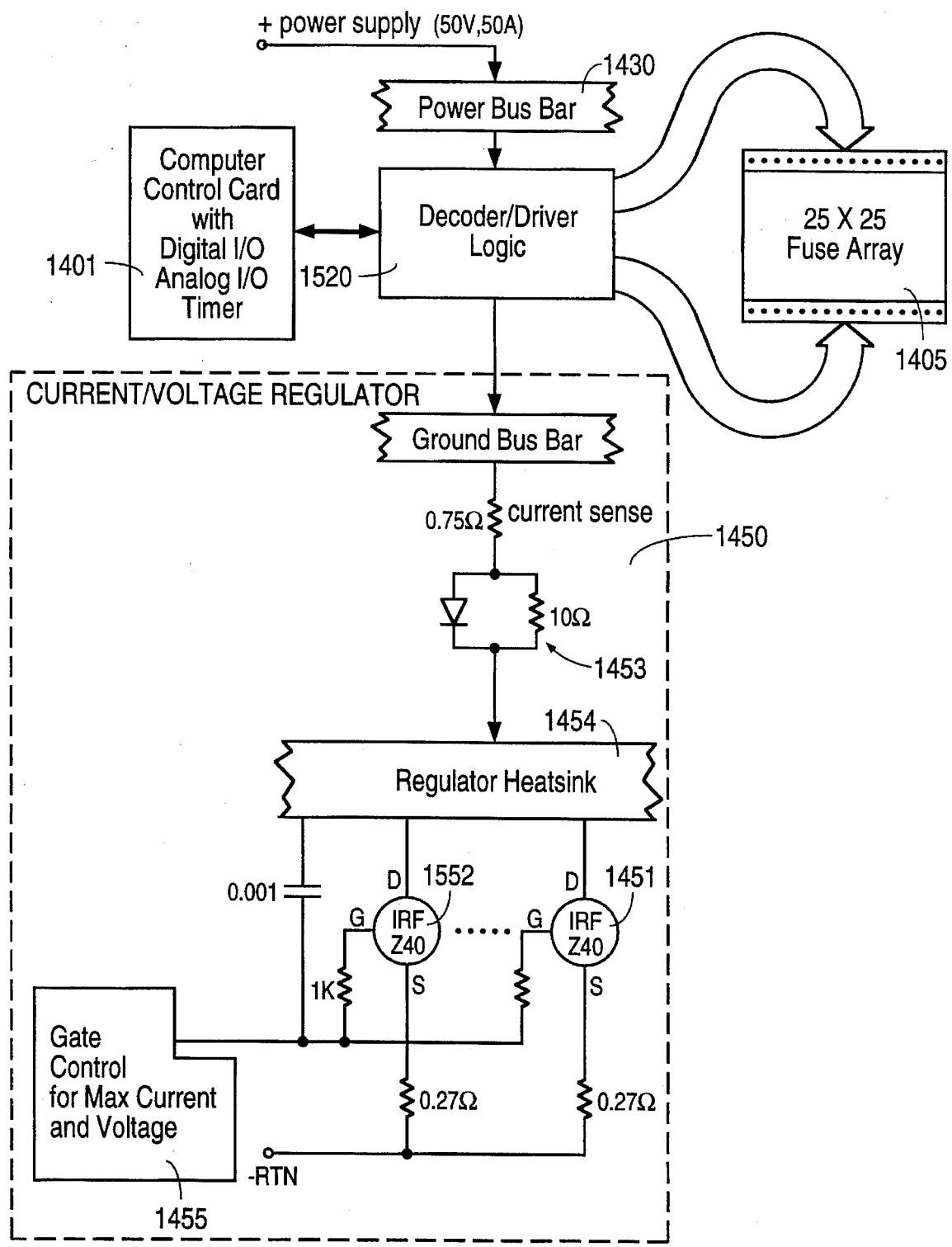
FIG. 14B is a high level block diagram of various parts of the programmer of FIG. 14A.
Figure 15A:
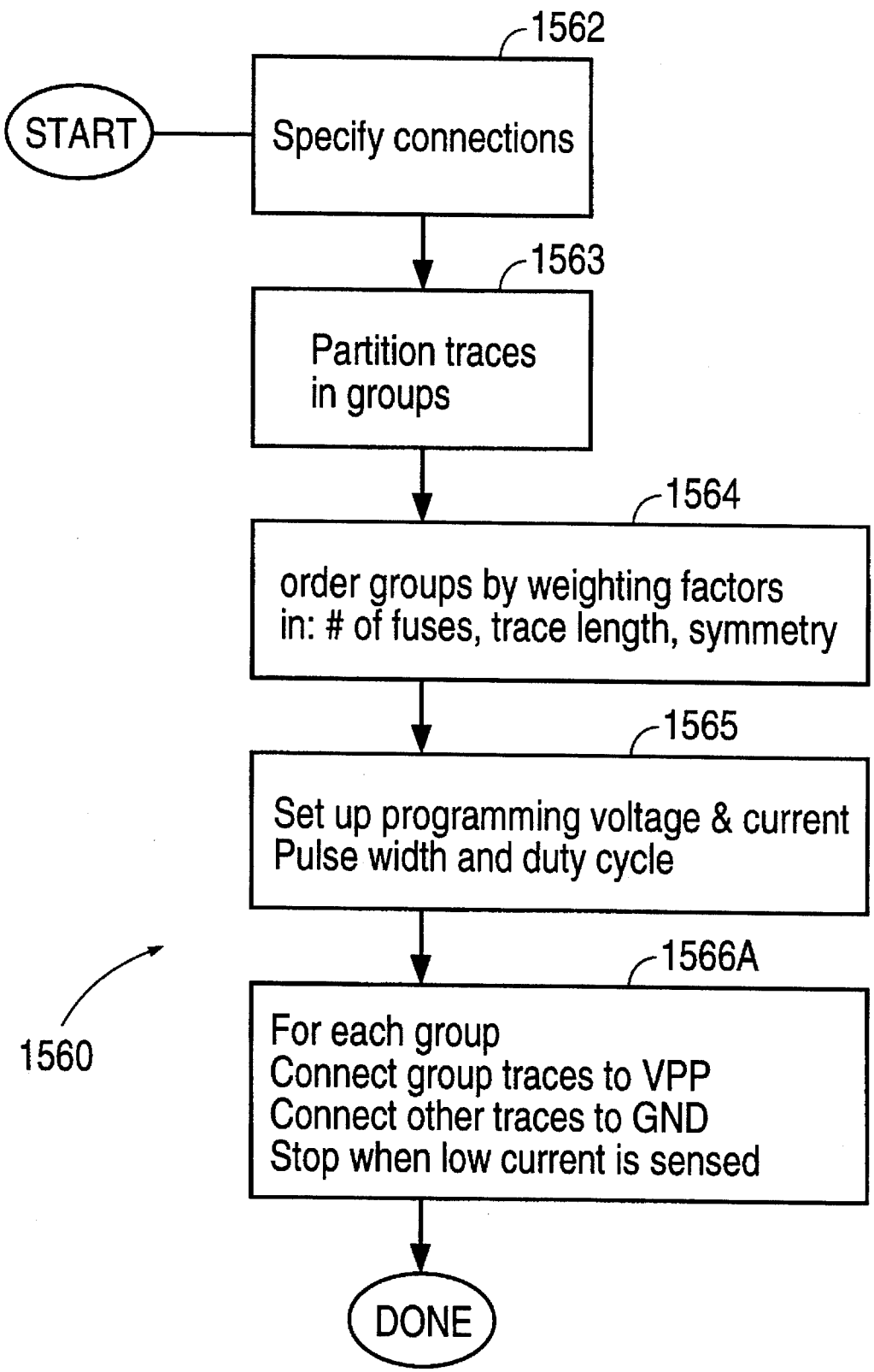
FIGS. 15A and 15B illustrate the sequence of steps in methods for programming a matrix of fuses in accordance with this invention.
Figure 15B:
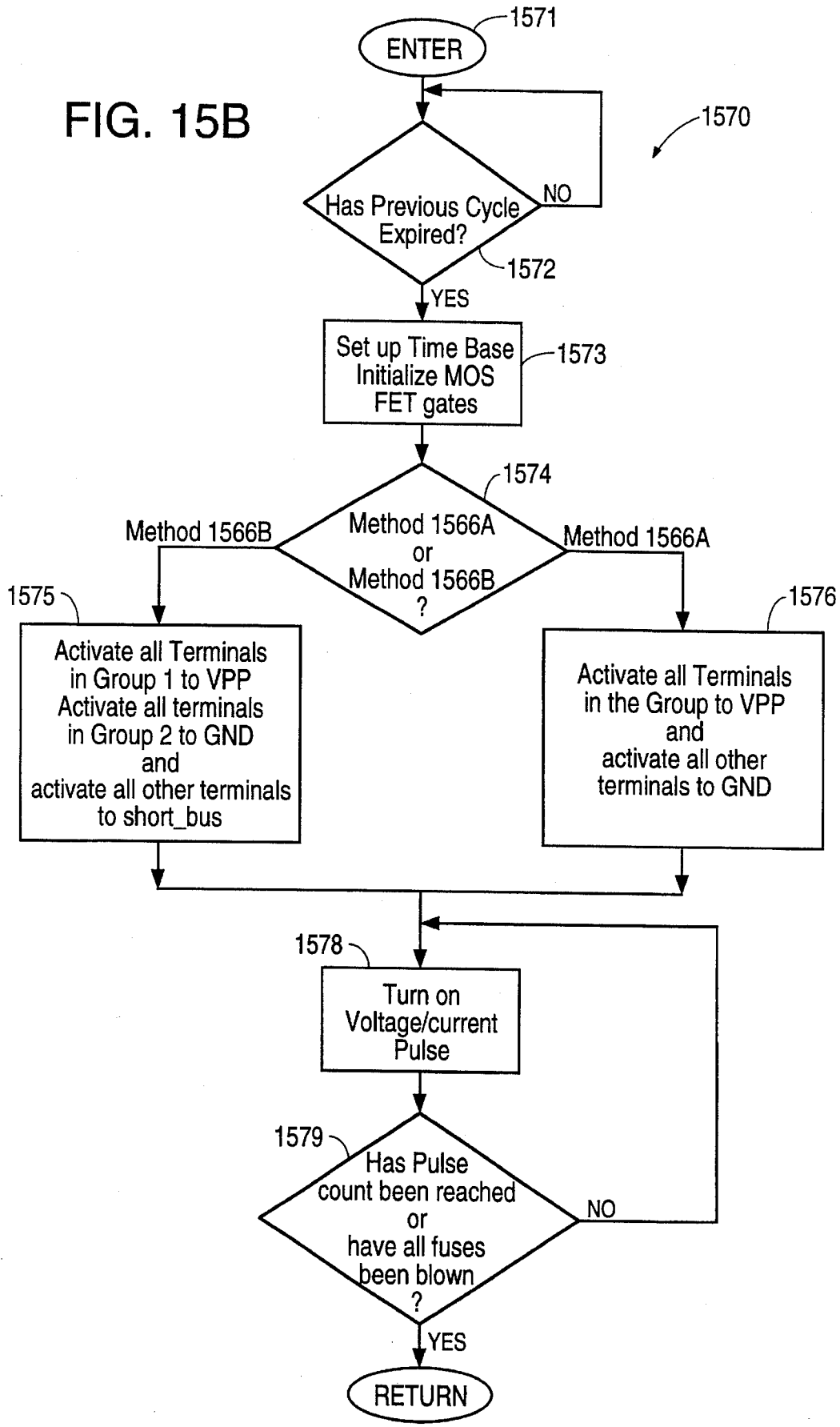
Figure 15C:
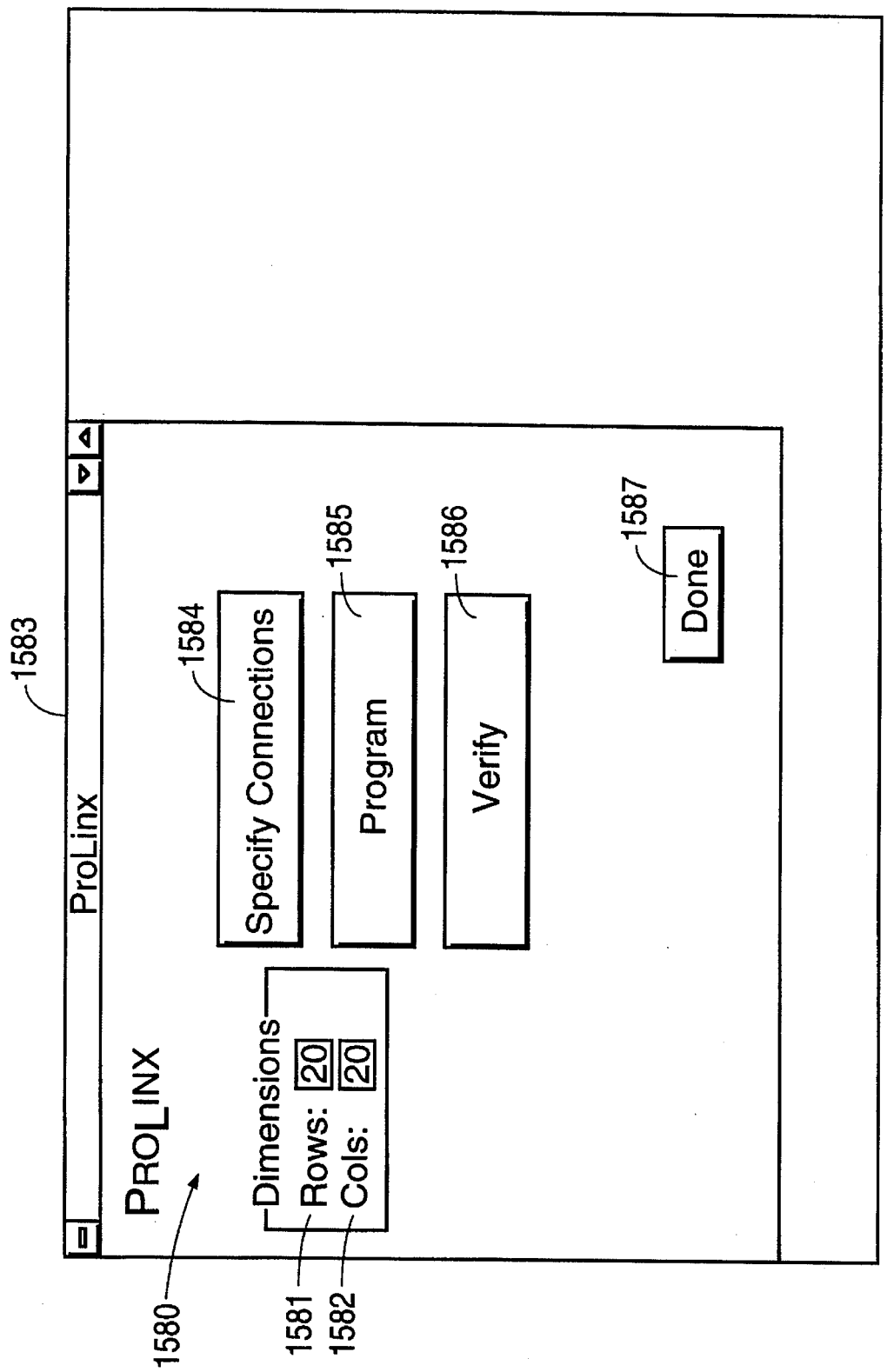
FIGS. 15C, 15D, 15E and 15F illustrate graphical user interface screens of the programmer of FIG. 14A.
Figure 15D:
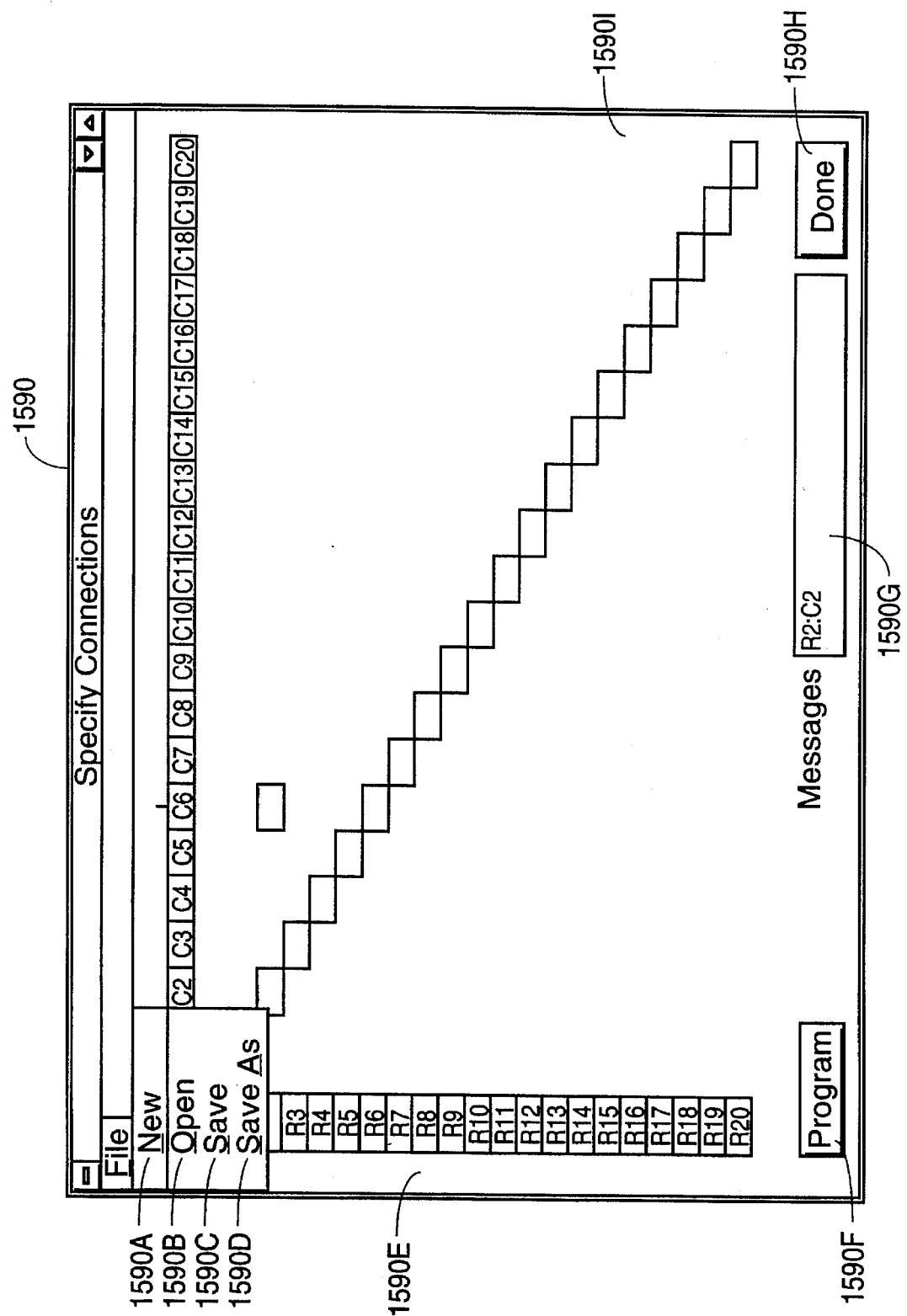
Figure 15E:
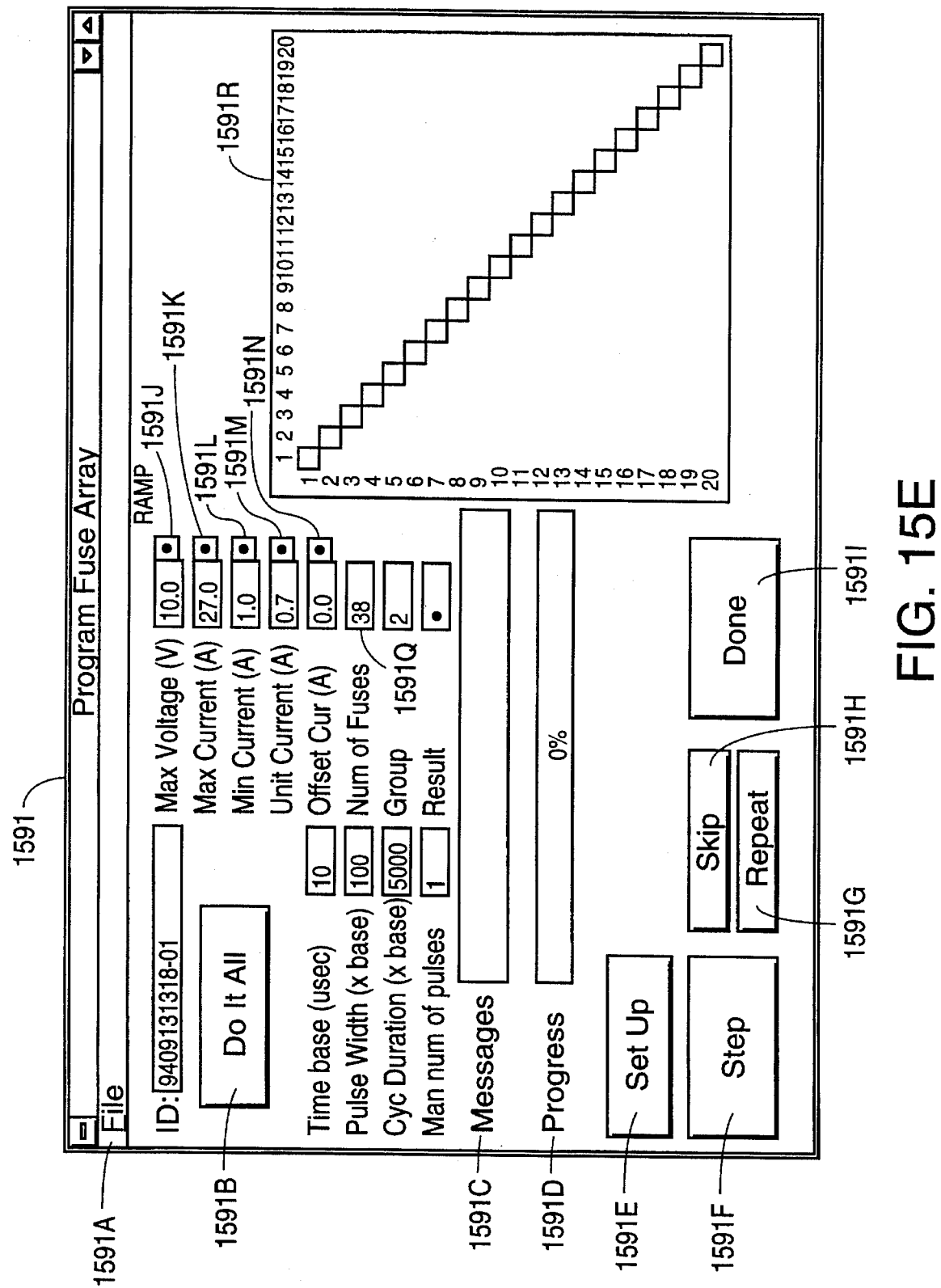
Figure 15F:
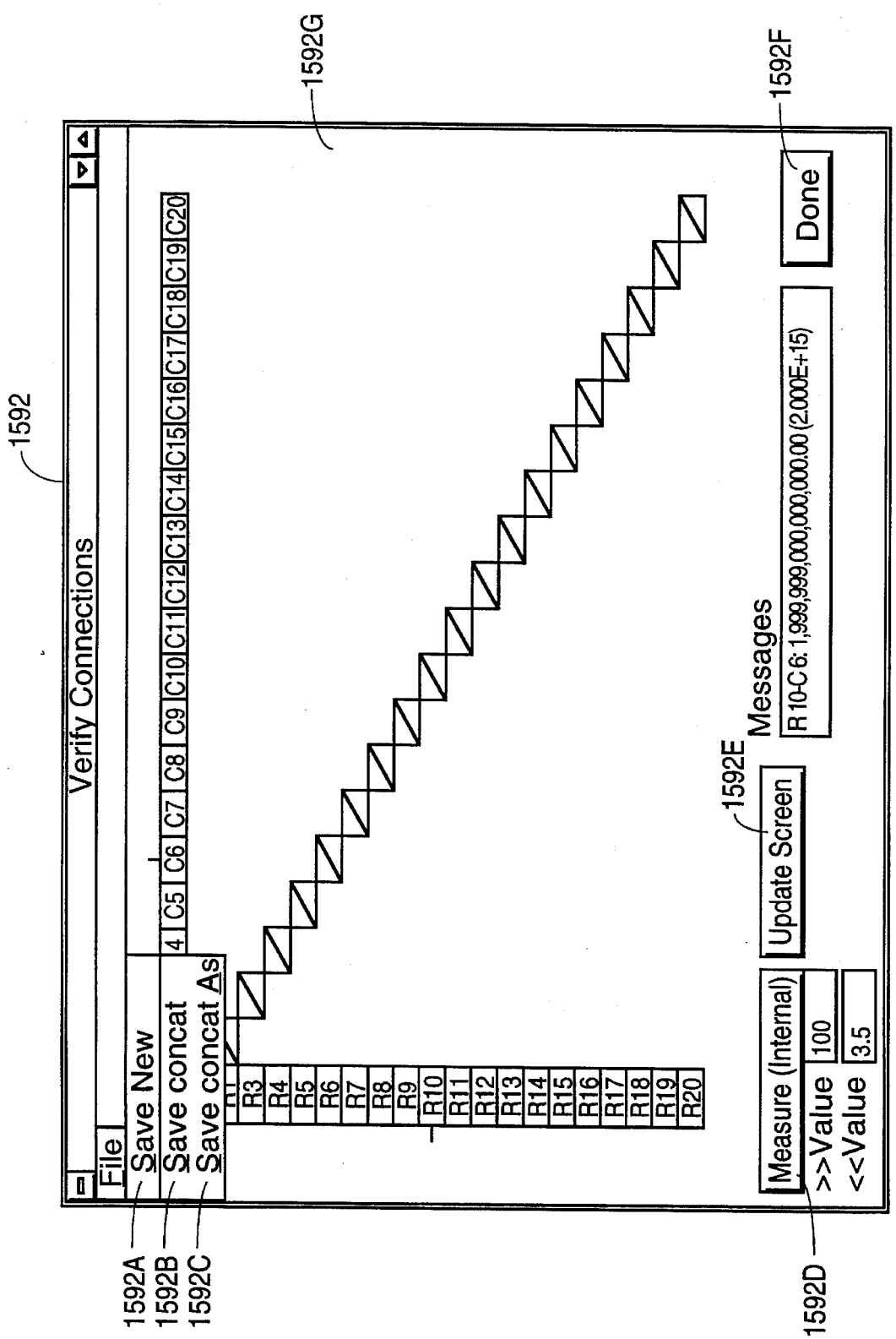

A multi-layered structure that includes a number of fuses in a matrix in accordance with this invention can be programmed by the apparatus illustrated in FIGS. 14A and 14B and the method illustrated in FIGS. 15A and 15B. A programmer 1400 in accordance with this invention includes computer control card 1401 coupled to and controlled by a personal computer 1402. Personal computer 1402 is controlled by a user, such as a customer, using keyboard 1404 and monitor 1403.

Multi-layered structure 1405 has a number of first component contacts 1405A coupled to a number of second component contacts 1405B by a fuse matrix similar to matrix 2 of FIG. 2E. Multi-layered structure 1405 is programmed by two component socket probes 1401A and 1401B, hereinafter probes 1401A and 1401B, that are connected to first component contacts 1405A and second component contacts 1405B. Probes 1401A and 1401B are driven by computer control card 1401. In one embodiment, probes 1401A and 1401B are 44 pin PLCC probes available from Procomm Technologies, Inc. 1333 Lawrence Expressway, Suite 207, Santa Clara, Calif. 95051. Furthermore, in this embodiment, computer control card 1410 is the Lab-PC+ board available from National Instruments, 6504 Bridgepoint Parkway, Austin, Tex. 78730-5039.

Although probes 1401A and 1401B are component socket probes in this embodiment, probes 1401A and 1401B can be any structure that couples a fuse matrix to a computer control card, such as, for example, a cable connector for programming a fuse matrix inside a cable adapter.

As illustrated in FIG. 14B, computer control card 1401 drives a decoder/driver logic 1420 based on commands received from the user. Decoder/driver logic 1420 supplies a programming current from a power bus bar 1430 to multi-layered structure 1405. The power supply by decoder/driver logic 1420 is controlled by current/voltage regulator 1450 that includes a low current sensor 1453, a regulator heat sink 1454, regulator transistors such as transistors 1451 and 1452 and gate control 1455.

A detailed set of schematics for one embodiment of a programmer 1400 is enclosed in Appendix B. For example, a decoder/driver circuit is illustrated in page 154 of Appendix B and a regulator is illustrated on page 167 of Appendix B. Illustrative ratings for the components in the circuits of Appendix B are listed in Appendix C. For example, the components for decoder/driver circuit are listed in pages 170, 171 and 172 of Appendix C while the components for a regulator are listed in pages 168 and 169 of Appendix C.

An electrical programmer 1400 has the advantage of permitting fast and flexible programming of a matrix of fuses and/or antifuses, without manual labor of, for example, adding a wire as described in U.S. Pat. No. 4,840,924 to Kinbara.

In one embodiment of this invention, programmer 1400 is used with a group partition method 1560 (FIG. 15A) to program the matrix of fuses and/or antifuses in a multi-layered structure, such as multi-layered structure 1405. Initially in step 1562, a user specifies the connections that are to be programmed. Then in step 1563, the user selects the traces of multi-layered structure 1505 into a partition of groups. Traces in each group are selected such that each trace in a group is directly coupled to another trace in that group by a fuse that is to remain intact on completion of method 1560.

Selection of traces is illustrated by an N by N fuse matrix 1600 in FIG. 16A, with N=6, for this embodiment. Matrix 1600 includes only passive elements, such as conductive traces and fuses, and does not include active elements, such as transistors and diodes. However, in one embodiment, method 1560 is applied to a matrix that includes active elements, such as transistors.

Matrix 1600 (FIG. 6A) includes six row traces 1611A to 1611F that are formed on a first layer and connected to six component contacts 1610A to 1610F. Moreover, matrix 1600 includes six column traces 1613A to 1613F that are connected to electrical contacts 1612A to 1612F. A total of 36 fuses, such as fuses 1615AA to 1615AF couple each of the six row traces 1611A to 1611F to each of the six column traces 1613A to 1613F.

As an example, assume component contacts 1610A to 1610F are desired to be connected to electrical contacts 1612A to 1612F as follows: 1610A to 1612A, 1610B to 1612C, 1610C to 1612B, 1610D to 1612F, 1610E to 1612D, and 1610F to 1612E. Therefore all of the fuses in matrix 1600 are to be blown except fuses 1615AA, 1615BC, 1615CD, 1615DF, 1615EB and 1615FE.

FIG. 16B illustrates the use of a simple targeting method in accordance with this invention. In the simple targeting method, the two traces that are directly connected to a fuse to be programmed are coupled to the Vpp and Ground terminals. For example, in FIG. 16B, to program fuse 1615AB, trace 1610A is connected to terminal VPP and trace 1612B is connected to terminal GND, thereby subjecting fields 1615AB to a programming current Ipp. Therefore program fuse matrix 1601 includes a blown fuse shown by absence, that no longer connects row trace 1610A to column trace 1612B.

However, the disadvantage of such a simple targeting method is the quadratic time complexity of programming $N^2-N$ fuses in an N×N fuse matrix for a one-to-one mapping of N row traces to N column traces. Moreover, such a simple targeting method can subject fuses to remain intact to sneak path currents during programming of adjacent fuses and thereby degrade the performance of intact fuses during subsequent operation of intact fuses in a predetermined circuit, for example, after completion of all programming of a fuse matrix.

Current carrying capacity of fuses in sneak paths can be impaired during normal operation subsequent to completion of programming, if the sneak path fuses are seriously degraded by the 50% programming current during programming of the targeted fuse. Sneak path currents are described in, for example, U.S. Pat. No. 5,311,053 to Law et al. (col. 2, line 16). The degradation of the current carrying capacity of a fuse is described in, for example, "Distribution Fuses of Nearest Future" by T. Lipski, Third International Conference on Future Trends in Distribution Switchgear, IEE, pages 41–45.

In a group partition step 1563 (FIG. 15A), fuses to remain intact are protected from stress currents during programming of other fuses by partitioning traces directly connected to a fuse to remain intact, into groups, for example, as follows (FIG. 16A): group 1= (1611A, 1613A) to protect fuse 1615AA, group 2=(1611B, 1613C) to protect fuse 1615BC, group 3=(1611C, 1613B) to protect fuse 1615CB, group 4=(1611D, 1613F) to protect fuse 1615DF, group 5=(1611E, 1613D) to protect fuse 1615ED and group 6=(1611F, 1613E) to protect fuse 1615FE.

Once groups have been formed in steps 1563, the groups are ordered in step 1564. Weights are assigned to groups based on the size of a group, the asymmetry and the distance. The size of a group is the number of traces in the group. The asymmetry is computed by summing the absolute differences of the row traces indices and the column trace indices. The distance is computed by summing the absolute index values of the row and column traces.

For example, the size of group 1 is two because group 1 contains two traces, traces 1611A and 1613A. The asymmetry of group 1 is 0 because trace 1611A and trace 1613A are the very first row trace and column trace respectively, and therefore have the row index and column index 1 respectively. The distance of group 1 is the sum of the row index of trace 1611A, 1 and the column index of trace 1613A also 1, thereby yielding 2. The group size, asymmetry and distance for the rest of the groups are listed in table 2. The weight of a group is calculated according to the following formula:

Weight=Size*N*N+Asymmetry*N+ Distance

For example, the weight of group 1 is computed as 2*6*6+0*6+2=74. In a similar manner, the weight of all of the other groups are computed, as listed in Table 2. Then the groups are sorted in ascending order of their weights and the resulting rank is used to program the fuses.

Then, in step 1565, the user sets up a set of programming parameters such as voltage, current, pulse rate and duty cycle depending on the characteristics of the fuses to be programmed. In one specific embodiment of this invention, maximum voltage is set to 10 volts, maximum total current is set to 27 amperes, current per fuse is 0.7 amperes, pulse duration is set to 1 millisecond and the whole cycle is 50 milliseconds. Therefore, fuses to be programmed are subjected to a current of 0.1 amperes for one millisecond and then the current is turned off for 49 milliseconds, before the fuses are subjected to another current pulse. In this embodiment, the fuse resistance is 8 ohms.

The maximum voltage of 10 volts bounds the current through each fuse below 1.25 amperes. The maximum total current of 27 amperes and pulse duration of 1 millisecond in a cycle of 50 milliseconds limits the power passing through the traces.

As an N×N array that performs a one-to-one mapping, although $N^2-N$ fuses are to be programmed in the first step, the number of fuses to be programmed in each subsequent step decreases. For example, for a 20×20 matrix, 38 fuses are to be programmed before step 1, and in each subsequent step, the number of fuses to be programmed decreased by two. In step 1, if all 38 fuses conduct 0.7 amperes, the total current is 27 amperes. Therefore, the maximum total current and the current per fuse impose equivalent constraints. However, as fewer fuses are programmed in subsequent steps, the limit of current per fuse is the more limiting constraint. In another embodiment of this invention, the maximum current can be set to a lower amount, such as ten amperes so that the maximum total current becomes a more severe constraint than the current per fuse.

Then in step 1566A, for each group, the traces in that group are coupled to Vpp and all the other traces are coupled to Ground. Coupling in accordance with this invention can be a direct connection or indirect connection. Programming voltage Vpp is the voltage that, when applied across the two ends of a fuse, produces a programming current Ipp. Programming current Ipp is the current that is sufficient to a program (blow) the fuse and at the same time is a safe current for traces in matrix 1600.

In this embodiment, after the ordering of groups in step 1565, group 1 is the first group in the programming sequence. Therefore traces 1611A and 1613A in group 1 are connected to Vpp and traces in all the remaining groups are connected to Ground. The connections to Vpp are maintained until a low current is sensed by low current sensor 1553 (FIG. 14B). When low current is sensed, every fuse coupled to either trace 1611A or trace 1613A of group 1 is blown, except for fuse 1615A that directly couples trace 1611A to trace 1613A (FIG. 16C). Therefore, in this embodiment, fuse 1615AA remains intact and fuses 1615AB, 1615AC, 1615AD, 1615AE, 1615AF, 1615BA, 1615CA, 1615DA, 1615EA and 1615FA are blown.

Next, traces of group 2, traces 1611B and 1613C are connected to Vpp and traces of all other groups are connected to Ground. Once fuses related to group 2 are programmed, the traces in each of groups 3, 6, 4 and 5 are sequentially programmed in the manner as described above. Therefore, at the end of method 1560, all of the fuses in fuse matrix 1600 are blown except for fuses 1615AA, 1615BC, 1615CB, 1615DF, 1615ED and 1615FE, as shown in programmed matrix 1603 of FIG. 16D.

As another example, when method 1560 is used to program matrix 1020 of socket adapter 1010 of FIG. 10H, row trace 1005T8 and column trace 1006T7 are partitioned into a group. Fuse 87 (FIG. 10H) that directly connects row trace 1005T8 to column trace 1006T7 is kept intact and every other fuse connected to row trace 1005T8 or column trace 1006T7 is blown. Therefore, a programmed socket adapter 1010 can couple the power terminal of packaged integrated circuit 1001 to the power supply circuit in printed circuit board 1003, on appropriate programming.

The traces in a group are all kept at the same electrical voltage potential during every step of method 1560, so that fuses that connect traces within a group are perfectly protected from any currents during method 1560, except for fringe effects. Fringe effects are effects caused by voltage drops induced by programming currents flowing over adjacent metal traces, due to the resistance inherent in a conductive trace.

Conductive traces, such as trace 1613A, have a very small resistance over the length of the trace. For example, in FIG. 16A, trace 1613A has an internodal resistance between two adjacent nodes, such as internodal resistance 1614AB between fuses 1615AA and 1615BA on trace 1613A. Each of the internodal resistances, such as internodal resistances 1614AB, 1614BC, 1614CD, 1614DE and 1614EF contribute to a voltage drop over the length of trace 1613A. Therefore, although a terminal, such as terminal 1612, is connected to Vpp, the voltage at an opposite end, such as end 1613A1 can be significantly smaller than voltage Vpp especially if trace 16BA is very long and/or has a high resistance per unit length. Such internodal resistances can result in fringe currents flowing through fuses that are protected by partitioning into a group, as described above in step 1563, because of voltage differences between the column trace and the row trace that are directly connected to the fuse. Fringe effects cannot be ignored when the number of rows and/or columns is relatively large (for example, same order of magnitude) compared to a specific fuse versus trace resistance ratio.

In one embodiment of this invention, for a 20×20 fuse matrix, for a fuse resistance of 576 times internodal resistance, a worst case stress current of 23% is predicted by simulation. The simulation is performed using SPARSE, a sparse linear equation solver by Kenneth S. Kundert and Alberto San Giovanni-Vincentelli, Department of Electrical Engineering and Computer Sciences, University of California, Berkeley, Berkeley Calif. 94720.

As disclosed in Appendix A, a 20×20 fuse matrix with protection for a fuse at row I=1 and column J=2 having a resistance of 576.0 times the internodal resistance is simulated by testsys.awk which in turn calls genmat.awk, sparse and then calcurr.awk. The software of testsys.awk is run on an IBM PC that includes an Intel 80486 CPU at 66 MHz running a DOS operating system with an AWK interpreter available as part of an MKS Toolkit from Mortice Kern Systems, Inc., 35 King Street North, Waterloo, Ontario NJ2W9, Canada.

A worst case stress current of 23% for a 20×20 fuse matrix is predicted by simulation for the fuse at row 1, column 19, if an arbitrary starting group is chosen. Programming of fuses using groups can be performed in an optimum sequence, so that the level of current stress is drastically reduced to, for example, 2% to 3%. The optimum sequence of groups or group pairs is chosen in step 1564, based on a number of factors including the number of fuses, trace lengths, maximum total current, current distribution, symmetry in the current path and trace distance from a terminal to the fuses.

For example, a group with perfect symmetry, such as a group of trace 1613C and trace 1611C in a desired partition results in a fringe current of 0% through fuse 1615CC. However, if some of the fuses connected to trace 1611C or trace 1613C are blown and some of the other fuses are not blown, the voltage drop across fuse 1615CC is not 0. The voltage at one end of fuse 1615CC is different from the voltage at the other end of fuse 1615CC due to the variation in the voltage drop across trace 1611C in comparison to the voltage drop across trace 1613C.

When all of the fuses that are to be programmed in a given step are blown, the fuse connecting two traces in a group is no longer subject to fringe currents. Therefore, the fringe current improves over time during a programming step as fuses are blown in that step. Therefore, programming fuses using an optimum sequence of groups as described can yield a significant reduction in the fringe effects of currents passing through a fuse protected by the group.

The temperature distribution across a central separable portion of a fuse (i.e. the portion of the fuse that is to be destroyed to form an open circuit) can, with certain geometries, peak in the center of the fuse along both the X direction (i.e. along the lateral axis of the fuse) and the Y direction (i.e. orthogonal to the lateral axis of the fuse). High temperature at the center of a fuse can form a void before portions of the fuse at the periphery break. A blown fuse of a strange geometry can result in which the fuse materials at the periphery are closer together than the central portions of the blown fuse, so that an unreliable blown fuse has been formed. By forming an opening in the center of a fuse or by necking down the central portion of a fuse, as shown in the various geometries described herein, the problems of an unreliable blown fuse are minimized or avoided.

Figure 15G:
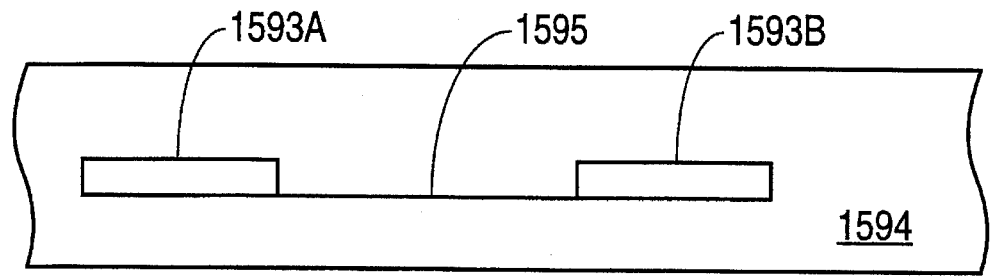
FIGS. 15G, 15H, 15I and 15J illustrate a fuse being programmed with various currents.
Figure 15H:
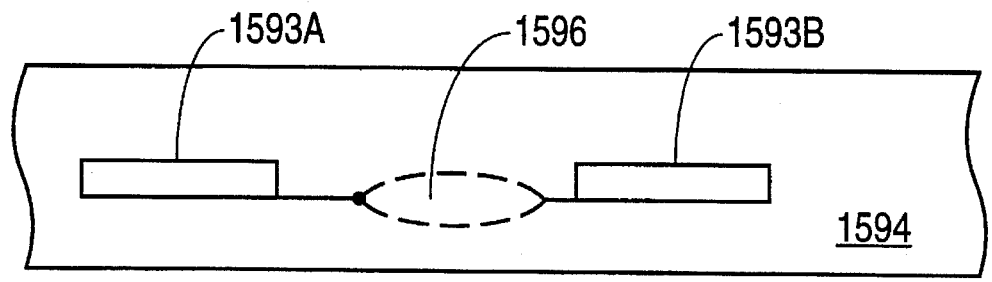

FIG. 15G illustrates an intact fuse 1595 (of the type, for example, of FIG. 2C) that connects a first trace 1593A to a second trace 1593B and is surrounded by insulating material 1594, such as PCB core. When fuse 1595 is programmed by a low programming current such as 0.5 ampere, fuse 1595 melts and pulls back from the center of fuse 1595 to form pull back regions 1595A and 1595B (FIG. 15H) that are adjacent to traces 1593A and 1593B respectively. Pull back regions 1595A and 1595B are separated by burned material 1596. Burned material 1596 is created by low programming current and large programming time as insulation material 1594 is heated by the current dissipated from fuse 1595 and either melts or decomposes to create a mixture of conductive material and insulating substrate. Investigations have found that burned material 1596 can be observed in a top view of a printed circuit board through insulation material even though fuse 1595 is formed on an inner layer of the printed circuit board.

Figure 15I:
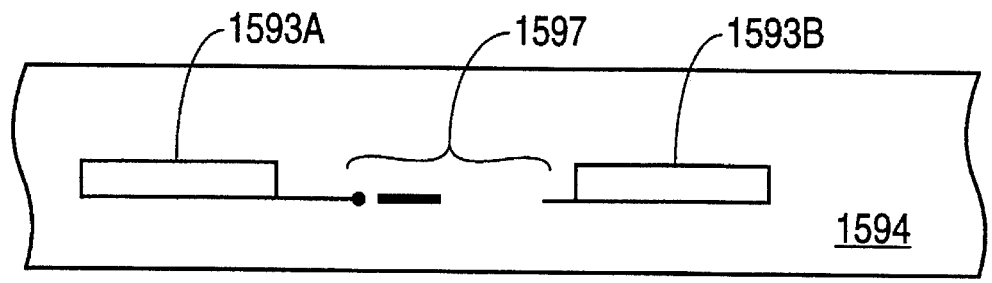

FIG. 15I illustrates programming of fuse 1595 (FIG. 15G) at a predetermined programming current, such as 1 ampere for a shorter period of time so that only insulation material 1594 adjacent to fuse 1595 melts and flows into the volume that originally forms fuse 1595 as fuse 1595 pulls back during programming. Blown fuse 1597 forms a good isolation between traces 1593A and 1593B.

When a large programming current is used to program fuse 1595, very short programming time is required and therefore heat generated by fuse 1595 is not easily dissipated in substrate 1594. Although fuse 1595 melts and pulls back, isolation material 1594 may not have enough time to melt and flow into the volume previously occupied by fuse 1595. Therefore, a high programming current can result in voids in the volume of a printed circuit board that was originally occupied by fuse materials. Such voids may be created, for example, when using a programming current of 5 amperes.

Figure 15J:
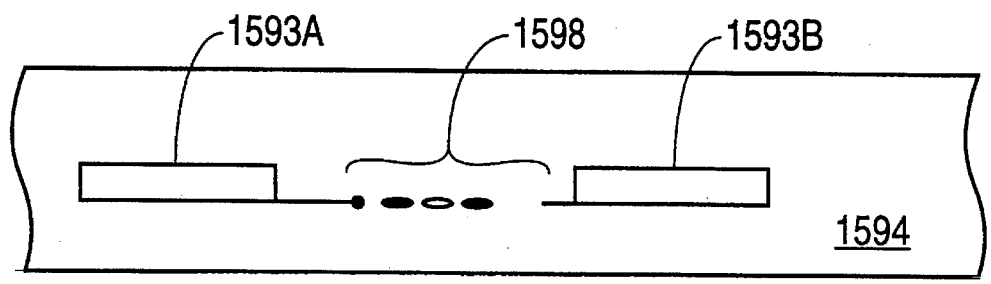
Figure 15K:
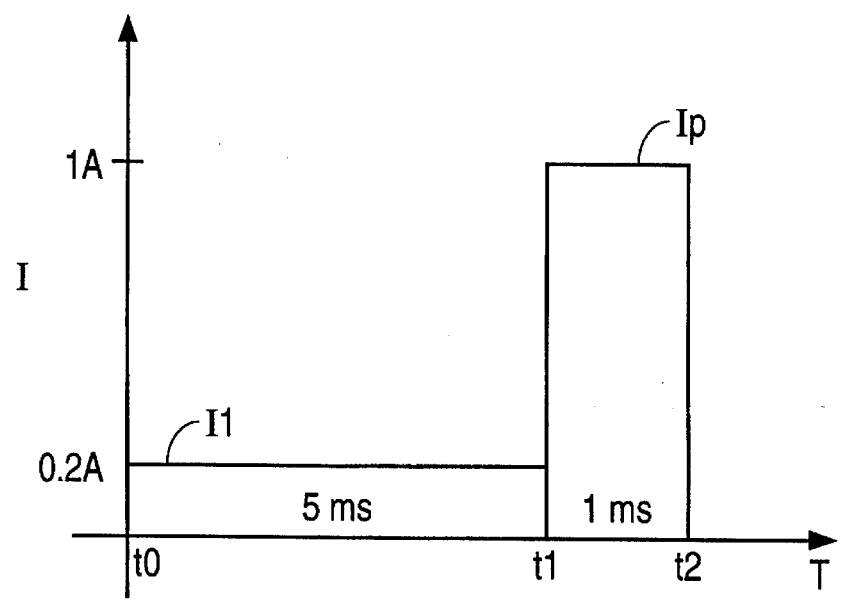
FIGS. 15K and 15L illustrate currents applied to preheat a fuse during programming in two embodiments of this invention.

FIG. 15K shows one possible profile for a programming current as a function of time. As shown in FIG. 15K initially, to program a fuse, a first current pulse of relatively low amplitude I1 (e.g. 0.2 amps) and selected duration t1 (e.g. 5 millisecond) is provided followed by a second current pulse of relatively high amplitude Ip (e.g. 1 amp).

The first current pulse heats up the fuse material located interior to the printed circuit board and is selected to have an amplitude and duration sufficient to heat the fuse material but not to break the fuse material. Following t1, the second current pulse is applied substantially in the form of a step function. The amplitude of the second current pulse is selected such that the majority of heat energy (>50%) generated by the current through the fuse does not dissipate into the printed circuit board. The duration of the second current pulse is not critical. Rather, the second current pulse will automatically stop when the fuse breaks thereby creating an extremely high resistance to the flow of the current.

Studies have shown that for amplitude of a second current pulse greater than a given amplitude, the integral of the current over time is substantially constant up until the time the fuse breaks, reflecting the fact that the energy of the second current pulse is essentially not dissipated into the adjacent printed circuit board material. Therefore the large amplitude second current pulse, which follows the low level heating first current pulse, reflects this phenomenon in terms of duration and amplitude. Application of a pre-heating current immediately followed by the application of a programming current as described above results in better separation between the conducting portions of a fuse, such as connection portions 16DD and 18DD of fuse 15DD described above in reference to FIG. 2A.

Figure 15L:
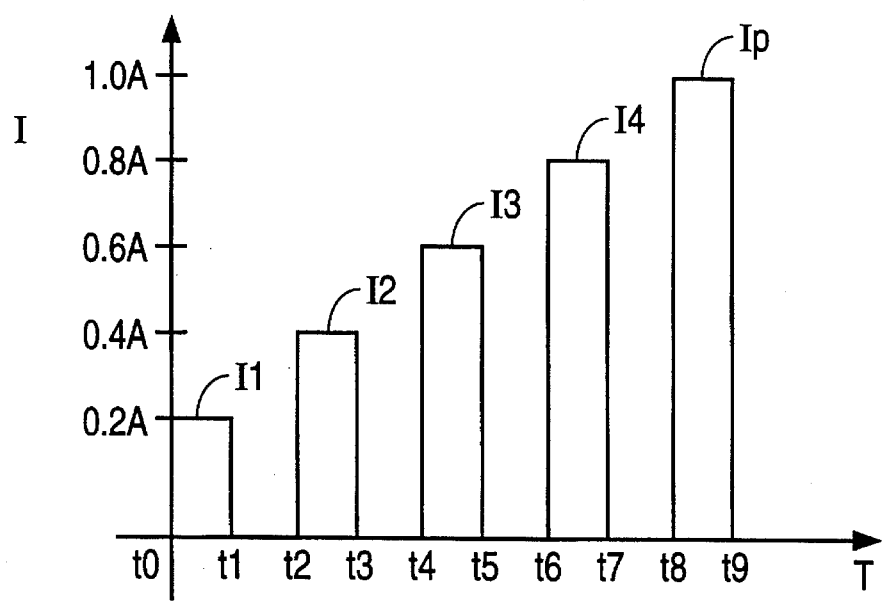

FIG. 15L illustrates an alternative method of programming fuses. In FIG. 15L, a series of current pulses, I1, I2, I3, I4 through . . . Ip are applied to a fuse, with each pulse being separated from the preceding pulse by a selected time Δt. The first pulse is of relatively low amplitude (0.2 amps as shown in FIG. 15J) and subsequent pulses have incremental increases in amplitude (of 0.2 amps in FIG. 15L) relative to the preceding pulse.

The sequential increase in amplitude of pulses causes the fuse to momentarily heat then partially cool following each pulse. As the amplitude of each pulse increases, the amount of heating also increases. The gradual increase in the temperature of the fuse material results in a slight heating of the surrounding printed circuit board material, provides a uniform heating of the fuse material and ensures that when the fuse open circuits, the fuse will do so in a way that does not cause damage to adjacent printed circuit board features. The pulse widths and amplitudes can be selected to ensure that the printed circuit board does not burn or become otherwise damaged as a result of such heating. The final pulse, at which the fuse will open circuit and thus program, will be of a sufficient amplitude to cause the fuse to program for the duration of the pulse.

In this embodiment, pre-heating current I1=0.2 ampere is applied for a time t1−t0=0.5 millisecond. Then, no current is applied for a duration of t2−t1=0.5 millisecond. Programming a fuse as described above in reference to FIG. 15L also results in a better separation of the conductive portions of a fuse.

Application of a large current within a short time period, results in a better separation of the conducting portions of a fuse, because a majority of the heat generated in the fuse is not lost to the surrounding substrate made of a material of poor thermal conductivity, such as a polymer. When a programming current is applied for a short period of time, the substrate does not melt and therefore does not create a "burned area." Burned areas can result in unnecessary shorts due to carbon filaments and hence preferably are avoided. Therefore, in one embodiment of this invention, a fuse is programmed (i.e. blown) by applying a 1 ampere current for 1 millisecond to avoid burned areas.

Instead of a current pulse, a voltage pulse can be applied to program a fuse.

In the embodiment described above, groups 1, 2, 3, 4, 5 and 6 are merely illustrative of one specific one-to-one mapping between component contacts 1610A to 1610F and component contacts 1612A to 1612F. Two or more different pre-determined circuits containing programmed matrices can be formed by choosing different groups in method 1560, although starting with the same matrix of fuses. Therefore, two identical component sockets can be used in two different electrical circuits requiring two different pin-out configurations, by appropriately programming the matrix of fuses and/or antifuses to couple component contacts to electrical contacts.

Although groups are arranged in a specific order in step 1564, the groups of a partition can be connected to Vpp in any arbitrary order as desired by a user. For instance, in the embodiment of FIG. 16A, the traces in group 5 can be initially connected to Vpp before the traces in group 1.

Partitioning of traces into groups in a group partition method avoids the problem of sneak path current described in U.S. Pat. Nos. 5,311,053 and 5,321,322 because fuses to remain intact are not subjected to a voltage drop. Moreover, a matrix of fuses with a wide variation in fuse parameters, such as fuse resistance values and fuse current carrying capacity, can be programmed by a method 1560 in accordance with this invention, without loss of effectiveness in programming. Therefore, fuses need not be designed to observe strict open/sustained current requirements, for example, as described in U.S. Pat. No. 5,321,322.

Furthermore, in a method 1560 in accordance with this invention, programming time is linearly proportional to the number of terminals, which is a vast improvement over the simple targeting procedure described above in reference to FIG. 16B, that has quadratic time requirement. The time requirement for the simple targeting method for an N×N matrix is $N^2$-N, whereas for method 1560 the time requirement is N.

A method 1560 in accordance with this invention also alleviates the need for precisely detecting the instant of time when a particular fuse is blown and for promptly stopping application of programming current, as was essential in the prior art procedure for example to avoid over-stressing sneak path fuses. Finally, successful programming by method 1560 is easy to verify by low current sensor 1530.

Although one embodiment of a group partition method 1560 has been described above for a one-to-one mapping, a group partition can also be applied to cases where a predetermined circuit, to be formed after completion of method 1560, contains a one-to-many or many-to-many mapping. An example of a one-to-many mapping is to map trace 1610A to trace 1612A and 1612C by forming a group (1610A, 1612A and 1612C). An example of a many-to-many mapping is to map trace 1610A and trace 1610B to trace 1612A and trace 1612C by forming a group (1610A, 1610B, 1612A and 1612C). When a group contains more than two traces, asymmetry is computed between each possible pair of traces and summed up to form the asymmetry for the group. For example, for the group (1610A, 1610B, 1612A and 1612C), the size is 4 and asymmetry is 0+1+1+2=4.

Figure 16E:
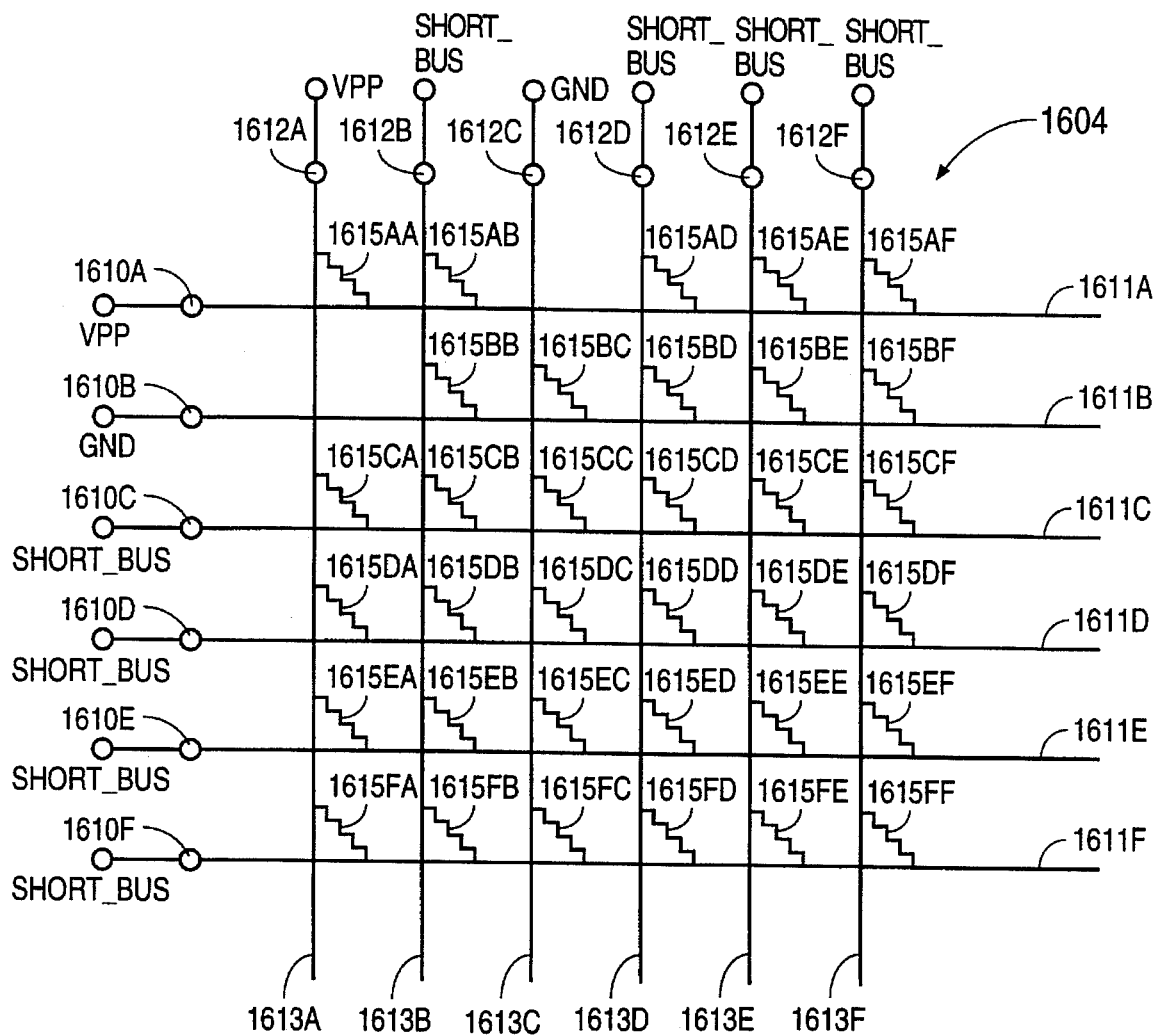

In an alternative group partition method, in step 1566B (FIG. 15B), instead of connecting all of the other traces to Ground as was done in step 1566A, only the traces in another group are connected to Ground and all the remaining traces are connected to each other and left floating. FIG. 16E illustrates the coupling of traces in group 1 to terminal VPP, traces in group 2 to terminal GND, and all other traces to each other (denoted by terminal SHORT BUS). In this alternative group partition method, fuses 1615BC and 1615AA are protected and fuses 1615BA and 1615AC (not shown in FIG. 16E) are blown (programmed).

Step 1566B is performed for each possible pair of groups: group i and group j by connecting group i traces to terminal VPP and group j traces to terminal GND and all other group traces to each other, wherein i and j are indices of the groups, and i<j, in any arbitrary order. For each fuse that couples a trace from one group to a trace in another group, there exists at least one programming step in which a Vpp voltage difference is exerted across such a fuse, to blow the fuse. At the end of a programming sequence, only fuses that connect traces within a group remain intact, because the two ends of such fuses are kept at the same voltage at all times and such fuses are subjected to a negligible current caused by fringe effects. Therefore a fuse within a group remains intact in this alternative embodiment of the group partition method (step 1566B).

Either of the two embodiments of the group partition method, i.e. steps 1566A and 1566B described above can be used in conjunction with the simple targeting method also described above, for example, if a fuse to be programmed remains unprogrammed. However, the applicability of the simple targeting method is limited to a matrix having fuses that can sustain sneak path currents of up to 50% of the current flowing through the targeted fuse.

Figure 16F:
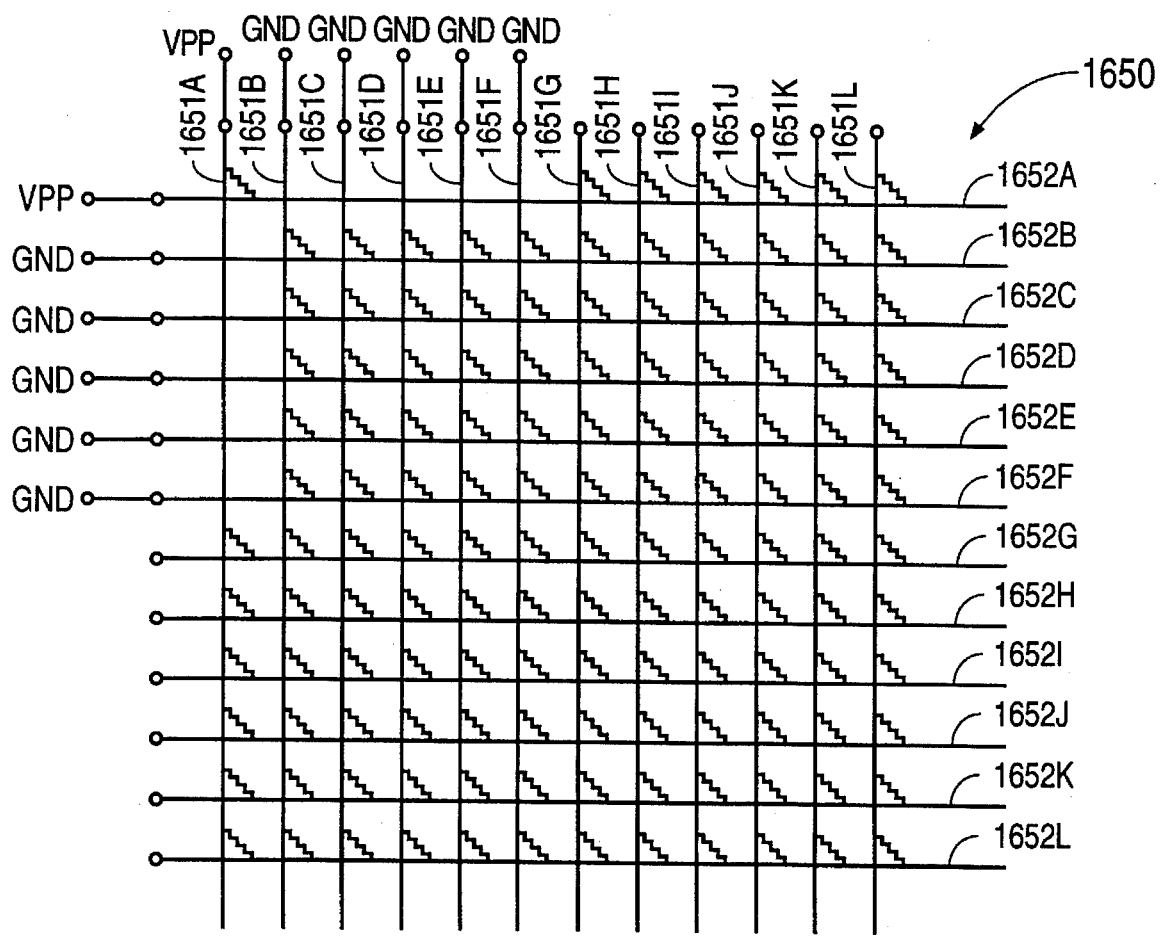

Furthermore, instead of grouping all traces of a fuse matrix, only a subset of traces can be used in method 1560 and all of the remaining traces can be left unconnected while traces in the subset are programmed. For example, FIG. 16F illustrates the connection of traces 1651A to 1651F and traces 1652A to 1652F to Ground and Vpp terminals respectively, while traces 1651G to 1651L and traces 1652G to 1652L are left unconnected in fuse matrix 1650.

Such a subset method permits a fuse matrix to be programmed with a smaller driving circuit than the driving circuit necessary to program the entire fuse matrix. Such a subset method can be applied to a subset in a fuse matrix by flying probes or alternatively through shifting contact blocks. Any undesirable stress currents due to traces not being actively controlled can be minimized by selecting an appropriate programming sequence, for example by simulation.

FIG. 15B illustrates programming of fuses in a fuse matrix by a method 1570 in accordance with this invention. Method 1570 can be invoked instead of step 1566A of FIG. 15A. In one embodiment, method 1570 is implemented as a computer process.

In step 1571, the computer initializes variables. Then in step 1572, the computer checks to see if the previous cycle has expired. If the previous cycle has not expired, the computer continues to check. If the previous cycle has expired then the computer sets up the time base (e.g. timer) and initializes MOS FET gates in step 1573.

Then in steps 1574 the computer determines whether a method for step 1566A or a method for step 1566B is to be used. If method 1566A is to be used, the computer goes to step 1576 in which all terminals in the current group are connected to VPP and all of the other terminals are connected to Ground. Alternatively, if method 1566B is in effect, the computer goes to step 1575 and connects all of the terminals in a first group to terminal VPP and all of the terminals in a second group to terminal GND and connects all of the other terminals to terminal SHORT_BUS.

Then the computer goes to step 1578 and turns on a voltage pulse or a current pulse. Then in step 1579 the computer checks to see if the pulse count has been reached or if all fuses have been blown. If the pulse count has not been reached or if all fuses have not been blown, the computer returns to step 1578 to turn on the voltage pulse or the current pulse. If the pulse count has been reached or if all fuses have been blown, the computer then returns to the previous step which results in invoking method 1570 one more time for another group or sets of groups for methods 1566A and 1566B respectively.

In one embodiment of this invention, method 1560 is implemented in a computer process that includes a graphical interface of the type illustrated in FIGS. 15C, 15D, 15E and 15F. Software for the computer process is listed in Appendix A.

When form 1580 is selected by a user, the routine form_load() is called from TOP.TXT. When field 1581 is selected, textrowdim_change() from TOP.TEXT is invoked. When field 1582 is selected, textcoldim_change from TOP.TXT is invoked. When field 1584 is selected, command1_click() from TOP.TXT is invoked. When field 1585 is selected, command3_click() from TOP.TXT is invoked. When field 1586 is selected, command2_click() from TOP.TXT is invoked. When field 1587 is selected, command4_click() is invoked.

When form 1590 is selected (FIG. 15D) form_load() from SPECIFY.TXT is invoked. When field 1590A is selected, new_click() is invoked. When field 1590B is selected menuopen_click() is invoked. When field 1590C is selected, menusave_click() is invoked. When field 1590D is selected, menusas_click() is selected. When field 1590E is selected, rc_MouseUP() is invoked. When field 1590F is selected, command2_click() is invoked. When the computer prints a message in field 1590G, pictureMsg.print is invoked. When a portion of field 1590H is clicked on, command1_click() is invoked. When a portion of field 1590I is clicked on, one of the routines Form_MouseDown(), Form_MouseMove() and form_paint() can be invoked.

When form 1591 is selected (FIG. 15E), form_load() from PROGAUTO.TXT is invoked. When field 1591A is selected, one of routines menuOpen_click(), menuSave_click() and menuSaveas_click() is invoked. When field 1591B is selected, command2_click() is invoked. When the computer prints a message in field 1591C, pictureMsg.print is invoked. When field 1591D is selected, update_progress() is invoked. When field 1591E is selected, command1_click() is invoked. When field 1591F is selected, command3_click() is invoked. When field 1591G is selected, command6_click() is invoked. When field 1591H is selected, command7_click() is invoked. When field 1591I is selected, command4_click() is invoked. When field 1591J is selected, Textvolt_Change() is invoked. When field 1591K is selected, TextCurr_Change() is invoked.

When field 1591L is selected, textmin_cur_change() is invoked. When field 1591M is selected, textmincur_change() is invoked. When field 1591N is selected, textoffsetcur_change() is invoked. When field 1591Q is selected, count_fuse_ units() is invoked. When filed 1591R is selected, show_Conn() is invoked.

When form 1592 is selected (FIG. 15F), form_load() in VERIFY.TEXT is invoked. When field 1592A is selected, menusavenew_click() is invoked. When field 1592B is selected, menusave_click() is invoked. When field 1592C is selected, menusaveas_ is invoked. When field 1592D is selected, command2_click() is invoked. When field 1592E is selected, command3_click() is invoked. When field 1592F is selected, command1_click() is invoked. When field 1592G is clicked on, one of the routines Form_MouseDown(), Form_MouseMove(), and Form_Paint() can be invoked.

Although method 1560 has been illustrated in reference to N×N fuse matrix 1600 with N=6, method 1560 is equally applicable to any general M×N fuse matrix or M×N hierarchical matrix or any architecture embedding such arrays. Weights of groups of a M×N matrix are computed as follows:

$$\text{Weight} = \text{Size} * N*M + \text{Asymmetry} * \left( \frac{N+M}{2} \right) + \text{Distance}$$

Moreover, although fixed voltages such as Vpp and Ground, and a common floating connection point SHORT-BUS are described, other voltages such as Vpp/2 can be used for example, for better current and/or voltage control. For example, a source of voltage Vpp/2 can be connected instead of SHORT_BUS in FIG. 16E in order to significantly reduce the amount of current drawn from power terminal Vpp although additional current is drawn by each of the traces connected to Vpp/2. The lower current drawn by the trace connected to Vpp allows traces within matrix 1604 to be designed for smaller current carrying capacity (such as smaller width) than traces in a matrix that is programmed using SHORT_BUS (left floating).

Figure 17A:
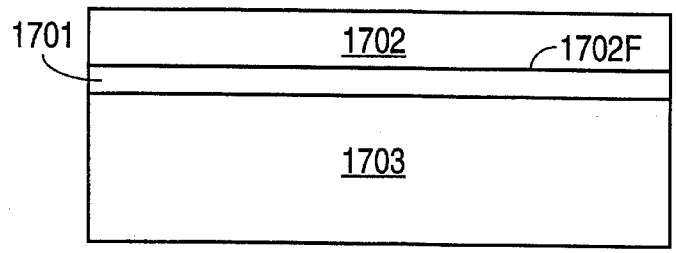
FIGS. 17A to 17J illustrate the steps for fabricating a fuse in various alternative methods in accordance with this invention.
Figure 17B:
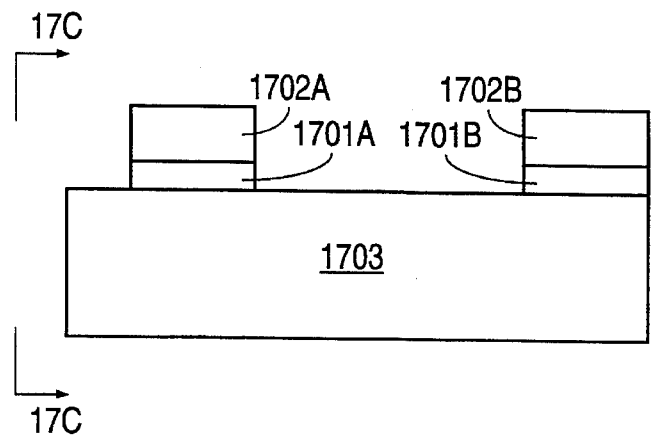

In one embodiment of this invention, a fuse layer 1701 such as Ni/P is formed by electrical plating or electroless deposition onto a metal foil 1702, such as a copper foil as illustrated in FIG. 17A. Then metal foil 1702 and fuse 1701 are laminated to a core layer 1703 of a printed circuit board. Then copper traces and patterns are defined by a masking step, such as a solder masking step and unwanted copper and Ni/P underneath the unwanted copper is etched away to leave copper trace patterns 1702A, 1702B and fuse locations 1701A, 1701B as illustrated in FIG. 17B.

Figure 17C:
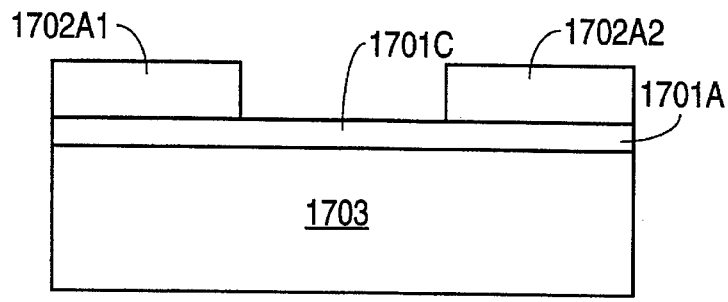

After removing the solder mask, another masking step is applied to the copper side of the printed circuit board to open only the fuse areas. Then the copper is etched away to expose fuse material 1701C (FIG. 17C).

Figure 17D:
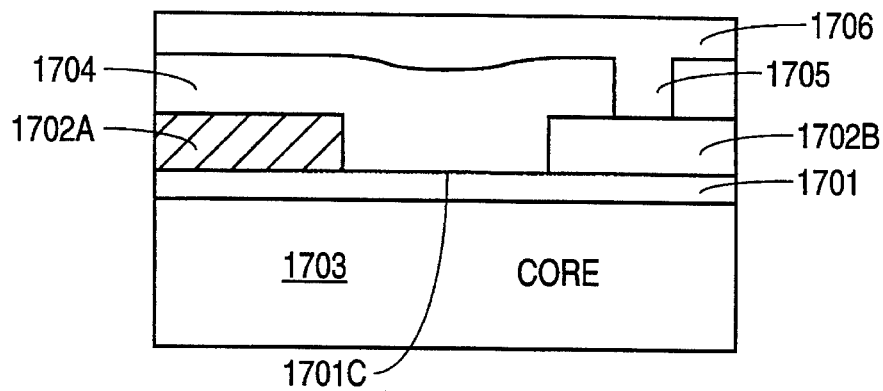

Next, a photo imageable via hole 1705 is generated through a photoresist layer 1704 on top of a trace 1702B. Top electrode 1706 is formed to contact trace 1702B through via hole 1705 as illustrated in FIG. 17D. In a optional process instead of using a photo imageable process traditional standard printed circuit board processes such as lamination, drilling and electroplating can be used to directly form layers 1704 and 1706 on top of copper traces 1702A and 1702B and fuse 1701C.

Copper foil, although most effective in plating, is difficult to handle. Instead of copper foil, metal foil 1702 can be an aluminum sheet or a CAC (copper, aluminum, copper) foil to improve mechanical strength.

Figure 17E:
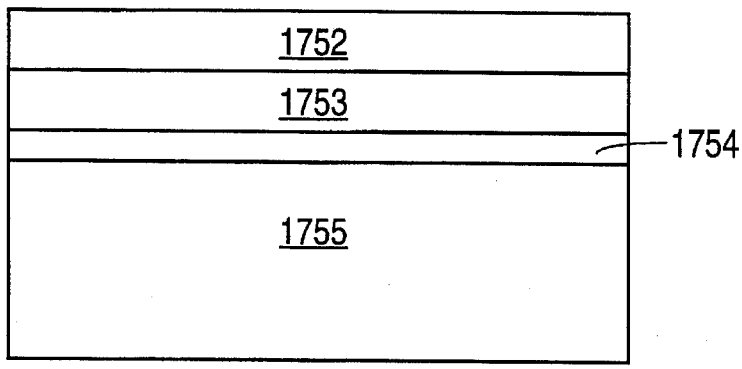

FIG. 17E illustrates the use of an aluminum sheet or a CAC sheet, henceforth sheet 1752, as the starting material to form a fuse. Copper layer 1753 is formed on top of sheet 1752 (optional for CAC) followed by forming a fuse layer 1754, such as Ni/P. After lamination of fuse layer 1754 to core 1755, aluminum layer 1752 is removed followed by definition of copper traces 1753A and 1753B (FIG. 17F), fuse opening definition and etching to expose fuse 1754C as illustrated in FIG. 17G. In the case of CAC, copper-aluminum is peeled off so that only the copper layer next to the fuse remains. Then trace definition and etch are performed on the copper to create the trace pattern and later to expose the fuse, as described above.

Figure 17F:
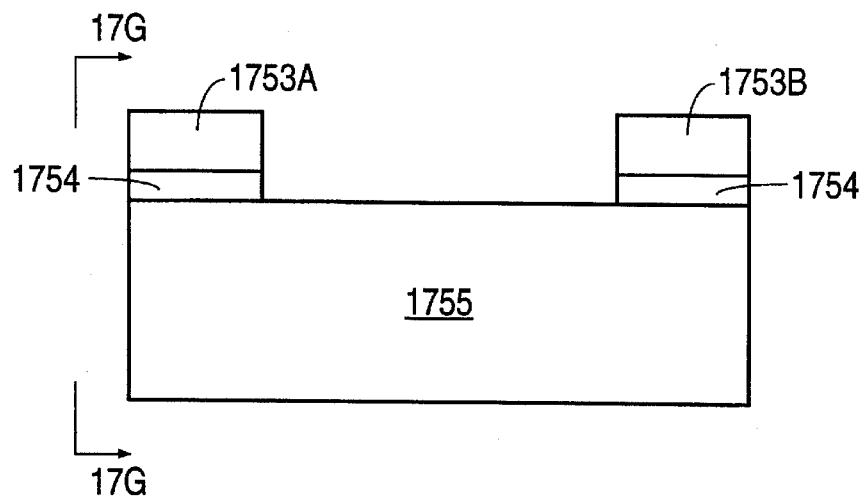
Figure 17G:
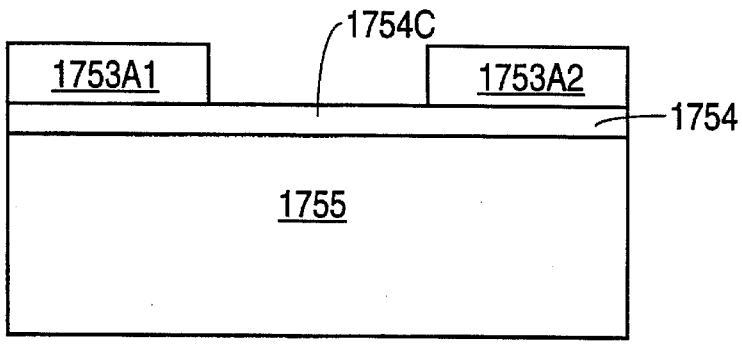
Figure 17H:
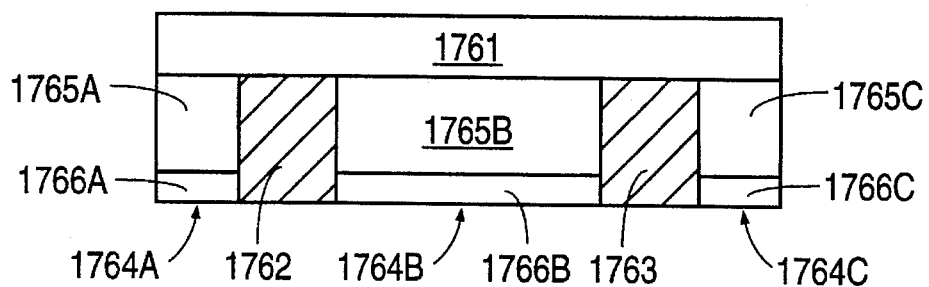
Figure 17I:
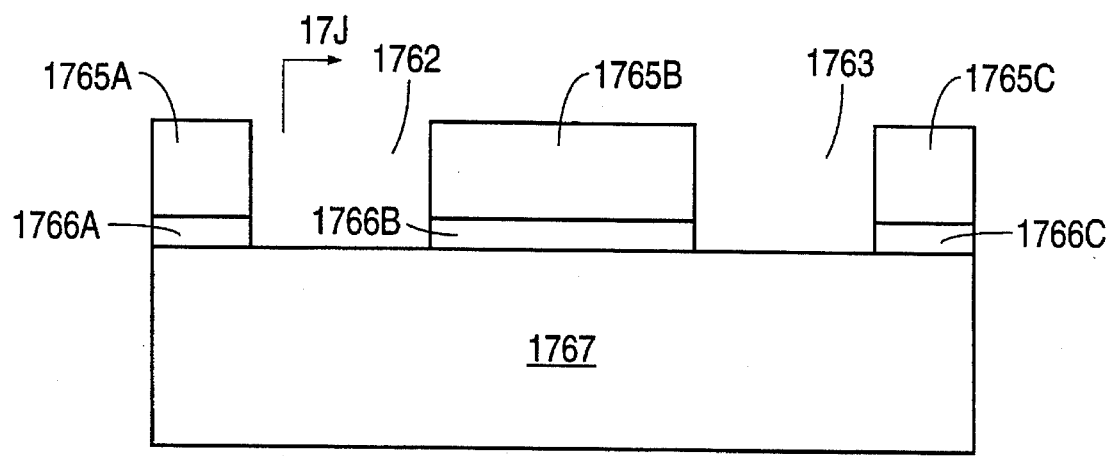

In another embodiment using an aluminum sheet, (FIG. 17H) masks in areas 1762 and 1763 are applied first to aluminum sheet 1761 and then trace, pad, and fuse areas 1764A, 1764B, 1764C respectively are opened (FIG. 17I). Then copper layers 1765A, 1765B, 1765C are formed followed by fuse layers 1766A, 1766B, 1766C. Resist layers 1762 and 1763 can be optionally removed away prior to the core lamination.

Figure 17J:
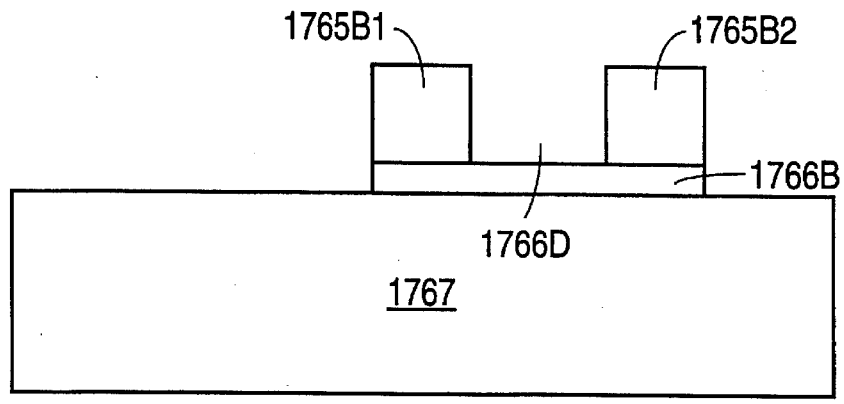

Then the PCB core 1767 is laminated to fuse layers 1766A, 1766B, 1766C with prepreg materials optionally filling areas 1762 and 1763. After lamination, aluminum sheet 1761 is etched away. Then another mask is applied to open and etch away the copper to expose fuse 1766D (FIG. 17J). Then the same steps as those described above in reference to FIG. 17D are performed.

The approach described in reference to FIGS. 17H, 17I and 17J has the advantage of saving one copper etching step as compared to the alternate approach described in reference to FIGS. 17E, 17F, and 17G. To reduce variation in the resistance of a fuse, a fuse layer can be formed on a low profile copper foil or even on the drum side of a copper foil, where the copper surface is very flat. In addition, aggressive brushing of the solder mask after the fuse is defined should be avoided to reduce damage to the fuse layer.

Instead of the Ni/P as the fuse material, other fuse materials such as Pb/Sn, Ni/P, Teflon, Ni/P/teflon, Ni/Sn, Ni/S, Pd/S and other materials described above can be used in accordance with this invention.

Figure 18:
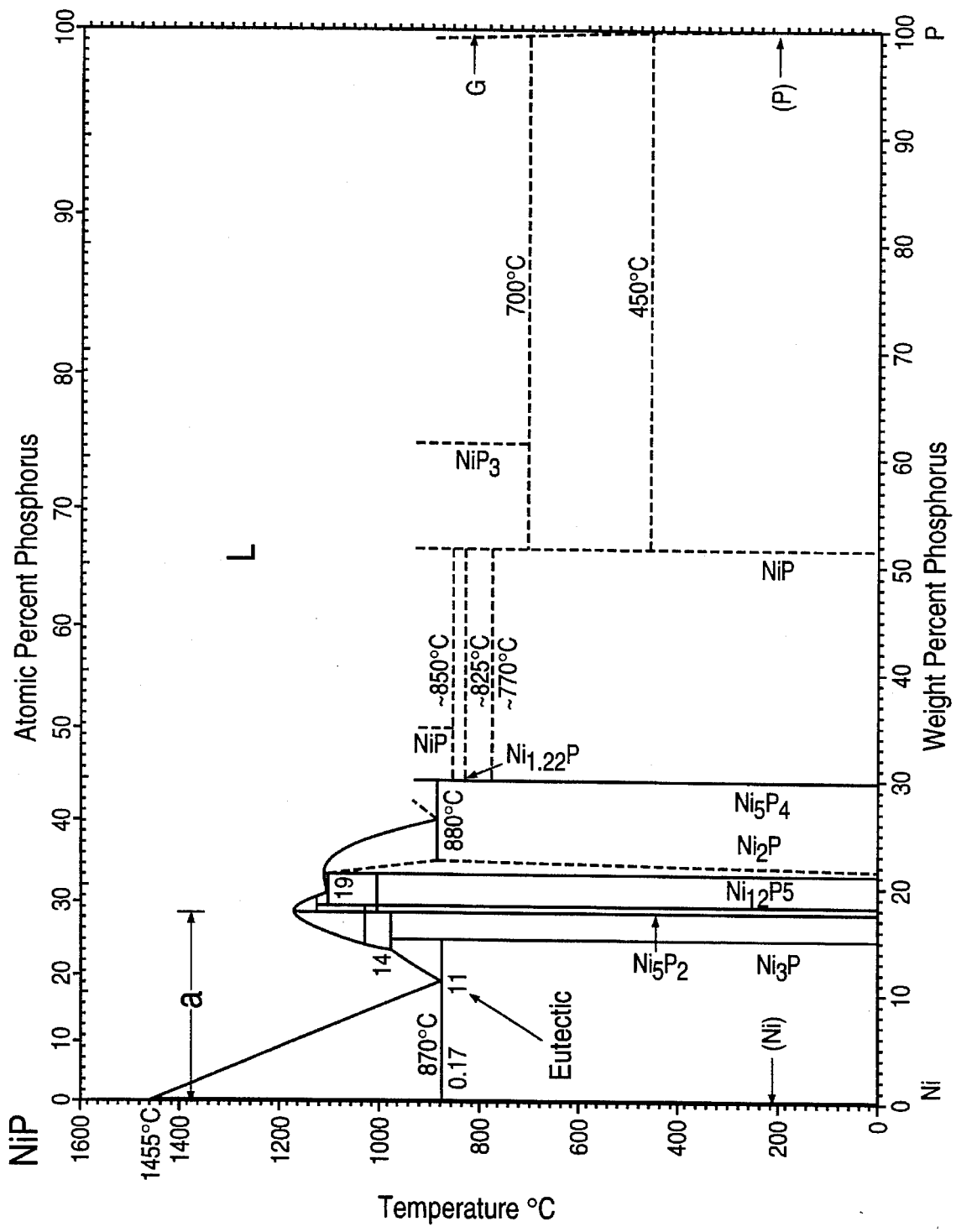
FIG. 18 illustrates range "a" of atomic percentage of phosphorous in a nickel-phosphorous alloy used to form a fuse in accordance with this invention.

In this embodiment, the fuse sheet resistance of the Ni/P material is in the range of 0.1 ohm per square to 10 ohms per square, so as to obtain a fuse resistance between 0.1 to 10 ohm. Moreover, fuse material in one embodiment of this invention must have a low melting point, based on the Ni/P phase diagram, for example, in the range of a=18–22 atomic percentage of P, with a=20 atomic percentage for the lowest Ni/P eutectic point. In another embodiment, a=0–30% (FIG. 18). In another embodiment, fuse material includes Pd/S in the range of a=25–30 atomic percentage of S, with a=28 atomic percentage for the lowest Pd/S eutectic point.

In one embodiment of this invention, size of a via hole can be 5–10 mils in diameter and can be obtained by conventional mechanical drilling. In another embodiment of this invention, the size of a via hole can be a photoresist defined via hole of 1–5 mils in diameter.

Either type of programmable element (i.e. a fuse or an antifuse) can be separately used in a matrix to form programmable board and package substrates. The particular type of programming element is chosen based on a variety of considerations. Fuses as described above have the advantage of very low resistance and almost no capacitance so that the RC delay is negligible. On the other hand, the antifuses described above have higher capacitance and resistance than fuses and have more severe RC delay.

For fuses, the fuse thickness need not be controlled very precisely for programming purposes as compared to an antifuse. Finally, fuse manufacturing is easily integrated into the standard PCB, PWB, MCM and IC package manufacturing process. On the other hand antifuses have the advantages of simple architecture and higher density as compared to fuses (because each fuse is associated with a linking via hole). Therefore in using antifuses, less real estate and fewer layers are needed (as compared to fuses) to obtain the same interconnectivity. Antifuses also have the advantage of not requiring high current to be programmed because unprogrammed antifuses do not draw current (whereas, to program a fuse in a matrix a higher current is needed because all the unprogrammed fuses conduct current).

When both types of programmable elements, fuses and antifuses are combined together in a single structure, more efficient placement and routing architecture can be developed to take advantage of the characteristics of both types of programmable elements. For example, in one embodiment of this invention antifuses are added to FIG. 1 at cross-over points (such as, for example, 10AA–10AD) by replacing intermediate layers 38 and 31A (FIG. 4B) with an antifuse dielectric layer (such as, for example, layer 86 of FIG. 7).

Combination of both fuses and antifuses together in a single structure allows the architecture to be one time reprogrammable. For example assuming an antifuse is present at cross-over point 10AA (FIG. 1), if there is an error in programming fuse 9AA resulting in an open circuit in a path between via holes 3A and 4A through traces 6A and 5A then antifuse 10AA can be programmed to form a closed circuit in that path. One architecture for using fuse and antifuse in a reprogrammable architecture is described in U.S. Pat. No. 5,200,652 which is incorporated herein in its entirety. Such an architecture can be used for PCBs, PWBs, MCMs and IC packages in accordance with this invention.

Although this invention has been described in relation to the above described architecture of fuses, other fuse architectures such as a hierarchical fuse array, similar to the architecture of the banyan network and the Benes network described in "High-Performance Scaleable Switch Design" by Joshua Silver, pages 38–48, ASIC & EDA, June 1994 can also be used in accordance with this invention.

A matrix of fuses and/or antifuses can also be used to form a scrambler card and a DUT card as described in "Programmable Scrambler Card and Device-Under-Test Card for a Burn-in Board" U.S. patent application Ser. No. 08/319,906, being filed Oct. 7, 1994 that is incorporated herein in its entirety.

The description of certain embodiments of this invention is intended to be illustrative and not limiting. Numerous other embodiments will be apparent to those skilled in the art in view of the enclosed disclosure and all such embodiments, are included within the broad scope of this invention. The apparatus and method according to this invention are not confined to PCB, PWB, MCM or IC packages, and can be used in many other applications that require programmable interconnect substrates other than semiconductor substrates. The apparatus and method described herein can also be used to build a logic or memory PWB, PCB, MCM or IC package using the techniques described in, for example, "Dielectric Based Antifuse for Logic and Memory ICs" by Hamdy, et al. (above). Therefore, the scope of this invention should be determined with reference to the appended claims along with their full scope of equivalents.

TABLE 1

FUSE MATERIALS:

| Element | Melting Point °C. | Boiling Point °C. | Specific Heat cal/g. °C. | Heat of Fusion cal/gm | Coefficient of Thermal Expansion μin/in. °C. | Electrical Resistivity μOhm-cm |
| --- | --- | --- | --- | --- | --- | --- |
| Tin | 232 | 2270 | 0.05 | 14.50 | 23 | 11.00 |
| Thallium | 303 | 1457 | 0.03 | 5.04 | 28 | 18.00 |
| Lead | 327 | 1725 | 0.03 | 6.26 | 29.3 | 20.65 |
| Zinc | 419.5 | 906 | 0.09 | 24.09 | 39.7 | 5.92 |
| Antimony | 630 | 1380 | 0.05 | 38.30 | 8.5–10.8 | 39.00 |
| Magnesium | 650 | 1107 | 0.25 | 88.00 | 27.1 | 4.45 |
| Aluminum | 660 | 2450 | 0.22 | 94.50 | 23.6 | 2.65 |
| Silver | 960 | 2210 | 0.06 | 25.00 | 19.68 | 1.59 |
| Gold | 1063 | 2970 | 0.03 | 16.10 | 14.2 | 2.35 |
| Copper | 1083 | 2595 | 0.09 | 50.60 | 16.5 | 1.67 |
| Nickel | 1453 | 2730 | 0.11 | 73.80 | 13.3 | 6.84 |
| Chromium | 1875 | 2665 | 0.11 | 96.00 | 6.2 | 12.90 |
| Phosphorous | 44 | 280 | 0.18 | 5.00 | 125.0 | $1 \times 10^{17}$ |
| Palladium | 1555 | 3980 | 0.058 | 34.20 | 11.8 | 10.8 |

RESISTANCE:

| SAMPLE | Width | Thickness | Length | Area |
| --- | --- | --- | --- | --- |
| Dim (cm) | 7.62E–03 | 3.81E–04 | 1.27E–02 | 3.69E–08 |

Current (Amp) 1

Resistance = Resistivity × L/(W × T) where L = Length, W = Width and T = Thickness of the fuse
Mass = Density × W × T × L
Temp. Ramp Rate = (Power/Specific Heat) × Mass
1 cal = (1/860) watt × hr. 1 Watt = 860/3600 cal/sec.
Above parameters are referenced from ASM Metals Reference Book published by American Society of Metals, Second Edition (Nov. 1989) (see pages 84 to 89).

| Element | Electrical Resistivity μOhm-cm | Electrical Resistance Ohm | Power I(2)R cal/sec | Specific Heat cal/ g. °C. | Density g/cm³ | Mass g | Temp. Rmp Rate °C./μsec/A | Thermal Conductivity cal/cm/s/°C. |
| --- | --- | --- | --- | --- | --- | --- | --- | --- |
| Antimony | 39.00 | 1.71E–01 | 4.08E–02 | 0.05 | 6.65 | 2.45E–07 | 3.39E+00 | 0.045 |
| Lead | 20.65 | 9.03E–02 | 2.16E–02 | 0.03 | 11.34 | 4.18E–07 | 1.67E+00 | 0.083 |
| Thallium | 18.00 | 7.87E–02 | 1.88E–02 | 0.03 | 11.85 | 4.37E–07 | 1.39E+00 | 0.093 |
| Tin | 11.00 | 4.81E–02 | 1.15E–02 | 0.05 | 7.3 | 2.69E–07 | 7.91E–01 | 1.5 |
| Chromium | 12.90 | 5.64E–02 | 1.35E–02 | 0.11 | 7.19 | 2.65E–07 | 4.62E–01 | 0.16 |
| Magnesium | 4.45 | 1.95E–02 | 4.65E–03 | 0.25 | 1.74 | 6.42E–08 | 2.96E–01 | 0.367 |
| Zinc | 5.92 | 2.59E–02 | 6.18E–03 | 0.09 | 7.13 | 2.63E–07 | 2.57E–01 | 0.27 |
| Nickel | 6.84 | 2.99E–02 | 7.15E–03 | 0.11 | 8.9 | 3.28E–07 | 2.07E–01 | 0.22 |
| Aluminum | 2.65 | 1.16E–02 | 2.77E–03 | 0.22 | 2.7 | 9.96E–08 | 1.30E–01 | 0.53 |
| Gold | 2.35 | 1.03E–02 | 2.46E–03 | 0.03 | 19.3 | 7.12E–07 | 1.11E–01 | 0.71 |
| Silver | 1.59 | 6.96E–03 | 1.66E–03 | 0.06 | 10.49 | 3.87E–07 | 7.69E–02 | 1 |
| Copper | 1.67 | 7.32E–03 | 1.75E–03 | 0.09 | 8.96 | 3.30E–07 | 5.75E–07 | 0.94 |

TABLE 2

| Groups | Size | Asymmetry | Distance | Weight | Rank |
| --- | --- | --- | --- | --- | --- |
| Group 1 | 2 | 0 | 2 | 74 | 1 |
| Group 2 | 2 | 1 | 5 | 83 | 7 |
| Group 3 | 2 | 1 | 5 | 83 | 3 |
| Group 4 | 2 | 2 | 10 | 94 | 6 |
| Group 5 | 2 | 1 | 9 | 87 | 4 |
| Group 6 | 2 | 1 | 11 | 89 | 5 |

What is claimed is:

1. A method for selectively programming a plurality of fuses in a matrix, said plurality of fuses comprising a fuse-to-be-programmed and a fuse-to-remain-intact on completion of said programming, each fuse having two terminals, each terminal being directly connected to at least one electrically conductive trace, said method comprising:

(a) keeping at approximately a first voltage potential every trace directly connected to said fuse-to-remain-intact; and (b) simultaneously subjecting said fuse-to-be-programmed to a current sufficient to program said fuse-to-be-programmed.

2. The method of claim 1 wherein said step (a) comprises coupling a first voltage source to every trace directly connected to said fuse-to-remain-intact; and wherein said step (b) comprises coupling a second voltage source to all traces in said matrix other than said traces directly connected to said fuse-to-remain-intact.

3. The method of claim 2 wherein said plurality of fuses comprises a first subset of fuses-to-remain-intact and a second subset of fuses-to-be-programmed, said method further comprising:

(c) decoupling said first voltage source;

(d) decoupling said second voltage source; and (e) repeating said prior steps (a) through (d) for each fuse-to-remain-intact until every fuse-to-be-programmed is programmed.

4. The method of claim 2 wherein said second voltage source is ground.

5. The method of claim 1 wherein said plurality of fuses comprises a second fuse-to-remain-intact, said method further comprising:

(c) simultaneously keeping at approximately a second voltage potential every trace directly connected to said second fuse-to-remain-intact while performing step (b);

wherein said fuse-to-be-programmed directly connects (i) a first trace directly connected to said fuse-to-remain-intact and (ii) a second trace directly connected to said second fuse-to-remain-intact.

6. The method of claim 5 wherein each fuse connected between a first trace and a second trace is programmed simultaneously with programming of said fuse-to-be-programmed.

7. The method of claim 5 wherein said step (c) comprises coupling a first voltage source to every first trace, and a second voltage source to every second trace.

8. The method of claim 7 wherein said second voltage source is ground.

9. The method of claim 7 further comprising:

decoupling said first voltage source from every trace in said first group;

decoupling said second voltage source from every trace in said second group; and repeating said prior steps for every group different from said first group.

10. The method of claim 1 wherein said step (b) of simultaneously subjecting comprises:

(b1) pre-heating said fuse-to-be-programmed; and (b2) applying a programming current to said preheated fuse.

11. The method of claim 1 wherein said step (a) comprises coupling each of said directly connected traces to each other.

12. The method of claim 1 wherein said step (a) comprises coupling each of said directly connected traces to ground.

13. The method of claim 1 wherein said step (a) protecting comprises coupling each of said directly connected traces to a voltage source.

14. A method comprising:

(a) forming a plurality of structures, each structure comprising a fuse matrix and a plurality of component contacts connected to said fuse matrix;

(b) selectively programming a first fuse matrix in a first structure of said plurality of structures to form a first predetermined circuit for interconnecting terminals of a first plurality of electronic components while protecting at least a first fuse in said first fuse matrix by keeping said first fuse at approximately a common voltage without using an active element; and (c) selectively programming a second fuse matrix in a second structure of said plurality of structures to form a second predetermined circuit for interconnecting terminals of a second plurality of electronic components, said second predetermined circuit being different from said first predetermined circuit while protecting at least a second fuse in said second fuse matrix by keeping said second fuse at approximately a common voltage without using an active element.

15. The method of claim 14 wherein said step (b) comprises grouping every trace directly connected to said fuse into a first group and coupling all traces in said first group to each other.

16. The method of claim 15 wherein said coupling comprises connecting every trace in said first group to a first voltage source.

17. The method of claim 16 wherein a fuse to be programmed is coupled to a second voltage source at a voltage potential differing from the voltage potential of said first voltage source by an amount sufficient to supply a current needed to program said fuse to be programmed.

18. The method of claim 17 wherein said fuse to be programmed is preheated prior to said coupling.

19. A method for selectively programming a plurality of fuses, each fuse in said plurality of fuses having two terminals, each terminal being directly connected to at least one electrically conductive trace, each fuse in said plurality of fuses being either a fuse to be programmed or a fuse to remain intact on completion of said programming, said method comprising:

(a) selecting a first multiplicity of traces to form a first group, a first trace in said first group being coupled to a second trace in said first group by a first fuse to remain intact on completion of said programming;

(b) selecting a plurality of traces to form a second group, a third trace in said second group being coupled to a fourth trace in said second group by a second fuse to remain intact on completion of said programming, at least one trace in said second group being coupled to at least one trace in said first group by a fuse to be programmed;

(c) coupling a first voltage source to every trace in said first group to thereby keep said first fuse at approximately a first voltage potential;

(d) coupling a second voltage source to every trace in said second group to thereby keep said second fuse at approximately a second voltage potential; and (e) coupling a third multiplicity of fifth traces to each other, each fifth trace being different from a trace in said first group and a trace in said second group, wherein the difference between said first voltage potential and said second voltage potential results in a current sufficient to program said fuse to be programmed.

20. The method of claim 19 further comprising:

(f) decoupling said first voltage source from every trace in said first group;

(g) decoupling said second voltage source from every trace in said second group;

(h) decoupling said third multiplicity of fifth traces from each other; and (i) repeating said prior steps (a)–(h) for every pair of groups in said plurality of groups.

21. The method of claim 19 wherein said first voltage potential differs from said second voltage potential by a programming voltage sufficient to supply said current.

22. The method of claim 21 wherein said first voltage source is at said programming voltage and said second voltage source is ground.

23. The method of claim 19 wherein said fuse to be programmed is preheated prior to said coupling a second voltage source.

24. The method of claim 19 wherein all fuses directly connected between a trace in said first group and a trace in said second group are programmed simultaneously with programming of said fuse to be programmed.

* * * * *